(12) United States Patent
Zhang et al.

(10) Patent No.: US 9,455,267 B2
(45) Date of Patent: Sep. 27, 2016

(54) THREE DIMENSIONAL NAND DEVICE HAVING NONLINEAR CONTROL GATE ELECTRODES AND METHOD OF MAKING THEREOF

(71) Applicant: SANDISK TECHNOLOGIES INC., Plano, TX (US)

(72) Inventors: Yanli Zhang, San Jose, CA (US); Johann Alsmeier, San Jose, CA (US)

(73) Assignee: SANDISK TECHNOLOGIES LLC, Plano, TX (US)

( * ) Notice: Subject to any disclaimer, the term of this patent is extended or adjusted under 35 U.S.C. 154(b) by 0 days.

(21) Appl. No.: 14/491,315

(22) Filed: Sep. 19, 2014

(65) Prior Publication Data
US 2016/0086969 A1 Mar. 24, 2016

(51) Int. Cl.
*H01L 23/528* (2006.01)
*H01L 21/283* (2006.01)
(Continued)

(52) U.S. Cl.
CPC ..... *H01L 27/11582* (2013.01); *G11C 16/0483* (2013.01); *G11C 16/06* (2013.01); *H01L 21/02365* (2013.01); *H01L 21/283* (2013.01); *H01L 21/28273* (2013.01); *H01L 21/28282* (2013.01); *H01L 21/31* (2013.01); *H01L 21/32133* (2013.01); *H01L 21/768* (2013.01); *H01L 21/823412* (2013.01); *H01L 21/823418* (2013.01); *H01L 21/823468* (2013.01); *H01L 21/823475* (2013.01); *H01L 21/823487* (2013.01); *H01L 23/528* (2013.01); *H01L 27/11519* (2013.01); *H01L 27/11521* (2013.01); *H01L 27/11556* (2013.01); *H01L 27/11565* (2013.01); *H01L 27/11568* (2013.01); *H01L 29/0657* (2013.01); *H01L 29/41775* (2013.01); *H01L 29/42328* (2013.01); *H01L 29/42336* (2013.01); *H01L 29/42344* (2013.01);
(Continued)

(58) Field of Classification Search
USPC .......................................... 257/314
See application file for complete search history.

(56) References Cited

U.S. PATENT DOCUMENTS 5,915,167 A 6/1999 Leedy
8,198,672 B2 * 6/2012 Alsmeier .......... H01L 27/11551
257/316
(Continued)

OTHER PUBLICATIONS

Endoh et al., "Novel Ultra High Density Memory with a Stacked-Surrounding Gate Transistor (S-SGT) Structured Cell," IEDM Proc., (2001), 33-36.
(Continued)

*Primary Examiner* — Jarrett Stark
*Assistant Examiner* — Charles N Ausar-El
(74) *Attorney, Agent, or Firm* — The Marbury Law Group PLLC

(57) ABSTRACT

A monolithic three dimensional NAND string includes a plurality of control gate electrodes extending substantially parallel to a major surface of a substrate in at least one active region, a plurality of semiconductor channels having at least one end portion of each of the plurality of semiconductor channels extending substantially perpendicular to the major surface of the substrate, at least one memory film located between each of the plurality of control gate electrodes and each respective semiconductor channel of the plurality of semiconductor channels, and at least one first slit trench extending substantially perpendicular to the major surface of the substrate. Each of the plurality of control gate electrodes has a nonlinear side wall adjacent to the at least one first slit trench in the at least one active region.

34 Claims, 46 Drawing Sheets

(51) Int. Cl.
  *H01L 21/768* (2006.01)
  *H01L 21/31* (2006.01)
  *H01L 27/115* (2006.01)
  *H01L 29/792* (2006.01)
  *H01L 29/423* (2006.01)
  *H01L 29/417* (2006.01)
  *H01L 29/06* (2006.01)
  *H01L 21/3213* (2006.01)
  *H01L 21/02* (2006.01)
  *H01L 21/28* (2006.01)
  *H01L 29/788* (2006.01)
  *H01L 29/66* (2006.01)
  *H01L 21/8234* (2006.01)
  *G11C 16/06* (2006.01)
  *G11C 16/04* (2006.01)

(52) U.S. Cl.
  CPC ... *H01L29/42352* (2013.01); *H01L 29/66825* (2013.01); *H01L 29/66833* (2013.01); *H01L 29/7889* (2013.01); *H01L 29/7926* (2013.01)

(56) References Cited

U.S. PATENT DOCUMENTS

| | | | |
|---|---|---|---|
| 8,349,681 B2 * | 1/2013 | Alsmeier | H01L 27/11551 257/E21.309 |
| 8,946,810 B2 * | 2/2015 | Alsmeier | H01L 27/11551 257/314 |
| 2007/0272973 A1 * | 11/2007 | Park | B82Y 10/00 257/324 |
| 2008/0094917 A1 * | 4/2008 | Park | H01L 27/115 365/185.28 |
| 2009/0230458 A1 * | 9/2009 | Ishiduki | H01L 27/11565 257/324 |
| 2012/0001249 A1 | 1/2012 | Alsmeier et al. | |
| 2013/0248974 A1 * | 9/2013 | Alsmeier | G11C 16/04 257/321 |
| 2014/0151787 A1 * | 6/2014 | Venkatraman | H01L 29/7827 257/330 |
| 2014/0175534 A1 | 6/2014 | Kofuji et al. | |
| 2015/0008502 A1 * | 1/2015 | Chien | H01L 29/66825 257/321 |
| 2015/0008506 A1 * | 1/2015 | Yang | H01L 27/11582 257/324 |
| 2015/0179662 A1 * | 6/2015 | Makala | H01L 27/11582 257/314 |

OTHER PUBLICATIONS

U.S. Appl. No. 14/491,026, filed Sep. 19, 2014, SanDisk Technologies Inc.
U.S. Appl. No. 14/462,209, filed Aug. 18, 2014, SanDisk Technologies Inc.
Invitation to Pay Additional Fees for PCT/US2015/047932, dated Dec. 23, 2015, 9 pages.
International Search Report and Written Opinion for PCT/US2015/047932, dated Mar. 2, 2016, 22 pages.

\* cited by examiner

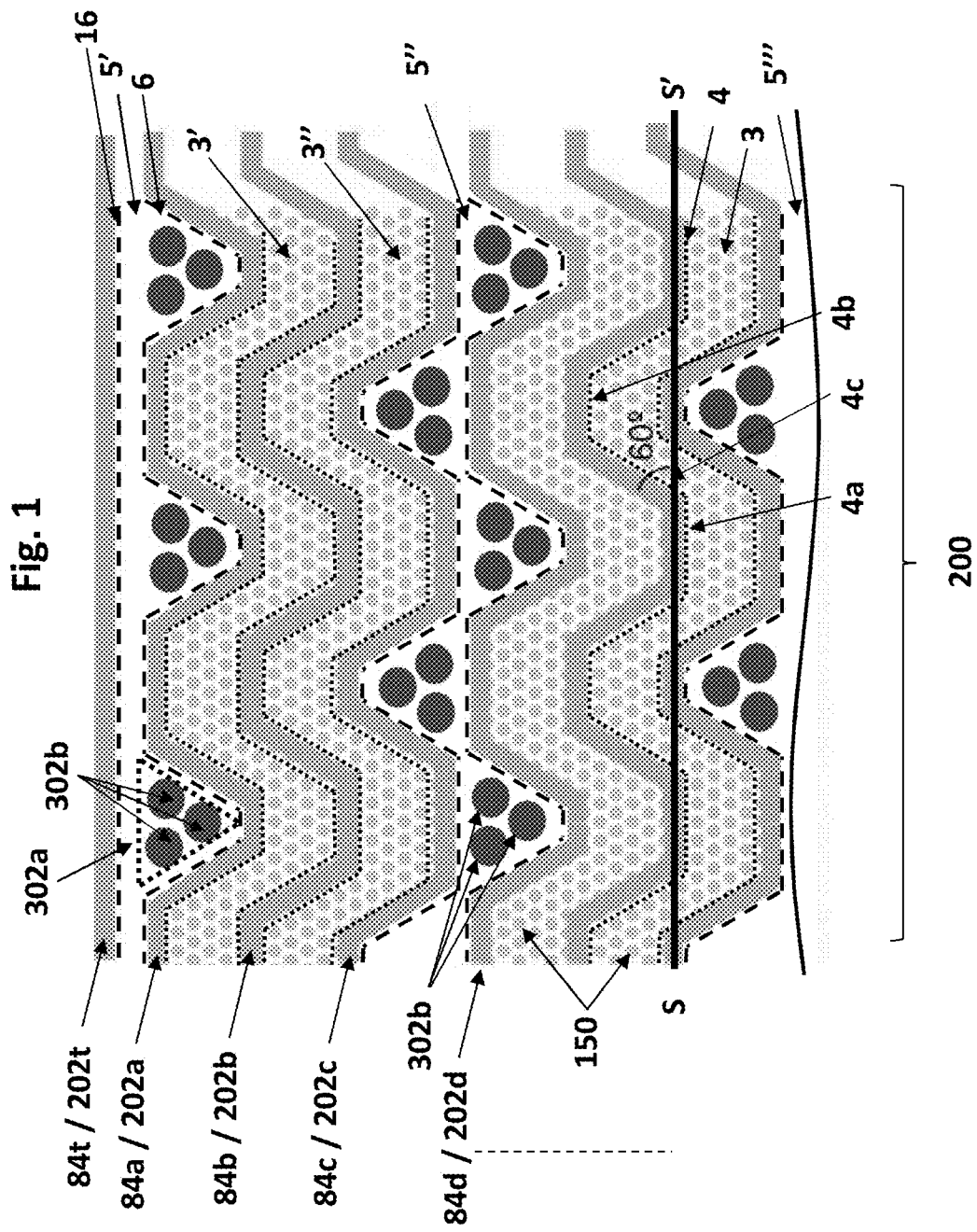

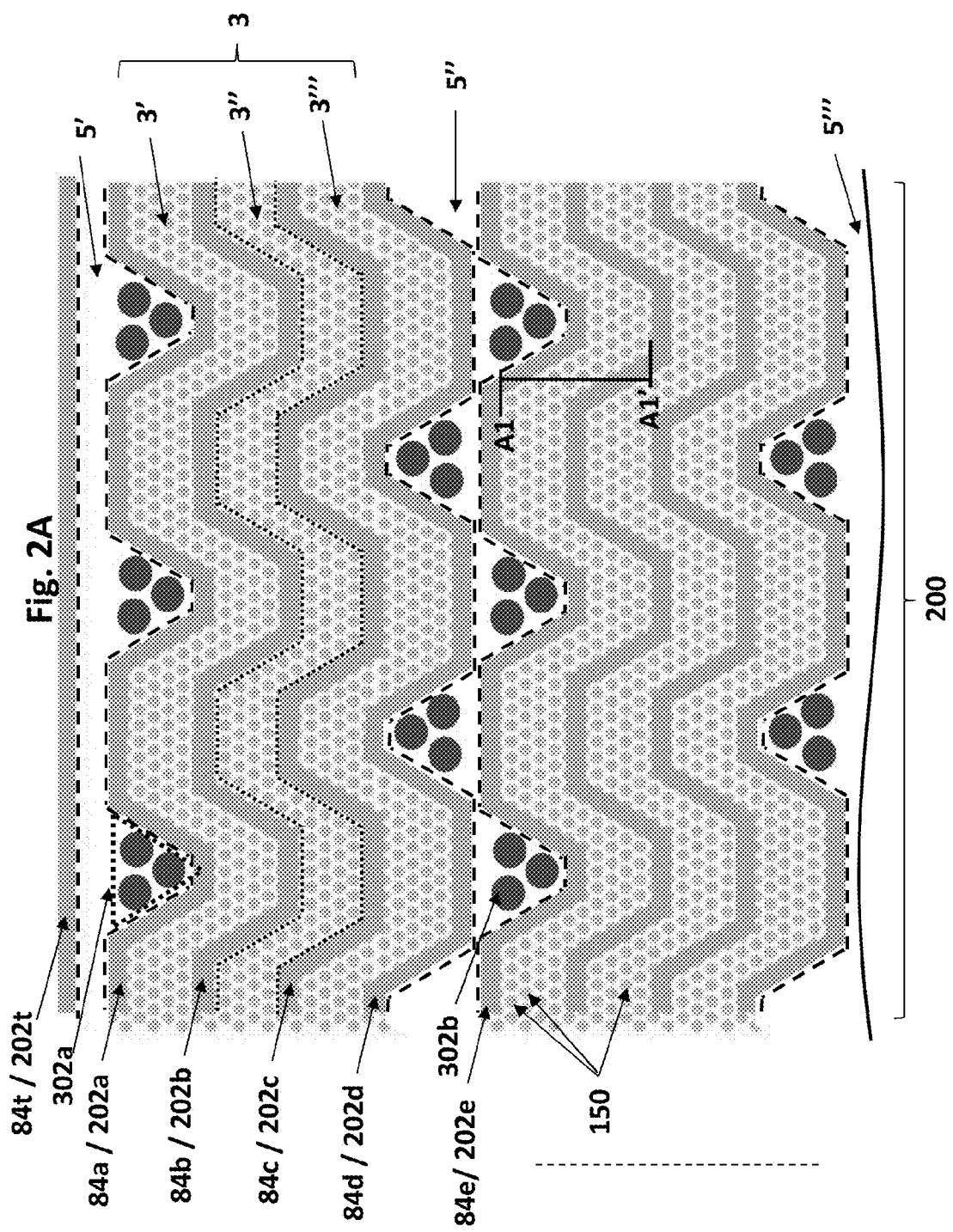

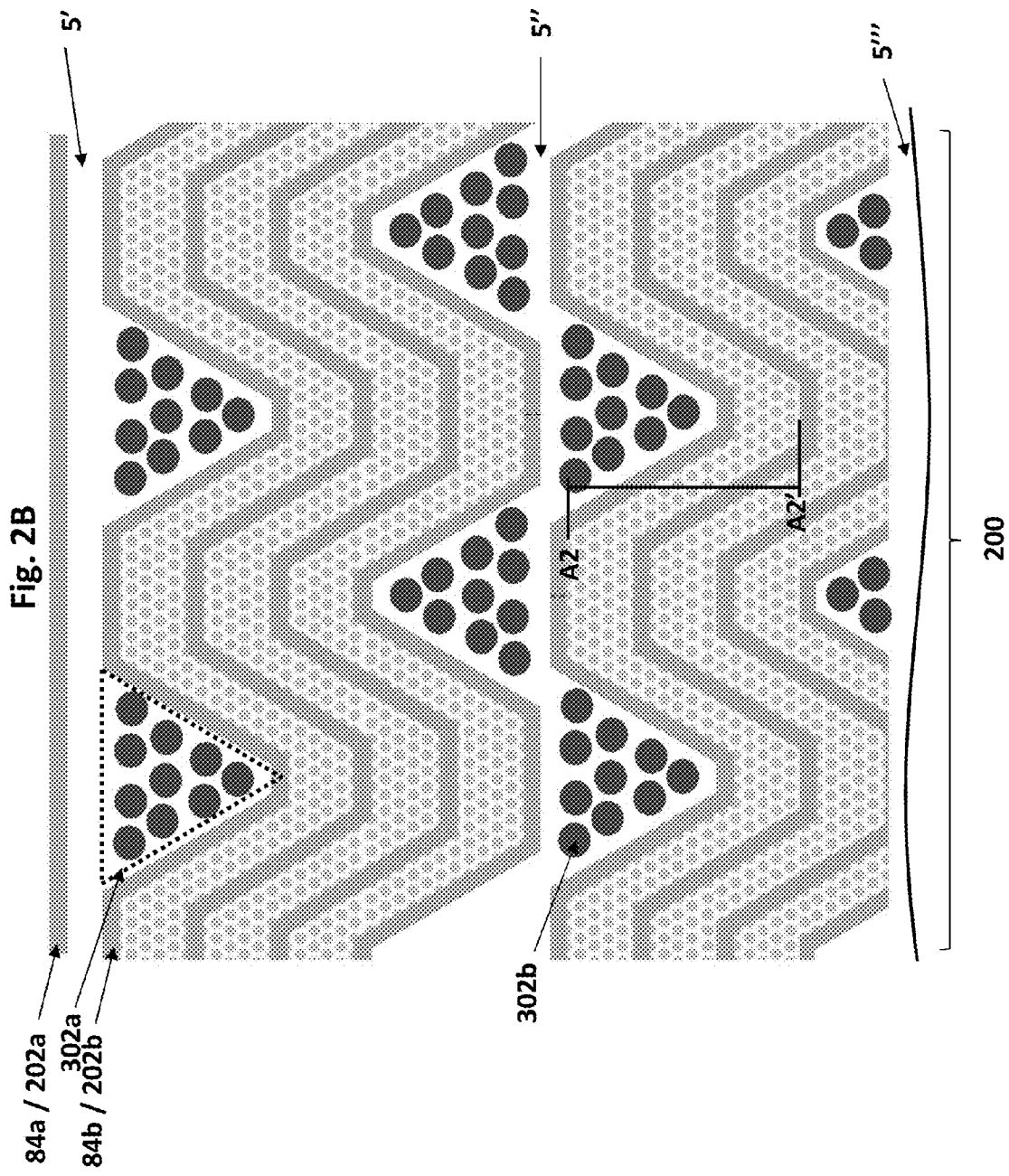

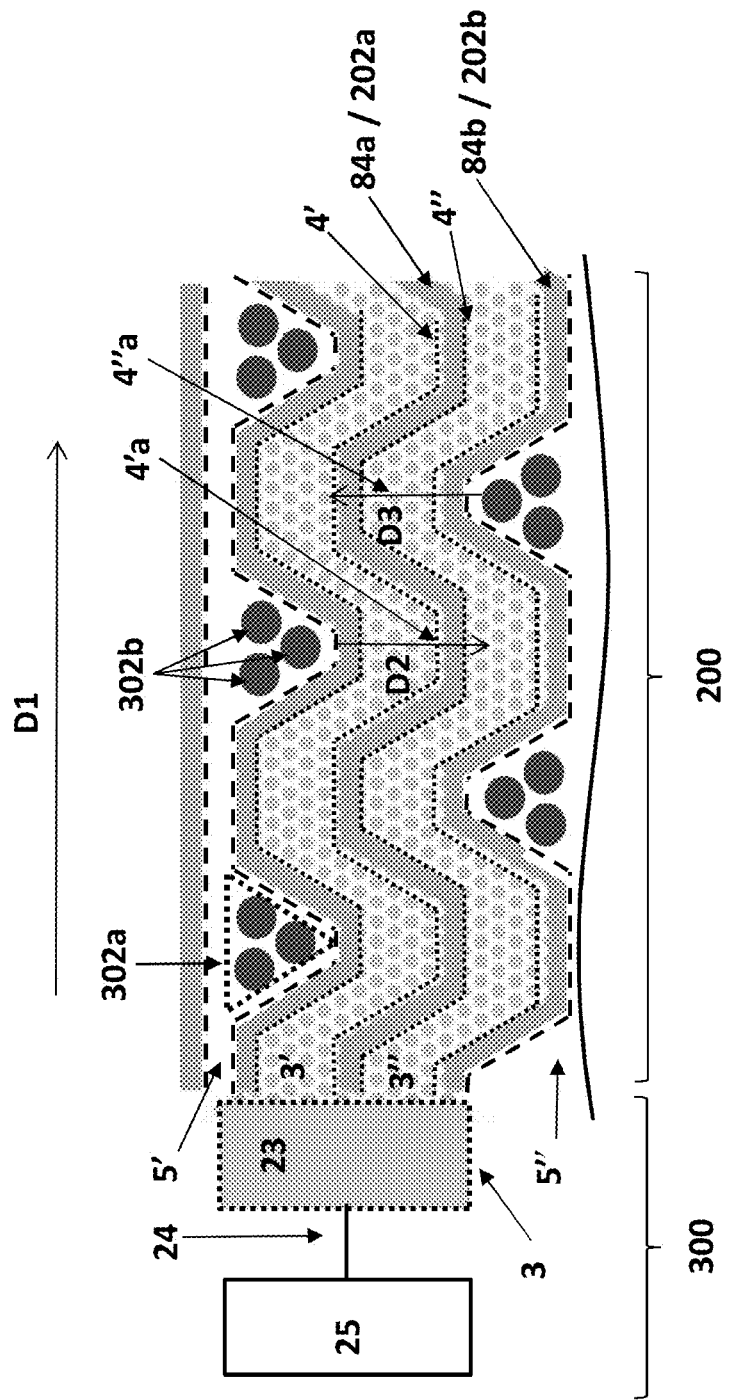

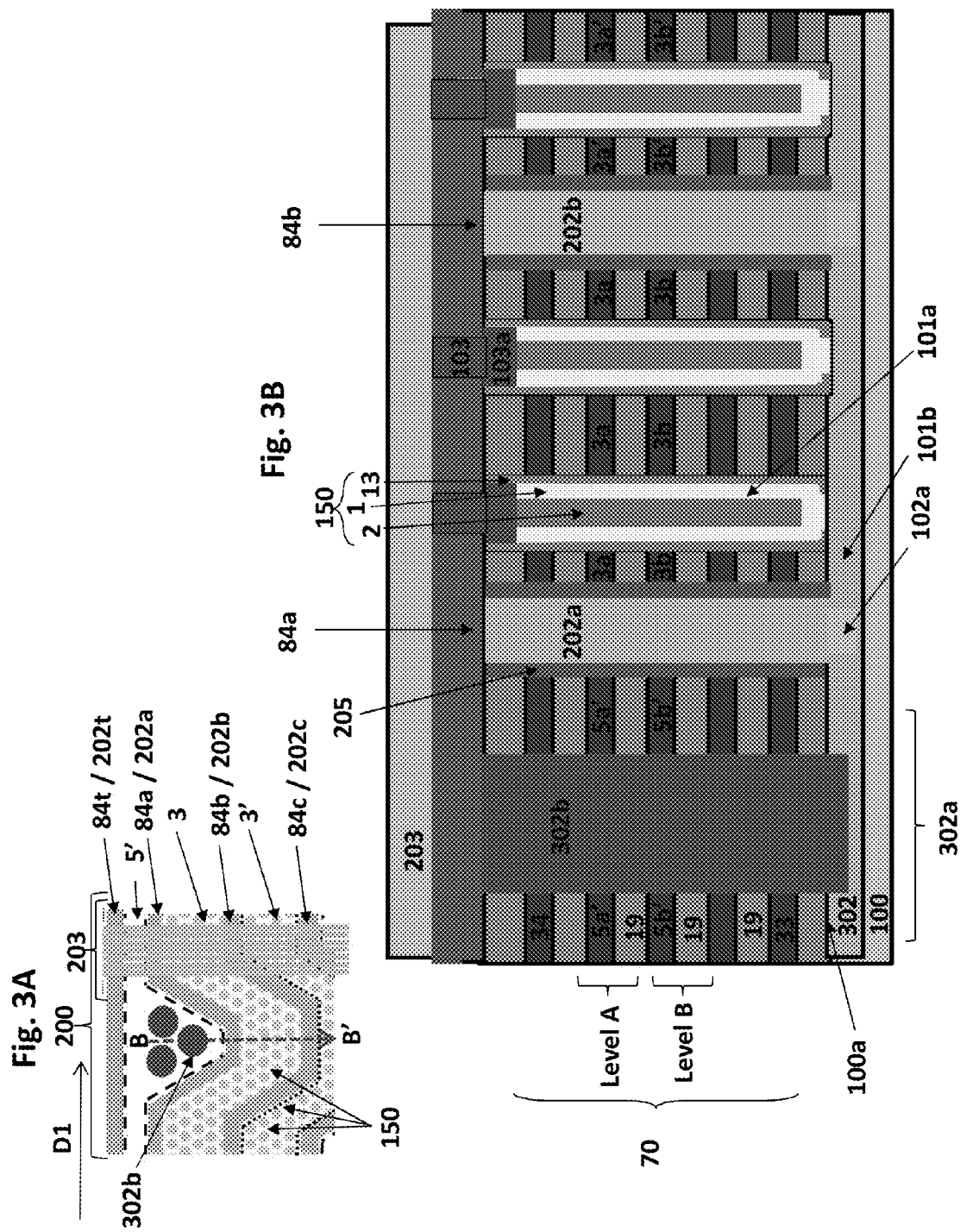

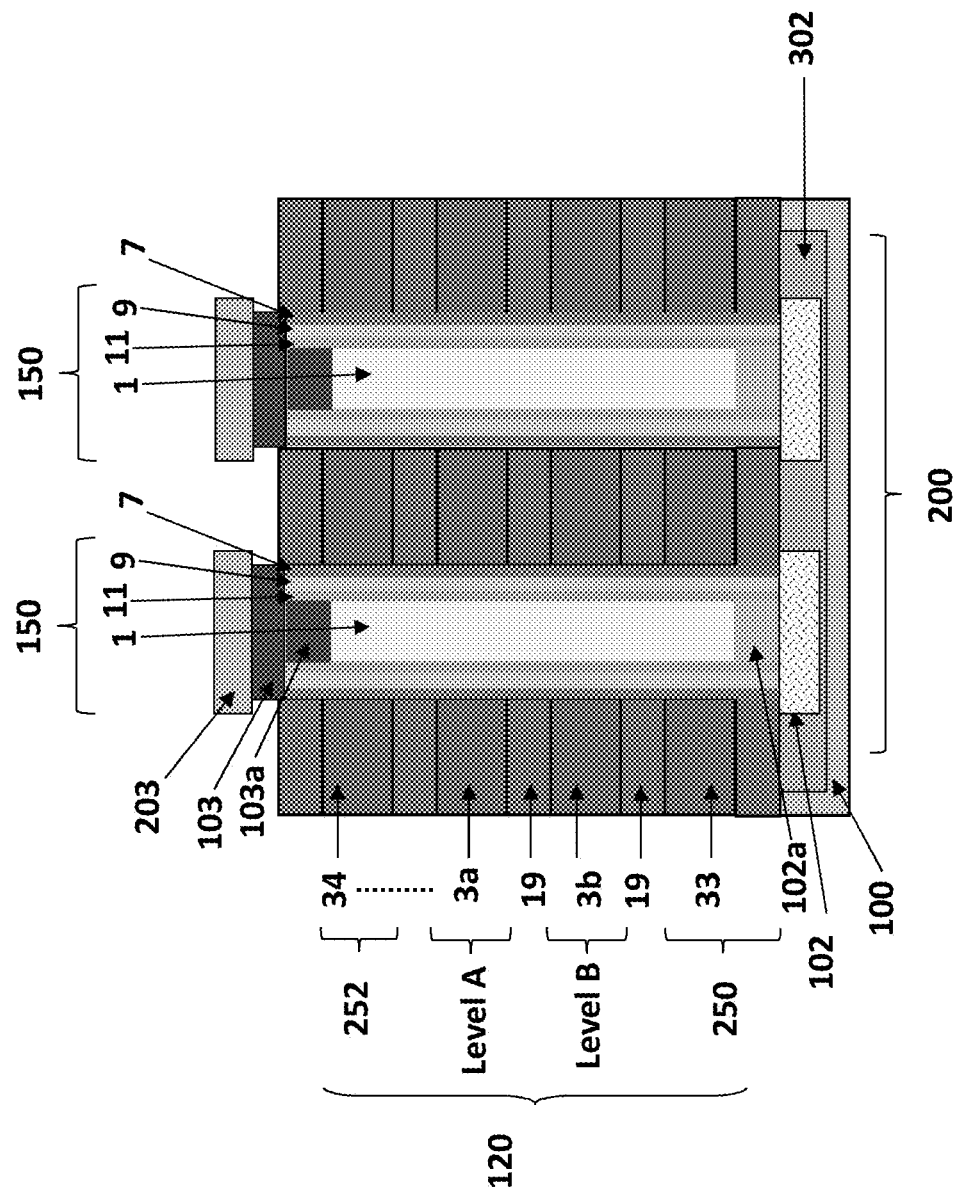

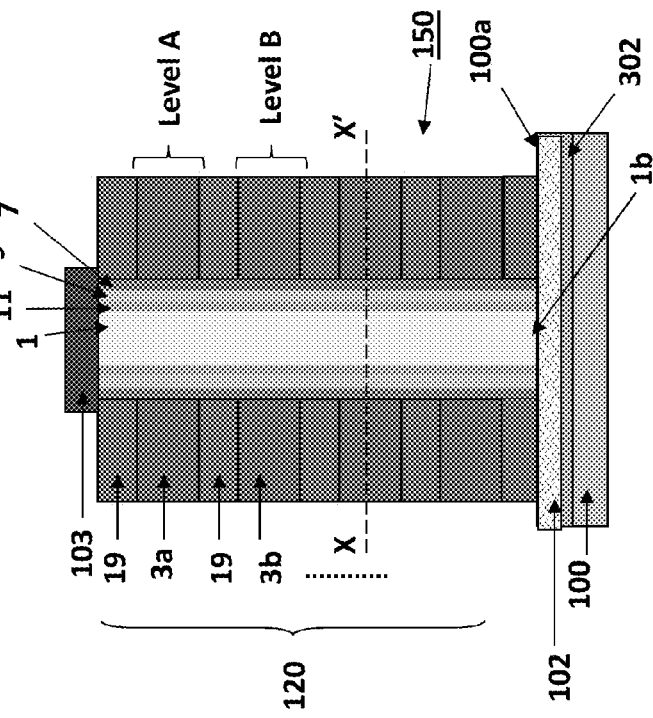
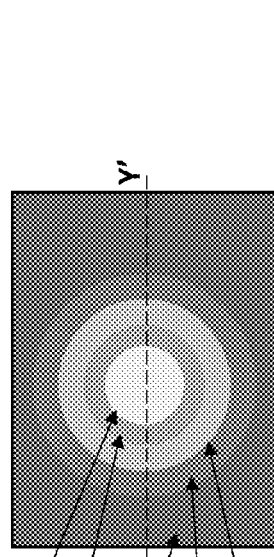
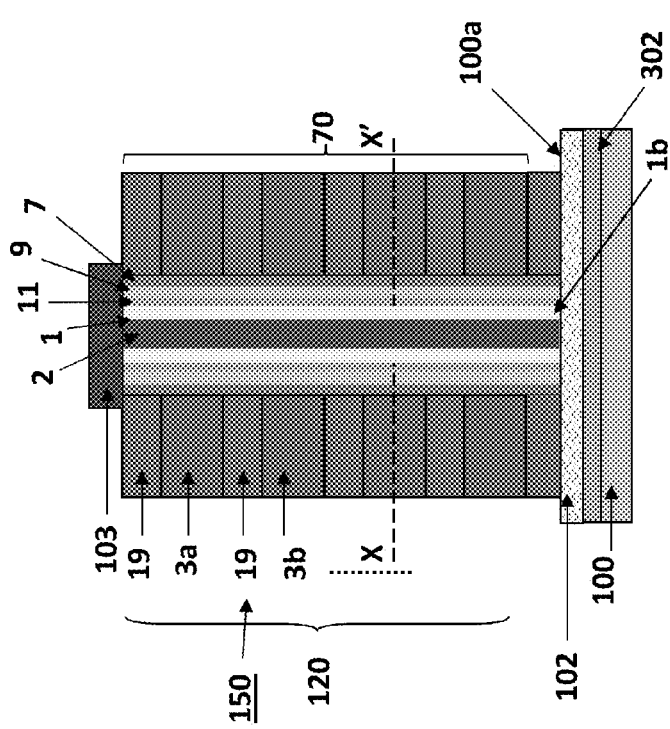
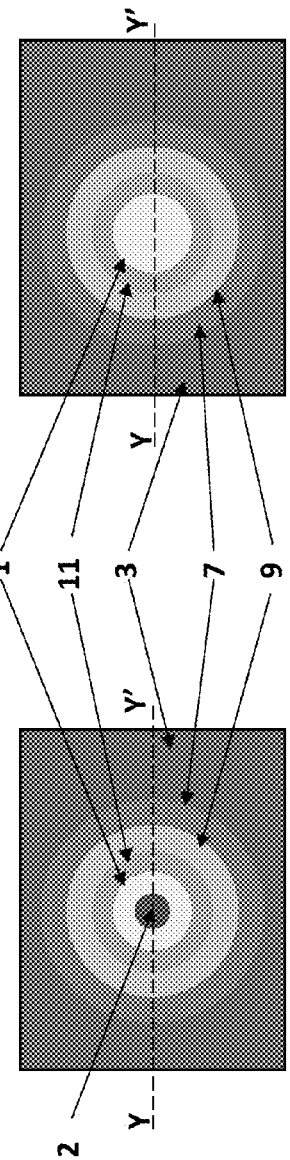

THREE DIMENSIONAL NAND DEVICE HAVING NONLINEAR CONTROL GATE ELECTRODES AND METHOD OF MAKING THEREOF

FIELD

The present disclosure relates generally to the field of semiconductor devices and specifically to three dimensional vertical NAND strings and other three dimensional devices and methods of making thereof.

BACKGROUND

Three dimensional vertical NAND strings having one bit per cell are disclosed in an article by T. Endoh, et. al., titled "Novel Ultra High Density Memory With A Stacked-Surrounding Gate Transistor (S-SGT) Structured Cell", IEDM Proc. (2001) 33-36.

SUMMARY

According to one embodiment of the disclosure, a method of making a monolithic three dimensional NAND device comprises forming a stack of alternating first layers and second layers having at least one active region, wherein the stack of alternating first layers and second layers extend substantially parallel to a major surface of a substrate; etching the stack to form a plurality of memory openings extending substantially perpendicular to the major surface of the substrate in the at least one active region; forming a semiconductor channel and at least a portion of a memory film in each of the plurality of memory openings; etching the stack to form at least one first slit trench having a height extending substantially perpendicular to the major surface of the substrate, the at least one first slit trench comprising at least one nonlinear slit trench side wall in the at least one active region; forming a source electrode in the first slit trench; and forming a bit line over the semiconductor channel and the memory film located in the at least one memory opening.

According to another embodiment of the disclosure, a monolithic three dimensional NAND memory device comprises a plurality of control gate electrodes extending in a first direction substantially parallel to a major surface of a substrate in at least one active region. The plurality of control gate electrodes comprise at least a first control gate electrode located in a first device level and a second control gate electrode located in a second device level located over the major surface of the substrate and below the first device level. The monolithic three dimensional NAND memory device further comprises an interlevel insulating layer located between the first control gate electrode and the second control gate electrode; a plurality of semiconductor channels; at least one memory film located between each of the plurality of control gate electrodes and each respective semiconductor channel of the plurality of semiconductor channels; and at least one first slit trench extending substantially perpendicular to the major surface of the substrate. At least one end portion of each of the plurality of semiconductor channels extends substantially perpendicular to the major surface of the substrate, such that at least one first portion of each of the plurality of semiconductor channels is located in the first device level, and at least one second portion of each of the plurality of semiconductor channels is located in the second device level. Each of the plurality of control gate electrodes has a nonlinear side wall adjacent to the at least one first slit trench in the at least one active region.

BRIEF DESCRIPTION OF THE DRAWINGS

FIG. 1 is a schematic top view of a memory device according to embodiments of the disclosure.

FIGS. 2A, 2B, 2C, and 2D are schematic top views of memory devices according to other embodiments of the disclosure.

FIG. 3A is a top view of a portion of a memory block of an embodiment of the disclosure. FIG. 3B is a side cross sectional view of the memory block of FIG. 3A along the bit line B-B'.

FIG. 4A is a side cross sectional view of a NAND string and dummy channel according to an alternative embodiment of the disclosure.

FIGS. 5A and 5B are respectively side cross sectional and top cross sectional views of a NAND string of one embodiment. FIG. 5A is a side cross sectional view of the device along line Y-Y' in FIG. 5B, while FIG. 5B is a side cross sectional view of the device along line X-X' in FIG. 5A.

FIGS. 5C and 5D are respectively side cross sectional and top cross sectional views of a NAND string of one embodiment. FIG. 5C is a side cross sectional view of the device along line Y-Y' in FIG. 5D, while FIG. 5D is a side cross sectional view of the device along line X-X' in FIG. 5C.

DETAILED DESCRIPTION

Figure 2D:
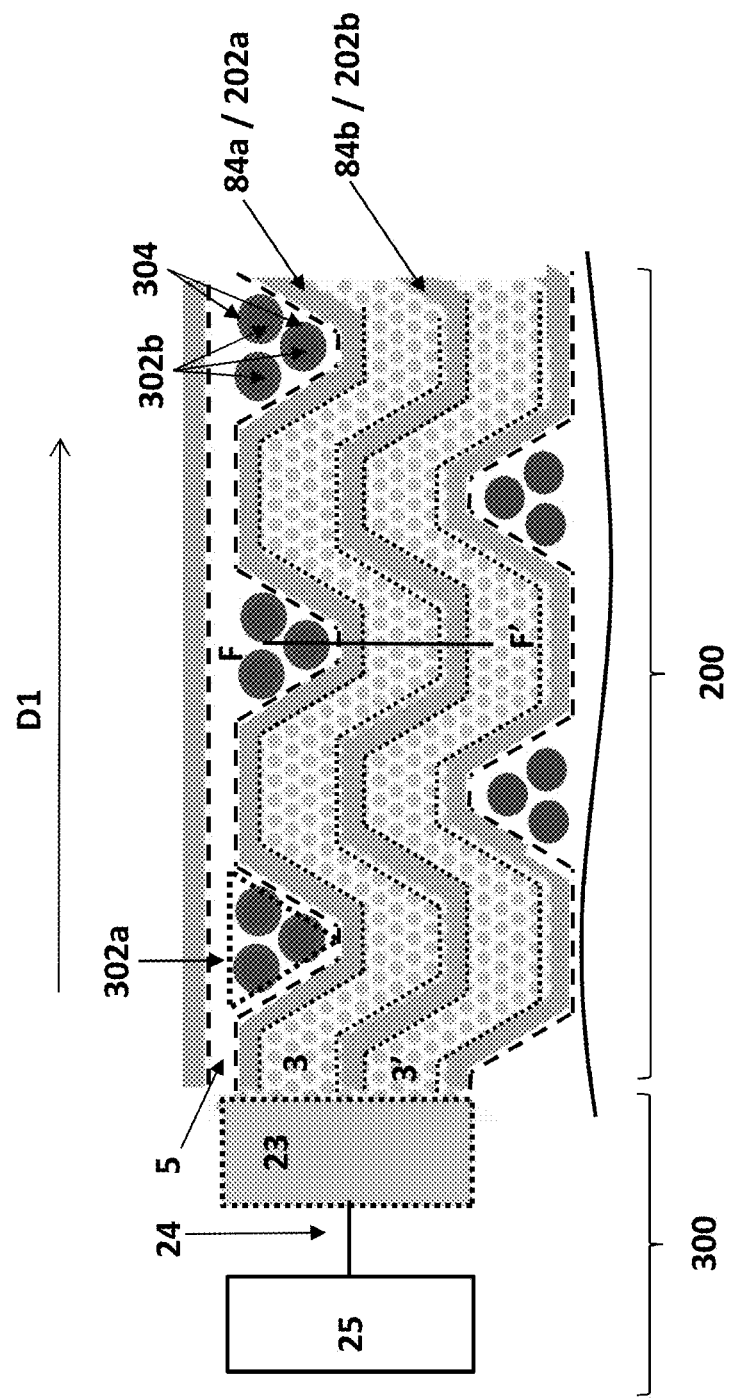

Embodiments of the present disclosure will be described below with reference to the accompanying drawings. It should be understood that the following description is intended to describe some embodiments of the disclosure, and not to limit the disclosure.

The embodiments of the disclosure provide a monolithic, three dimensional array of memory devices, such as an array of vertical NAND strings. The NAND strings are vertically oriented, such that at least one memory cell is located over another memory cell. The array allows vertical scaling of NAND devices to provide a higher density of memory cells per unit area of silicon or other semiconductor material.

A monolithic three dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and adhering the memory levels atop each other, as in Leedy, U.S. Pat. No. 5,915,167, titled "Three Dimensional Structure Memory." The substrates may be thinned or removed from the memory levels before bonding, but as the memory levels are initially formed over separate substrates, such memories are not true monolithic three dimensional memory arrays.

FIGS. 1, 2A, 2B and 3A are top views of a memory block of embodiments of the disclosure. FIG. 3B is a side cross sectional view of the memory block of FIG. 3A along the bit line B-B'.

In some embodiments, the monolithic three dimensional NAND memory device comprises at least one active region 200, as shown in FIGS. 1 and 2A. The active region 200 comprises an array of monolithic three dimensional NAND strings 150 filled with a memory film 13, a semiconductor channel 1, and optionally an insulating fill material 2, as shown in FIG. 3B.

As shown in FIG. 3B, the monolithic three dimensional NAND memory device further comprises a plurality of control gate electrodes 3 separated by a plurality of insulating layers 19, each of which extend substantially parallel to a major surface 100a of a substrate 100.

In some embodiments, as described in more detail below with respect to FIGS. 6-41, the plurality of control gate electrodes 3 is formed by first forming a plurality of sacrificial layers 121 as shown in FIGS. 7-29, then removing the plurality of sacrificial layers 121 and filling the resulting openings 182 with a conductive material to form a plurality of control gate electrodes 3, as shown in FIGS. 30-41. This fill step may result in warpage of the substrate 100 due to a compressive or tensile stress imposed in a first direction (e.g., the word line direction) by the plurality of control gate electrodes 3 on the substrate.

To counteract the tendency of the substrate to warp due to the compressive or tensile stress imposed by the plurality of control gate electrodes on the substrate, embodiments of the disclosure include nonlinear portions of the control gate electrodes in at least the active regions. The nonlinear shape may shift at least part of the compressive or tensile stress imposed on the substrate by the plurality of control gate electrodes from the first direction to a second direction (e.g., the bit line direction) which is perpendicular to the first direction.

In some embodiments, the control gate electrode 3 is located adjacent to at least one back side opening 84, such as a slit trench 84 extending substantially perpendicular to the major surface 100a of the substrate 100, as shown in FIGS. 1, 2A, 3A, and 3B. The control gate electrode 3 may be located between two slit trenches 84a and 84b, as shown in FIGS. 3A and 3B.

FIGS. 3A and 3B illustrate a portion of a memory device containing an array of a plurality of vertical NAND strings 150 according to one embodiment of the disclosure. Each NAND string 150 contains at least one memory film 13 which is located adjacent to the semiconductor channel 1 in the memory device levels 70, as shown in FIG. 3B. Specifically, the memory film 13 is located between the semiconductor channel 1 and the plurality of control gate electrodes 3. The memory film 13 contains a tunnel dielectric 11, a charge storage region(s) 9 (e.g., a dielectric charge trapping layer or floating gates), and a blocking dielectric 7. In various embodiments, the semiconductor channel 1 may be a solid rod shape or a hollow substantially cylindrical shape in the memory device levels 70. The tunnel dielectric 11 comprises a cylinder or inverse truncated cone which surrounds the semiconductor channel 1. The charge storage region 9 comprises a cylinder or inverse truncated cone which surrounds the tunnel dielectric 11. The blocking dielectric 7 comprises a cylinder or inverse truncated cone which surrounds the charge storage region 9. The plurality of control gate electrodes 3 comprise metal or metal alloy control gate electrodes which surround the blocking dielectric 7 in each NAND string 150.

Figure 4B:
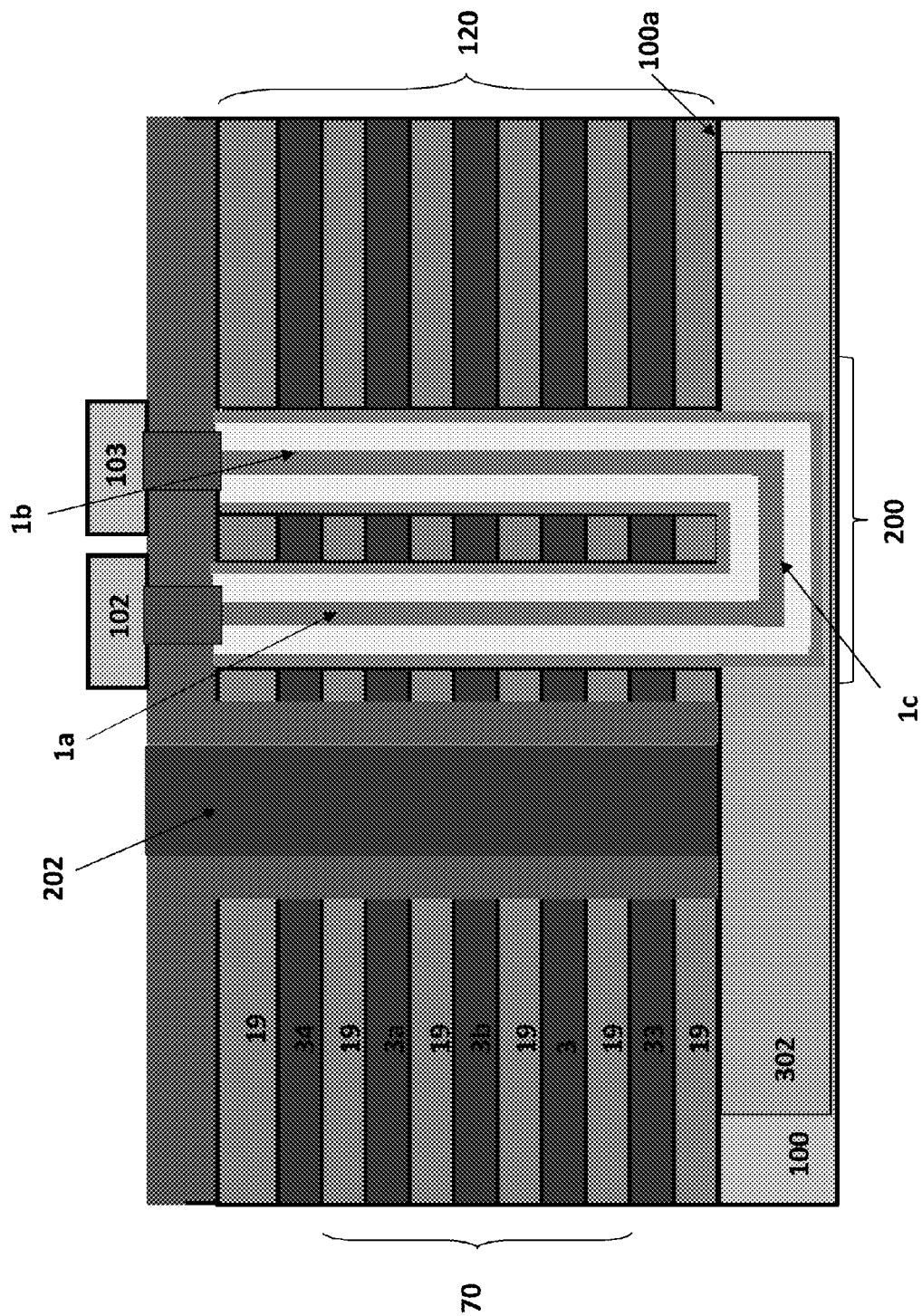
FIG. 4B is a side cross sectional view of a NAND string according to another alternative embodiment of the disclosure.

As shown in FIG. 3B, the memory device levels 70 include the semiconductor channel 1 having at least one end portion extending substantially perpendicular to a major surface 100a of a substrate 100, as shown in FIGS. 3B, 4A, and 4B. For example, the semiconductor channel 1 may have a pillar shape in the memory device levels 70 and the entire pillar-shaped semiconductor channel in the memory device levels 70 extends substantially perpendicularly to the major surface of the substrate 100, as shown in FIG. 4A. In some embodiments, the opposite end portions of the semiconductor channel 1 include semiconductor source and drain regions 102a, 103a doped with opposite conductivity type dopants (e.g., n-type) than that of the channel (e.g., p-type), as shown in FIG. 4A. The source and drain regions 102a, 103a electrically contact a respective source line and drain line. In one embodiment, the source/drain lines of the device can include a first line 102 formed under and a second line 103 formed over the semiconductor channel 1, as shown in FIGS. 4A, 5A, and 5C. In some embodiments, the first line 102 is a source line, and the second line 103 is a drain line. For example, a bottom portion 1b of the channel 1 contacts the source line 102, (if the source line 102 is a semiconductor of opposite conductivity type to that of the channel 1 and acts as a source region of the device) as shown in FIGS. 5A and 5C, and a drain region 103a in the upper portion of the channel 1 is electrically connected to the drain line 103, as shown in FIGS. 3B, 4A, 5A, and 5C.

Alternatively, the semiconductor channel 1 may have a U-shaped pipe shape, as shown in FIG. 4B. The two wing portions 1a and 1b of the U-shaped pipe shape semiconductor channel may extend substantially perpendicular to the major surface 100a of the substrate 100, and a connecting portion 1c of the U-shaped pipe shape semiconductor channel 1 connects the two wing portions 1a, 1b extends substantially parallel to the major surface 100a of the substrate 100. In these embodiments, one of the source or drain electrodes 102 contacts the first wing portion of the semiconductor channel from above, and another one of a source or drain electrodes 103 contacts the second wing portion of the semiconductor channel 1 from above.

In an alternative embodiment shown in FIG. 3B, the semiconductor channel 1 may have a J-shaped pipe shape. A first wing portion 101a of the J-shaped pipe shape semiconductor channel 1 may extend substantially perpendicular to the major surface 100a of the substrate 100, and a second horizontal portion 101b of the J-shaped pipe shape semiconductor channel extends substantially parallel to the major surface 100a of the substrate 100. One of the source or drain electrodes (e.g., drain electrode) 203 contacts the drain region 103a via the drain line 103 over the wing portion 101a of the semiconductor channel 1 from above, and another one of a source or drain electrodes (e.g., source electrode) 202 contacts the source region 102a next to the second portion 101b of the semiconductor channel 1 from above. In these embodiments, a horizontal source line 102 of FIGS. 4A, 5A, and 5C is not necessary. In some embodiments, the source electrode 202 (e.g., 202a and/or 202b) is a rail shaped electrode located in a dielectric 205 insulated trench 84, and extends substantially parallel to the control gate electrodes 3, as shown in FIGS. 3A and 3B. In some embodiments, the drain electrode is a bit line 203 located above the semiconductor channel 1, and the bit line extends substantially perpendicular to the plurality of control gate electrodes 3 and to the source electrode 202.

In some embodiments, the semiconductor channel 1 may be a filled feature, as shown in FIGS. 5C and 5D. In some other embodiments, the semiconductor channel 1 may be hollow, for example a hollow substantially cylindrical shape (e.g., tapered cylinder with increasing diameter, such as a hollow truncated cone, or a cylinder with a substantially uniform diameter as a function of height throughout most of the channel, with the bottom portion 1b, as shown in FIGS. 5A and 5C) filled with the insulating fill material 2, as shown in FIGS. 3B, 5A and 5B. In these embodiments, an insulating fill material 2 may be formed to fill the hollow part surrounded by the semiconductor channel 1.

The substrate 100 can be any semiconducting substrate known in the art, such as monocrystalline silicon, IV-IV compounds such as silicon-germanium or silicon-germanium-carbon, III-V compounds, II-VI compounds, epitaxial layers over such substrates, or any other semiconducting or non-semiconducting material, such as silicon oxide, glass, plastic, metal or ceramic substrate. The substrate 100 may include integrated circuits fabricated thereon, such as driver circuits for a memory device. In some embodiments, the driver circuit is located above or in a silicon substrate.

Any suitable semiconductor materials can be used for semiconductor channel 1, for example silicon, germanium, silicon germanium, or other compound semiconductor materials, such as III-V, II-VI, or conductive or semiconductive oxides, etc. The semiconductor material may be amorphous, polycrystalline or single crystal. The semiconductor channel material may be formed by any suitable deposition methods. For example, in one embodiment, the semiconductor channel material is deposited by low pressure chemical vapor deposition (LPCVD). In some other embodiments, the semiconductor channel material may be a recrystallized polycrystalline semiconductor material formed by recrystallizing an initially deposited amorphous semiconductor material.

The insulating fill material 2 may comprise any electrically insulating material, such as silicon oxide, silicon nitride, silicon oxynitride, or other high-k insulating materials.

In some embodiments, a source electrode 202 contacts a source region 102a in or over the substrate 100, and a portion 101b of the semiconductor channel 1 extends parallel to the major surface of the substrate 100a in or over the substrate 100, such as in a semiconductor channel having a J-shaped pipe shape described above and illustrated in FIG. 3B.

Alternatively, the channels 1 are electrically connected to source line 102 having at least one end portion extending substantially parallel to the major surface 100a of the substrate 100, as shown in FIGS. 4A, 5A, and 5C. For example, the source line 102 may have a planar shape and the entire planar-shaped source line extends substantially parallel to the major surface of the substrate 100, as shown in FIGS. 5A and 5C.

In various embodiments, the semiconductor channel 1 comprises amorphous silicon or polysilicon having a first conductivity type (e.g., p-type), the source line 102 comprises single crystal silicon or polysilicon having a second conductivity type (e.g., n-type) and a higher doping concentration than the semiconductor channel 1, and the substrate 100 comprises a single crystal silicon substrate having a lower doping concentration than the source line 102, as shown in FIGS. 4A, 5A, and 5C. Alternatively, a source electrode 202 may comprise a metal (e.g., Cu, W, etc.), metal alloy (e.g., WN, TiN, etc.) and/or metal silicide (e.g., $WSi_x$), as shown in FIG. 3B. The upper portion of the substrate 100 may include a well of the first conductivity type (e.g., p-well 302) below the vertical portion 101a of the channel 101a such that the horizontal portion 101b of the channel is located in the p-well 302, as shown in FIG. 3B.

In some embodiments, at least the top major surface 100a of the substrate 100 comprises single crystal silicon. The entire substrate 100 may comprise a single crystal silicon substrate, such as a silicon wafer. Alternatively, the substrate may comprise a single crystal silicon layer which forms the top major surface 100a located over a silicon wafer or another supporting material.

The monolithic three dimensional NAND strings 150 in memory device levels 70 further comprise the plurality of control gate electrodes 3, as shown in FIGS. 3B, 4A, 4B, 5A, and 5C. The control gate electrodes 3 may comprise a portion having a strip shape extending substantially parallel to the major surface 100a of the substrate 100. The plurality of control gate electrodes 3 comprise at least a first control gate electrode 3a located in a first device level (e.g., memory device level A) and a second control gate electrode 3b located in a second device level (e.g., memory device level B) located over the major surface 100a of the substrate 100 and below the device level A. The control gate material may comprise any one or more suitable conductive or semiconductor control gate material known in the art, such as doped polysilicon, tungsten, copper, aluminum, tantalum, titanium, cobalt, titanium nitride, alloys thereof or combination of these materials.

A blocking dielectric 7 is located adjacent to the control gate electrode(s) 3. In some embodiments, the blocking dielectric is located adjacent to the control gate electrode 3 and parallel to the channel 1, as shown in FIGS. 4A, 5A, and 5C. In other embodiments, the blocking dielectric 7 may surround the control gate electrode 3. The blocking dielectric 7 may comprise one or more layers having plurality of blocking dielectric segments located in contact with a respective one of the plurality of control gate electrodes 3. Alternatively, the blocking dielectric may comprise one or more continuous layers which extend the entire length of the memory cell portion of the NAND string.

The monolithic three dimensional NAND string 150 also comprise at least one charge storage region 9. The charge storage region 9 may comprise one or more continuous layers which extend the entire length of the memory cell portion of the NAND string. Alternatively, the charge storage region may comprise a plurality of discrete charge storage regions or segments 9 located between the blocking dielectric 7 and the channel 1.

The discrete charge storage regions 9 may comprise a plurality of vertically spaced apart, conductive (e.g., metal such as tungsten, molybdenum, tantalum, titanium, platinum, ruthenium, and alloys thereof, or a metal silicide such as tungsten silicide, molybdenum silicide, tantalum silicide, titanium silicide, nickel silicide, cobalt silicide, or a combination thereof), or semiconductor (e.g., polysilicon) floating gates. Alternatively, the charge storage region 9 may comprise an insulating charge trapping material, such as a silicon nitride layer or silicon nitride segments. Alternatively, the charge storage region 9 may comprise conductive nanoparticles, such as metal nanoparticles, for example ruthenium nanoparticles.

The tunnel dielectric 11 of the monolithic three dimensional NAND string is located between charge storage region 9 and the semiconductor channel 1. The tunnel dielectric layer 11 may comprise a silicon oxide. For example, the tunnel dielectric layer 11 may be a silicon dioxide layer, or a silicon dioxide/silicon nitride/silicon dioxide multi-layer.

The blocking dielectric 7 and the tunnel dielectric 11 may be independently selected from any one or more same or different electrically insulating materials, such as silicon oxide, silicon nitride, silicon oxynitride, or other insulating materials, such as metal oxide materials, for example aluminum oxide or hafnium oxide. The blocking dielectric 7 may include multiple different layers, such as silicon oxide and metal oxide (e.g., $Al_2O_3$) layers. The tunnel dielectric 11 may include multiple layers of silicon oxide, silicon nitride and/or silicon oxynitride (e.g., ONO layers).

In one embodiment, the tunnel dielectric 11 comprises a silicon oxide layer which extends perpendicular to the major surface 100a of the substrate 100, and the charge trapping layer 9 comprises a silicon nitride layer which extends perpendicular to the major surface 100a of the substrate 100 and which contacts the tunnel dielectric 11. The blocking dielectric 7 comprises a first silicon oxide layer or a combination of silicon oxide and metal oxide layers which is patterned into regions which extend perpendicular to the major surface 100a of the substrate 100 and which contacts the charge trapping layer 9.

The control gate electrodes may also be referenced as "word lines" or "word line fingers" herein. As illustrated in FIG. 1, an active region 200 contains a plurality of NAND strings 150 and includes a first word line 3' (indicated by dotted lines) between source electrodes 202a and 202b, which are located in the respective slit trenches 84a and 84b. Word line 3" is located between source electrodes 202b and 202c, which are located in the respective slit trenches 84b and 84c. Each word line 3 has at least one nonlinear side wall 4 adjacent to a slit trench 84 in the active region 200.

As shown in FIG. 1, a first dummy word line 5' (indicated by dashed lines) includes several p-well contact regions 302a (indicated by dotted lines) and is bounded by the source electrode 202a in slit trench 84a. FIG. 1 further illustrates a second dummy word line 5" located between source electrodes 202c and 202d. The p-well contact region 302a is a region where contact(s) 302b (e.g., electrically conductive or heavily doped semiconductor electrode(s)) to the p-well 302 in or over the substrate 100 are located, as shown in FIGS. 1 and 3B. As shown in FIG. 3B, the p-well contact 302b to the p-well 302 has a major axis extending substantially perpendicular to the major surface 100a of the substrate 100. In some embodiments, at least a first portion of the p-well contact 302b is located in a plane containing the first device Level A, and a least a second portion of the p-well contact 302b is located in a plane containing the second device Level B.

In some embodiments, the dummy word line 5' has at least one nonlinear side wall 6 adjacent to a slit trench 84a in the active region 200, as shown in FIG. 1.

In the embodiment illustrated in FIG. 1, the dummy word line 5' has one linear side wall 16 adjacent to a linear region of slit trench 84t containing source line 202t in the active region 200. The slit trench 84t may be linear in the active region 200 in certain embodiments, for example where slit trench 84t is located at an edge of a device or an array. In various embodiments, a slit trench 84t having a linear profile in the active region 200 is located along opposite side edges of a device.

For the sake of clarity, three dummy word lines 5', 5", and 5'''; and four word lines 3 are shown FIG. 1. However, the array of dummy word lines 5 and word lines 3 can extend farther than that shown in the Figures, as indicated by the cutaway line below dummy word line 5''' in FIG. 1.

In some embodiments, a first dummy word line 5a' is located in the first device level A between slit trenches 84 and 84a, and a second dummy word line 5b' is located in the second, lower device level between the same two slit trenches 84 and 84a, as shown in FIGS. 3A and 3B. Thus, dummy word line 5a' is located directly over dummy word line 5b'.

In various embodiments, the p-well contact region 302a includes a plurality of pillar shaped p-well contacts 302b which extend through the first and second dummy word lines 5a' and 5b' in a region between a nonlinear portion of slit trench 84a and a straight portion of slit trench 84, as shown in FIGS. 3A and 3B.

In some embodiments, NAND strings 150 extend through word line 3, but no NAND strings 150 are present in dummy word lines 5 (i.e., no channels and memory films extend through dummy word lines 5). This feature may effectively reduce the number of NAND strings 150 per area of the active region 200. In some embodiments, this area penalty may be mitigated by reducing the frequency of dummy word lines 5. The embodiment illustrated in FIG. 1 includes two word lines 3 between dummy word lines 5 (i.e., there are twice as many word lines 3 as dummy word lines 5). The embodiment illustrated in FIG. 2A includes three word lines 3 between dummy word lines 5 (i.e., there are three times as many word lines 3 as dummy word lines 5), and has more NAND strings 150 per area than the embodiment shown in FIG. 1. In some embodiments, there are m dummy word lines 5, and n word lines 3, where n and m are both integers and n is less than, equal to, or greater than m. However, reducing the frequency of dummy word lines 5 may lower the efficiency of stress reduction on the substrate in some embodiments, as there is a greater distance between p-well contact regions 302a.

The stress reduction efficiency can be improved by increasing the amplitude A-A' as measured by the greatest displacement of the dummy word line 5 from a reference line along the first direction (e.g., the word line direction). The embodiment illustrated in FIG. 2A has a word line having an amplitude of A1-A1'. The embodiment illustrated in FIG. 2B includes a word line having an amplitude of A2-A2', which is larger than A1-A1'. The embodiment shown in FIG. 2B also has p-well contact regions 302a that are larger than the p-well contact regions 302a of the embodiment shown in FIG. 2A. As a result, the area penalty for the embodiment shown in FIG. 2B is greater than that of the embodiment of FIG. 2A.

In some embodiments, the nonlinear side wall 4 comprises a curved portion. In some embodiments, as shown in FIGS. 1 and 2A-2C, the nonlinear side wall 4 comprises a first side wall portion 4a having a first plane, a second side wall portion 4b having a second plane different from the first plane, and a third side wall portion 4c connecting the first side wall portion 4a and the second side wall portion 4b. In some embodiments, an angle between the first side wall portion 4a and the third side wall portion 4c is between about 0° and about 90°, such as from about 0° to about 80°. In the embodiment shown in FIG. 1, the angle between the first side wall portion 4a and the third side wall portion 4b is about 60°. In the embodiments illustrated in FIG. 1, the nonlinear side wall 4 circumvents the p-well contact regions 302a containing the p-well contacts 302b.

As shown in FIGS. 1, 2A, and 2B, the word lines 3 have a substantially uniform width along the second (e.g., bit line) direction in the active region 200 in some embodiments. In other embodiments, the word lines 3 have a non-uniform width along the second direction in the active region 200.

In some embodiments, a straight line axis S-S' shown in FIG. 1 extends in the first (e.g., word line) direction substantially parallel to the major surface 100a of the substrate 100 along a middle (e.g., approximately halfway between the farthest extensions of the control gate electrode in the bit line direction) of a width of one control gate electrode 3. The axis S-S' shown in FIG. 1 is partially contained within a width of one control gate electrode 3, and is partially contained outside the width of the control gate electrode 3 in the active region 200. In other embodiments, a straight line axis is completely contained within a width of one control gate electrode. In some embodiments, as shown in FIGS. 1, 2A, 2B, and 3A, at least a first slit trench 84a has a side wall complementary to at least one nonlinear side wall 4 of the word line 3 in the active region 200. In the embodiments illustrated in FIGS. 1, 2A, 2B, 3A, and 3B, a second slit trench 84b has a profile complementary to the first slit trench 84a, and a plurality of control gates including control gates 3a and 3b are located between the first slit trench 84a and the second slit trench 84b.

FIG. 2C illustrates a word line contact region 300 located adjacent to region 200. Each comb shaped word line 3 includes a first finger portion 3' and a second finger portion 3" that each extend substantially in a first direction D1 from region 300 into region 200. The first and second finger portions 3' and 3" are connected by a connection portion 23 in the word line contact region 300, shown in dotted lines in FIG. 2C. The second finger portion 3" is separated from the first finger portion 3' by a first slit trench 84a. The connection portion 23 of the comb shaped word line 3 is located in the word line contact region 300 outside the active region 200 and connects the first and second finger portions 3' and 3" to word line driver circuits 25 by interconnect(s) 24. The embodiment illustrated in FIG. 2C further includes a dummy word line finger 5" located between a second slit trench 84b and a third slit trench (not shown). The dummy word line 5" is not connected to the word line connecting portion 23 and is not connected to the word line driver circuit 25. No voltage or current is applied to the dummy word line during program, erase, and read operation of the device. However, a boost voltage (e.g., 15-25V) is applied to the p-well contacts 302b during the erase operation. Various embodiments include a first comb shaped word line and a first dummy word line finger located in a first device level, and a second comb shaped word line and a second dummy word line finger located in a second, lower device level.

In an embodiment illustrated in FIG. 2C, the first finger portion 3' includes a nonlinear side wall 4' having a first protruding portion 4'a. The first protruding portion 4'a protrudes in a second (e.g., bit line) direction D2 perpendicular to the first (e.g., word line) direction D1 and substantially parallel to the major surface 100a of the substrate 100, into a complementary recessed portion in a side wall of the first slit trench 84a. The first protruding portion 4'a overlaps a second protruding portion 4"a of a nonlinear side wall 4" of the second finger portion 3" of the comb shaped word line 3. The second protruding portion 4"a protrudes in a third (e.g., bit line) direction D3 which is opposite to the second direction D2 into a complementary recessed portion in a second side wall of the first slit trench 84a, as shown in FIG. 2C.

In some embodiments, the comb shaped word line 3 further comprises a third finger portion 3'" that extends in the first direction D1 and is separated from the second finger portion 3" by a slit trench 84 (not shown). The connecting portion 23 of the comb shaped word line 3 connects the first, the second and the third finger portions 3', 3", and 3'" of the comb shaped word line 3 to driver circuit contacts 25. Various embodiments include a first comb shaped word line having three or more word line fingers located in a first device level, and a second comb shaped word line having three or more word line fingers located in a second, lower device level.

Figure 2E:
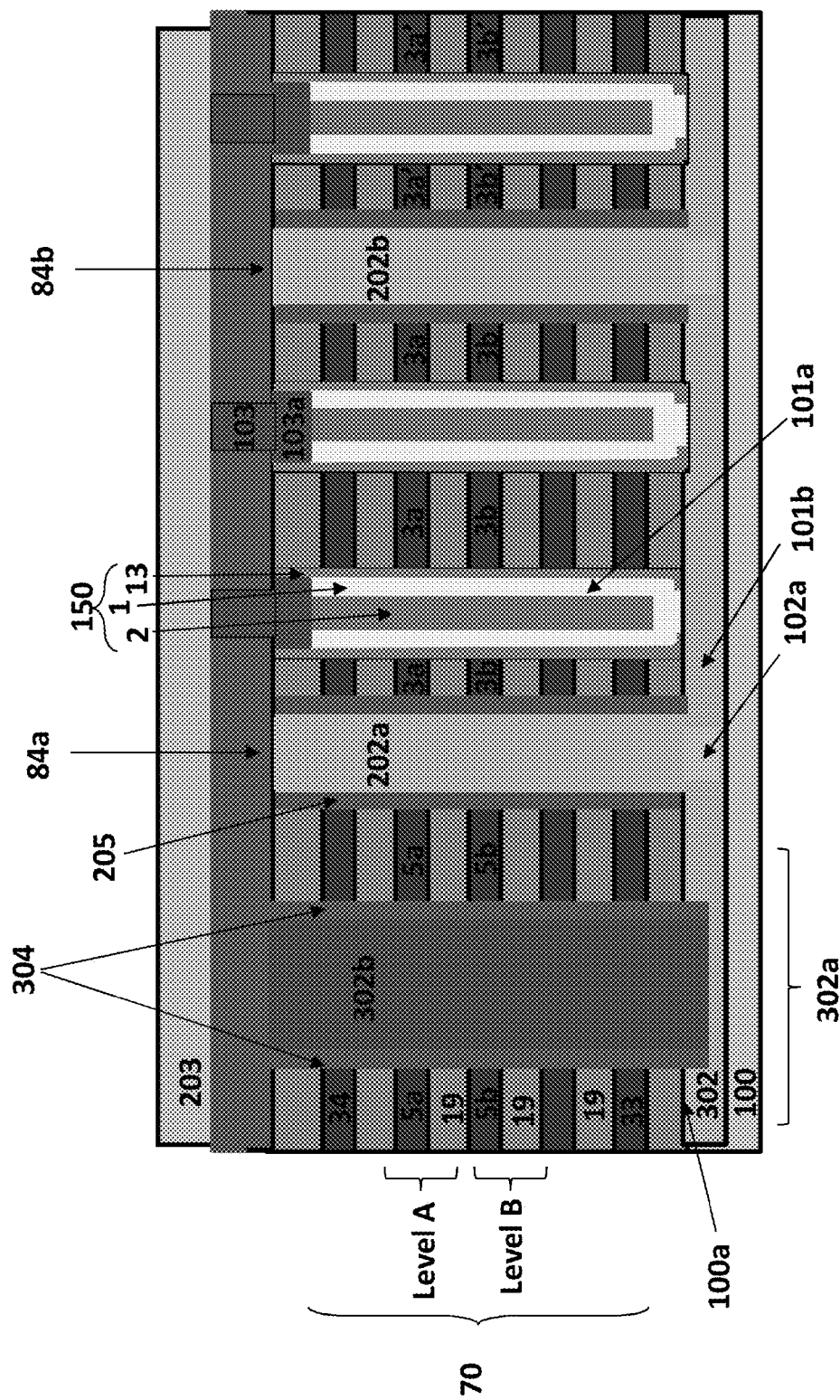
FIG. 2E is a side cross sectional view of the device of FIG. 2D along the bit line F-F'.

FIGS. 2D and 2E, which is a cross-sectional view along the bit line F-F' in FIG. 2D, illustrate an alternative embodiment, where the p-well contacts 302b are electrically insulated from the dummy word line 5 by insulating layer 304. Insulating layer 304 may be any electrically insulating material, for example silicon oxide.

In some embodiments, shown in FIG. 2A, the device further includes a fourth slit trench 84d located on an opposite side of the third word line finger 3'" from the third slit trench 84c, and at least one dummy word line finger 5" is located between the fourth slit trench 84d and a fifth slit trench 84e. Various embodiments include a first dummy word line finger 5a" located in a first device level, and a second dummy word line finger 5b" located in a second, lower device level.

A plurality of drain electrodes (e.g., bit lines) 203 are located over the array of NAND strings 150 in each block, as shown in FIG. 3A. For the sake of clarity, only a few drain electrodes 203 are shown in FIG. 3A. The plurality of drain electrodes 203 extend over all of the NAND strings 150 in the active region. The drain electrodes 203 extend in the second, bit line direction B-B' from the dielectric filled slit trench 84 to the first dielectric filled trench 84a, second dielectric filled trench 84b, and third dielectric filled trench 84c, as illustrated in FIG. 3A. The drain electrodes 203 extend over and perpendicular to the trenches 84, to linear portions of trenches 84a-84d adjacent to word line side wall portions 4a and 4b (but not 4c), and to source electrode 202 over plural word lines 3. The drain electrodes 203 extend substantially parallel to the major surface 100a of the substrate 100. Each drain electrode 203 is electrically connected to an upper portion of a semiconductor channel 1 (e.g., to a doped drain region 103a over the channel 1) in one NAND string 150 in one memory opening 81 in each block via a drain line 103.

The density of the drain electrodes 203 depends on the number of rows of NAND strings 150 and on the spacing between adjacent NAND strings in each row. For example, as shown in FIG. 3A, each NAND string 150 has one drain electrode 203 passing over it. A respective drain line 103 connects the channel 1 in each NAND string 150 to the respective drain electrode 203 passing over the NAND string 150, as shown in FIG. 3B. In this case, the drain line 103 may be located over the middle of the NAND string 150.

In other embodiments, each memory opening 81 may have more than one drain electrode, for example two drain electrodes, passing over it. A respective drain line connects the channel in each NAND string to only one of the drain electrodes passing over the NAND string. In this case, the drain line may be located off center of the NAND string (e.g., closer to the periphery than to the middle), and the drain line contacts the channel at the periphery of the NAND string.

FIG. 3A illustrates a top view of a portion of a memory block. The memory block includes an array of NAND strings including at least one row of monolithic three dimensional NAND strings 150 described above, a first dielectric filled slit trench 84a, and a second dielectric filled slit trench 84b located apart from the first slit trench 84a. The first slit trench 84a and the second slit trench 84b extend in substantially the same direction (e.g., the word line direction D1).

A first source electrode 202a is located in the first dielectric filled trench 84a and a second source electrode 202b is located in the second dielectric filled trench 84b, as shown in FIGS. 3A and 3B. In the memory device levels 70, the dielectric fill in the trenches 84a and 84b may comprise any suitable insulating layer 205, such as silicon oxide, etc., which is located on both walls of the trenches 84a and 84b. Each source electrode 202 is located in the middle of the respective trench 84 and is separated from the control gate electrodes 3 by the insulating layer 205, as shown in FIG. 3B. The source electrode 202 contacts the source 102a in the p-well 302, as shown in FIG. 3B. In some embodiments, the source electrode 202 extends substantially parallel to the plurality of control gate electrodes has a profile complementary to the nonlinear side wall of the control gate electrode 3. In some embodiments, the source electrode height extends substantially perpendicular to the major surface of the substrate, as shown in FIG. 3B.

The array NAND strings may include any number of rows of NAND strings 150. For example, the array shown in FIG. 3A comprises 4 rows of NAND strings in the bit line direction B-B'. In other words, the arrays shown in FIGS. 1, 2A, 2B, and 3A have substantially uniform widths in the bit line direction B-B', and there is at least one NAND string in each row. The rows of NAND strings extend in the word line direction D1 (e.g., perpendicular to the bit line direction B-B'). Thus, the arrays illustrated in FIGS. 1, 2A, 2B, and 3A comprise, in any given bit line, first, second, third and fourth rows of NAND strings 150 extending in the word line direction. As shown in FIGS. 1, 2A, 2B, and 3A, the semiconductor channels in the first and the third rows of NAND strings are offset from respective semiconductor channels in the second and fourth rows of NAND strings along the word line direction. In general, the semiconductor channels in the odd numbered rows of NAND strings are offset from respective semiconductor channels in the even numbered rows of NAND strings along the word line direction. Alternatively, semiconductor channels in adjacent rows may be aligned.

In alternative embodiments, each array may have fewer than 4 rows of NAND strings in any given bit line. Alternatively, the array in any given bit line may have more than 4 rows, such as 5 to 20 rows of NAND strings.

In other embodiments, the control gate electrodes 3 may have a non-uniform width along the bit line direction. Thus, the array of NAND strings 150 in such embodiments may be variable in the bit line direction.

As shown in FIG. 3B, the first semiconductor channel 1 in each of the first and the third rows of NAND strings 150 comprises a bottom portion which contacts the p-well 302, which in turn contacts the first source electrode 202a (e.g., the left side source electrode in FIG. 3B which corresponds to the source electrode positioned in the "upper" trench 84a in FIG. 3A) and the second source electrode 202b (e.g., the right side source electrode in FIG. 3B which corresponds to the source electrode positioned in the "lower" trench 84b in FIG. 3A).

As shown in FIG. 3A, the control gate electrodes 3 extend in the word line direction which is perpendicular to the bit line direction B-B'. The control gate electrodes 3 are continuous in the array. In other words, the control gate electrodes 3 have a shape of a continuous strip or sheet with discrete openings 81 (which are referred to herein as front side openings or memory openings) which contain the NAND strings 150. However, the control gate electrodes 3 have electrical and physical continuity in the bit line direction between the trenches 84 and in the word line direction throughout the array. In other words, the memory openings 81 do not completely sever the continuous electrical and physical path in the control gate electrodes from one trench 84 to the opposite trench 84 in each block.

The memory device contains a common control gate electrode 3 in each of the plurality of memory device levels 70 for the first, second, third and fourth rows of NAND strings shown in FIG. 3B. The common control gate electrode 3 may also be referred to as a word line or a word line finger (shown as dotted lines in FIGS. 1, 2A, and 3A). In various embodiments, the memory device optionally includes a select gate electrode 33 (e.g., source side select gate electrode 33 shown in FIG. 3B) located between the p-well 302 and the control gate electrodes 3, and the select gate electrode is continuous in the array. The memory device may optionally include a drain side select gate electrode 34 located over the control gate electrodes 3, shown in FIG. 3F, and the drain side select gate electrode is continuous in the array. In various embodiments, the source electrode 202 contacts the source region 102a in the substrate 100 or the p-well 302, as shown in FIG. 3B, or alternatively the source line 102 as shown in FIG. 4A, for the first second, third and fourth rows of NAND strings in the device. Therefore, all of the NAND strings in the array can be erased together in the same erase step. For example, one specific memory cell can be selected by selecting (i.e., applying a current or voltage) to one source electrode 202, one bit line (i.e., drain electrode) 203 and one word line (e.g., control gate electrode) 3. Specifically, a particular block is selected with the common source electrode 202 in that block, the specific NAND string 150 is selected with the bit line (drain electrode) 203 and the select gate electrode(s) 33 and 34, and the particular cell in one memory device level 70 in the NAND string 150 is selected with the word line 3. In various embodiments, the memory block may include a source side select transistor 250 (containing the source side select gate electrode 33 and adjacent portions of the channel and memory film as shown in FIG. 3A) located between the conductive source line and the plurality of control gate electrodes 3. In various embodiments, the memory block may include a drain side select transistor 252 (containing the drain side select gate electrode 34 and adjacent portions of the channel and memory film as shown in FIG. 4A) located over the NAND memory cell region (i.e., over the memory device levels 70 in active region 200 and below the doped drain region 103a). FIGS. 6 to 41 illustrate a method of making a NAND device having nonlinear control gate electrodes according to a non-limiting embodiment of the disclosure. Specifically, the method results in lower wafer warpage due to the mechanical stress imposed by the plurality of control gate electrodes on the substrate.

Specifically, in the prior art method, the control gate electrodes are formed by first forming a stack of sacrificial layers separated by insulating layers. The sacrificial layers are removed and the resulting space is filled with a conductive material, for example tungsten. However, this fill method results in mechanical stress imposed on the substrate. Although high temperature annealing can alleviate some of the stress, high temperatures are not acceptable for some devices, for example devices including CMOS technology.

In contrast, as will be explained in more detail with reference to FIGS. 6 to 41, in the embodiment methods of the present disclosure, a stack 120 of alternating layers of a first material and a second material is deposited over a major surface 100a of a substrate 100 in an active region 200, and a plurality of memory openings 81 are subsequently etched in the stack 120. The memory openings 81 extend substantially perpendicular to the major surface of the substrate. Each memory opening 81 is filled with a semiconductor channel 1 and at least a portion of memory film 13 including a charge storage region 9, a tunnel dielectric 11, and optionally a blocking dielectric 7. The stack 120 is etched to form at least one back side opening (e.g., slit trench 84) having a height extending substantially perpendicular to the major surface 100a of the substrate 100, and having at least one nonlinear slit trench side wall in the active region 200. A source electrode 202 is formed in the slit trench 84, and a bit line 203 is formed over the semiconductor channel 1 and the memory film 13 located in the at least one memory opening 81.

Figure 6:
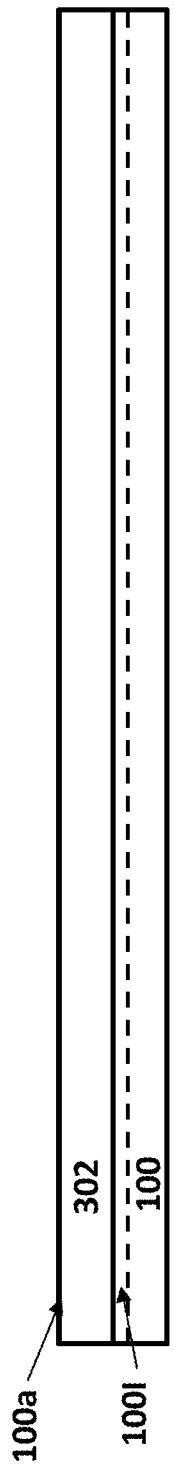
FIGS. 6-20, 25, 26, 28-37, and 39-41 are side cross sectional views illustrating steps in an embodiment method of making a device.

FIGS. 6 to 41 illustrate a method of making the NAND device. FIG. 6 illustrates a first step in the embodiment method of making the NAND device. FIG. 6 shows an optional p-well 302 formed substantially parallel to a major surface 100a of a substrate 100. The p-well 302 may be formed in or over the substrate. In various embodiments, the substrate is single crystal silicon, optionally doped with a first conductivity type (e.g., n or p-type, such as containing the p-well) at a concentration of less than $10^{18}$ cm$^3$, for example from $10^{15}$-$10^{17}$ cm$^3$. In various alternative embodiments, an optional conductive source line 102 comprises a doped upper portion of the substrate 100 or a deposited semiconductor layer having a higher doping concentration than the substrate. In some embodiments, the conductive source line 102 is polysilicon or single crystal silicon doped with a second conductivity type (e.g., p or n-type opposite to that of the substrate) at a concentration of at least $10^{18}$ cm$^3$.

In some embodiments, an optional insulating layer (e.g., silicon oxide, etc.) 100I is formed directly on or over the substrate 100 (e.g., a silicon substrate), and the optional conductive source line 102 is formed directly on or over the insulating layer. In these embodiments, the NAND strings are formed on the resulting silicon on insulator (SOI) substrate.

In some embodiments, the optional polysilicon conductive source line 102 is formed by depositing a small grain polysilicon or amorphous silicon layer followed by annealing the layer (e.g., a laser anneal, a thermal anneal, and/or a lamp anneal) to recrystallize the layer to form a larger grained polysilicon layer. For example, the recrystallized source line 102 may be formed on the insulating layer 100I of the SOI substrate. In other embodiments, source line 102 is omitted, and the source region 102a is formed in the p-well 302 instead, as will be described below.

Figure 7:
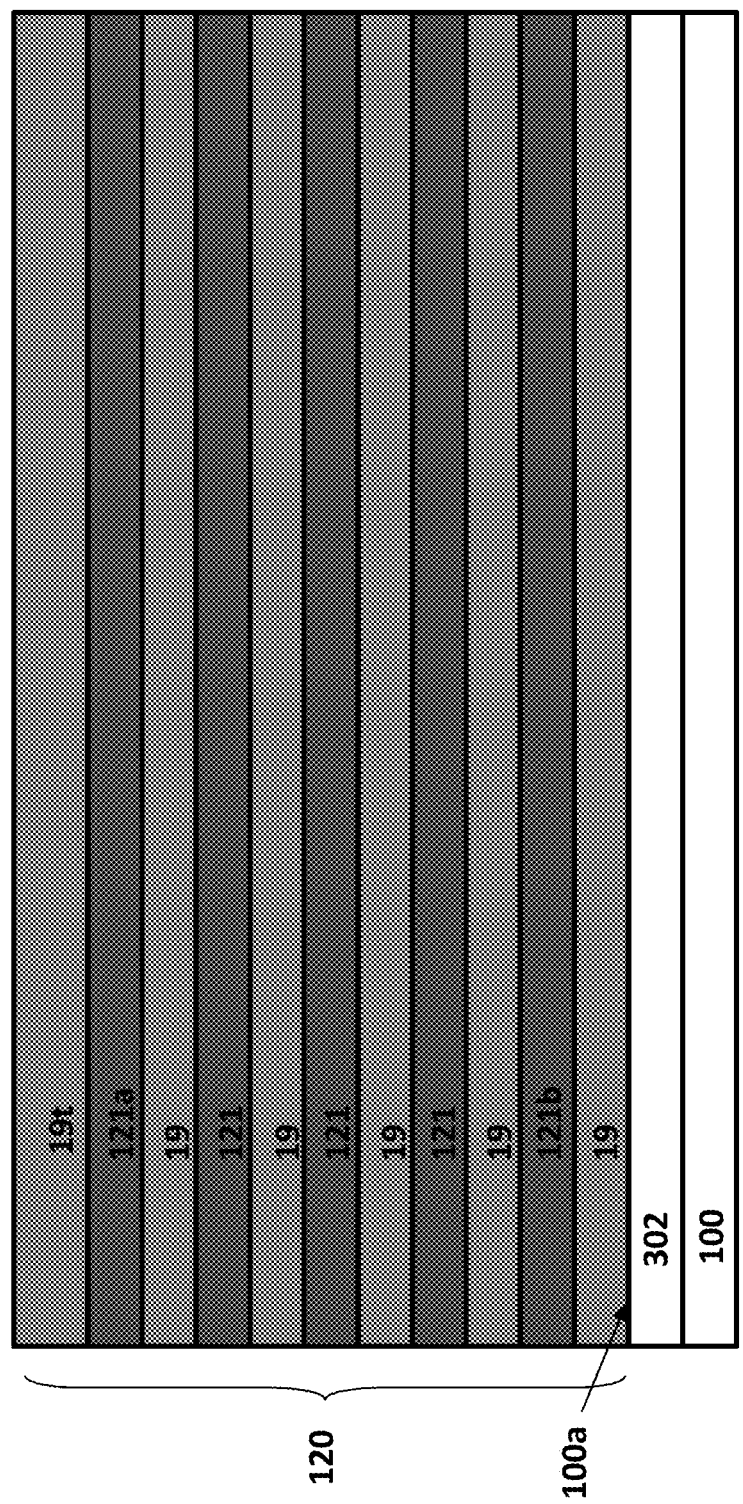

As shown in FIG. 7, a stack 120 of alternating layers 19 and 121 are formed over the p-well 302. Layers 19, 121 may be deposited by any suitable deposition method, such as sputtering, CVD, PECVD, MBE, etc. The layers 19, 121 may be 6 to 100 nm thick.

In this embodiment, the first layers 19 comprise an electrically insulating material. Any suitable insulating material may be used, such as silicon oxide, silicon nitride, silicon oxynitride, a high-k dielectric (e.g., aluminum oxide, hafnium oxide, etc. or an organic insulating material). The second layers 121 comprise a sacrificial material, such an insulating or semiconductor material. For example, layers 19 may comprise silicon oxide and layers 121 may comprise silicon nitride or silicon, such as amorphous silicon or polysilicon, or another semiconductor material, such as a group IV semiconductor, including silicon-germanium and germanium. In some embodiments, layers 121 comprise silicon nitride.

Figure 8:
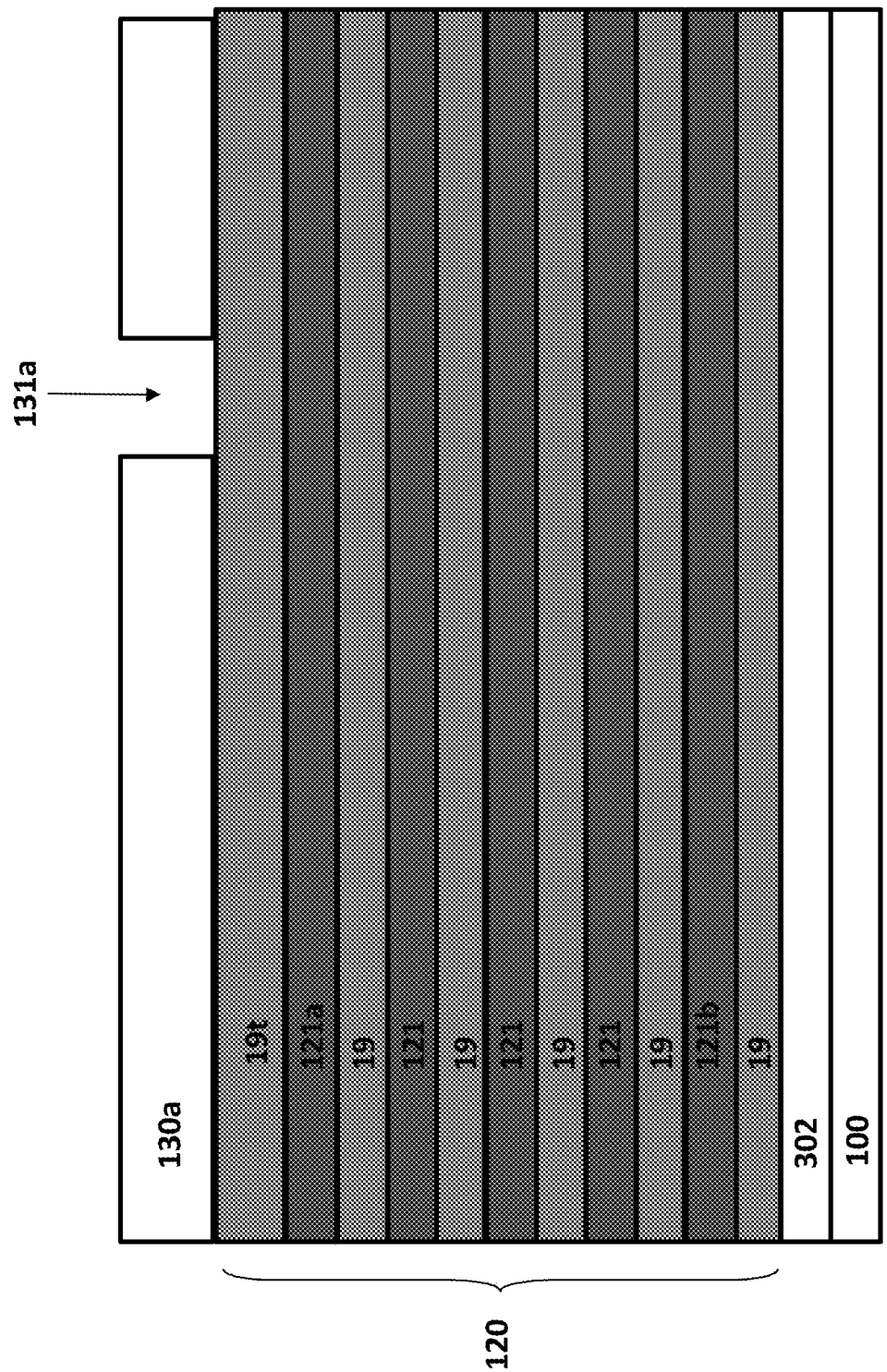
Figure 9:
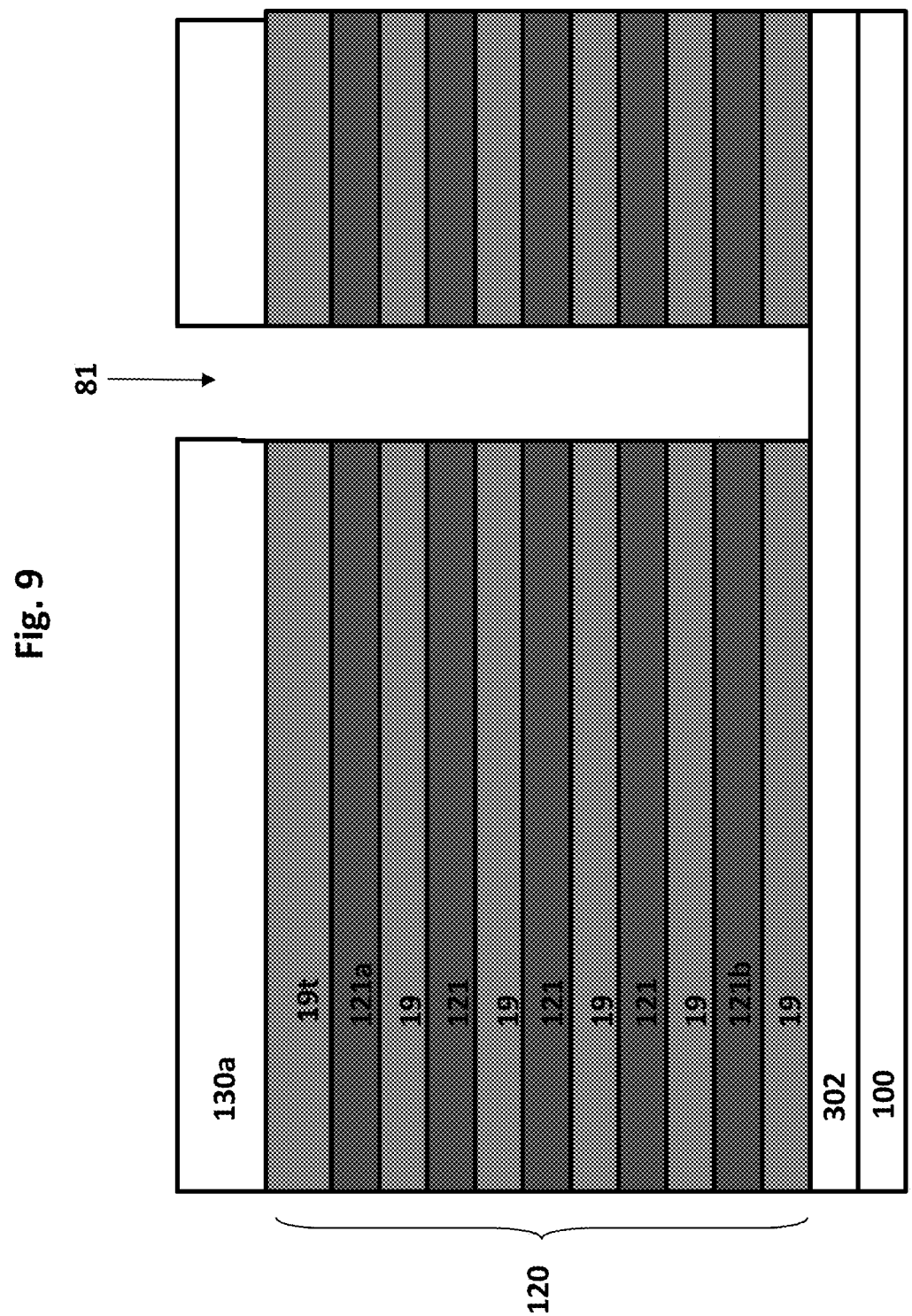

The deposition of layers 19, 121, is followed by etching the stack 120 to form at least one a front side opening 81 in the stack 120. An array of a memory openings 81 (e.g., cylindrical memory openings or holes) may be formed in locations where vertical channels of NAND strings 150 will be subsequently formed, as shown in FIGS. 8 and 9. The memory openings 81 may have circular cross sections when viewed from above. The memory openings 81 may have the same size and/or shape as each other, or they may have a different size and/or shape from each other. For the sake of clarity, one memory opening 81 is shown in FIGS. 8 to 15.

The memory openings 81 may be formed by photolithography and etching, as follows. First, a memory opening mask 130a is formed over the top layer 19t of the stack and patterned to form mask opening 131a exposing the stack 120, as shown in FIG. 8. Mask 130a may comprise any suitable material, such as one or more layer of photoresist and/or hard mask material. Then, the stack 120 is etched using RIE to form the memory opening 81 in the stack through the mask opening 131a in mask 130. Each front side memory opening 81 is etched until the p-well 302 (or the substrate 100 or source line 102 if the p-well 302 is omitted) is exposed in the opening 81, as shown in FIG. 9.

Figure 10:
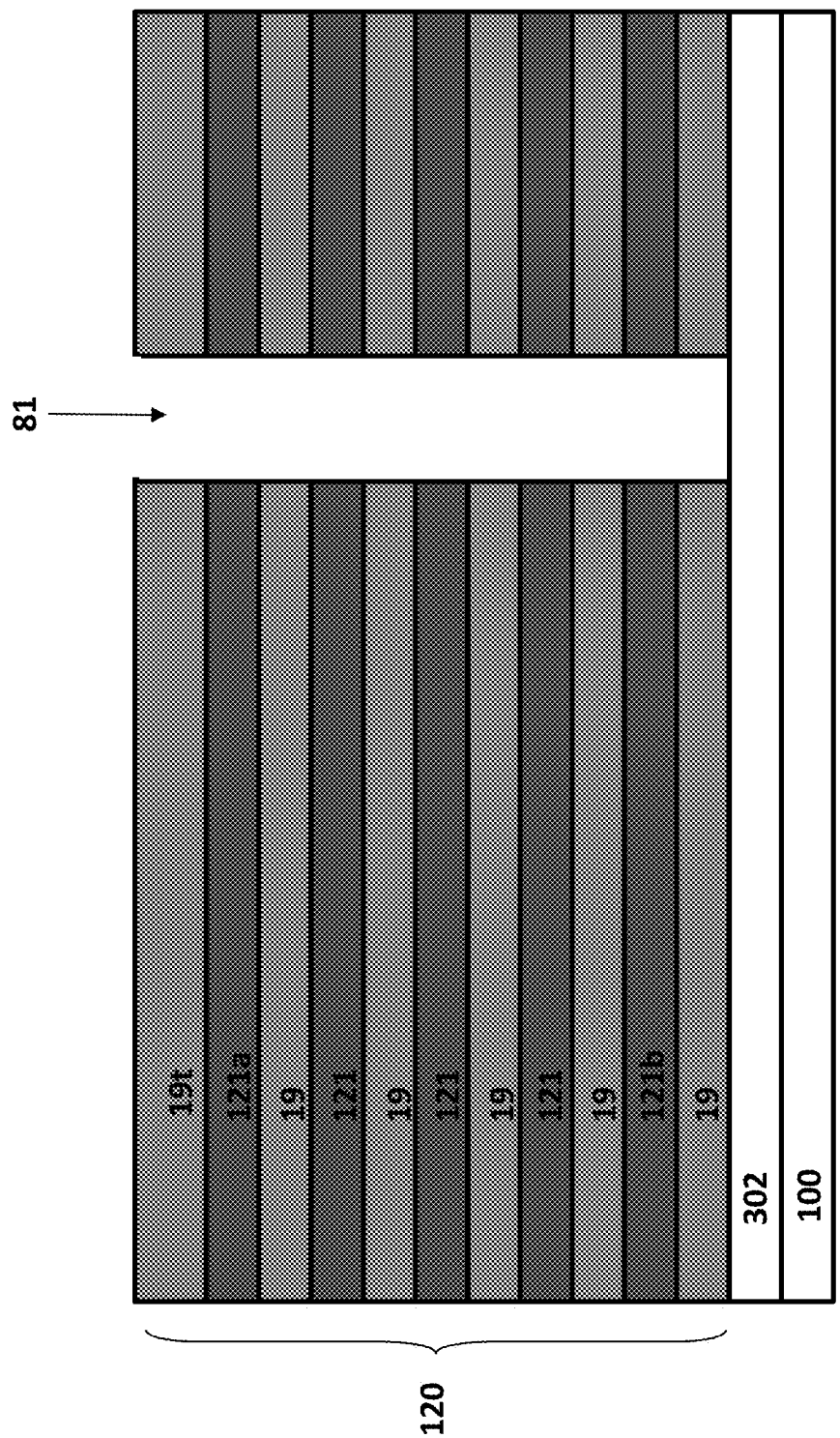

The mask 130a is then removed, as shown in FIG. 10.

Figure 11:
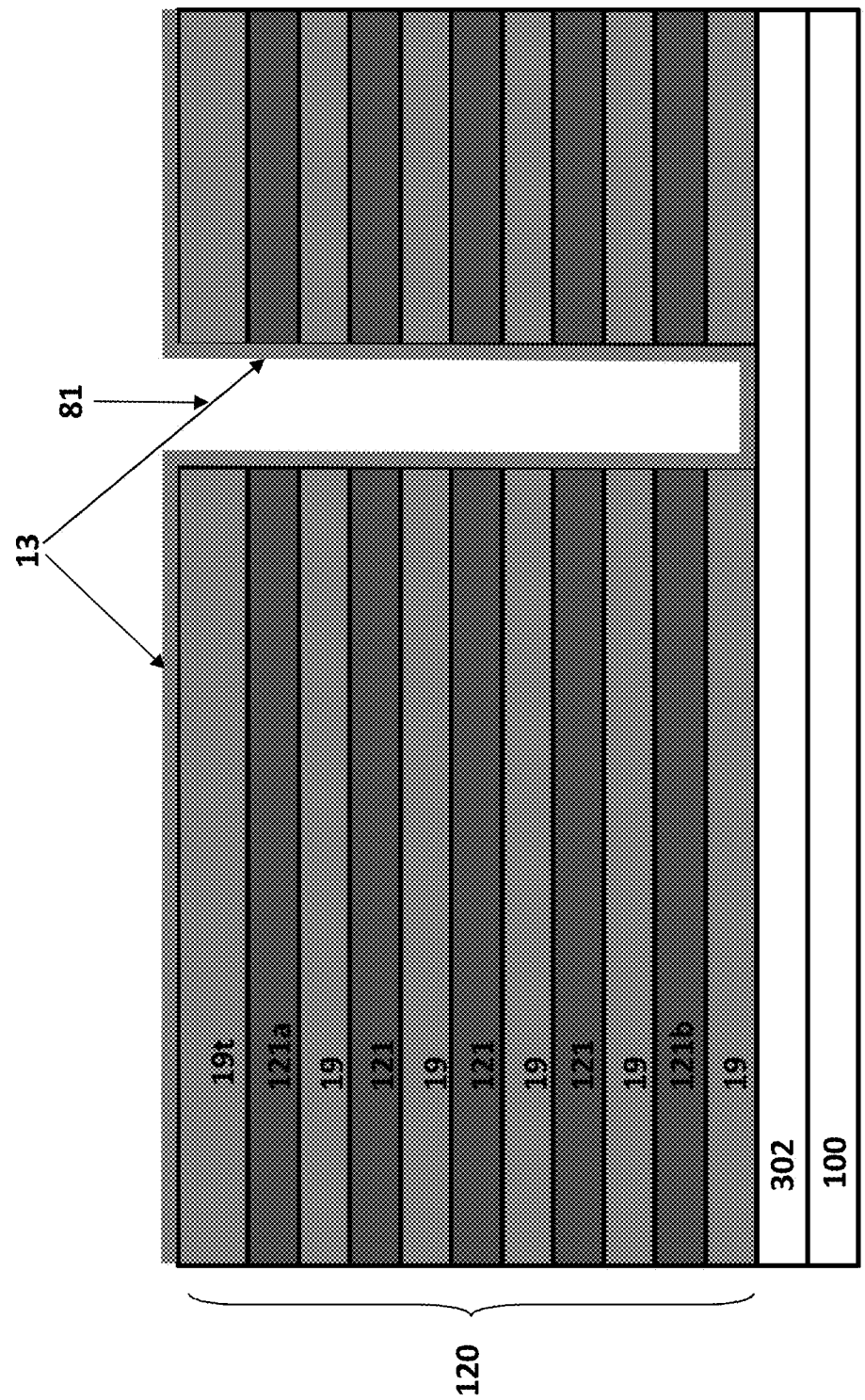

Then, as shown in FIG. 11, the memory film 13 is formed in the memory opening 81 and over the stack 120. Specifically, this step optionally includes forming a blocking dielectric in the memory opening 81, forming a charge storage region (e.g., silicon nitride layer or a floating gate layer) over the optional blocking dielectric in the memory opening, and forming a tunneling dielectric over the charge storage region in the memory opening 81. Alternatively, the blocking dielectric is formed from the back side at a later step in the process.

Then, the channel 1 is formed by depositing channel material, such as a lightly doped or intrinsic polysilicon over the tunnel dielectric layer portion of the memory film 13 in the memory opening 81. In some embodiments, a high temperature anneal may be performed after forming the channel 1. As discussed above, the entire memory opening 81 may be filled to form the device illustrated in FIG. 5D. Alternatively, a layer of channel material may first be deposited in the memory opening 81 followed by deposition of an insulating fill material 2 to form the device illustrated in FIG. 5B.

Figure 12:
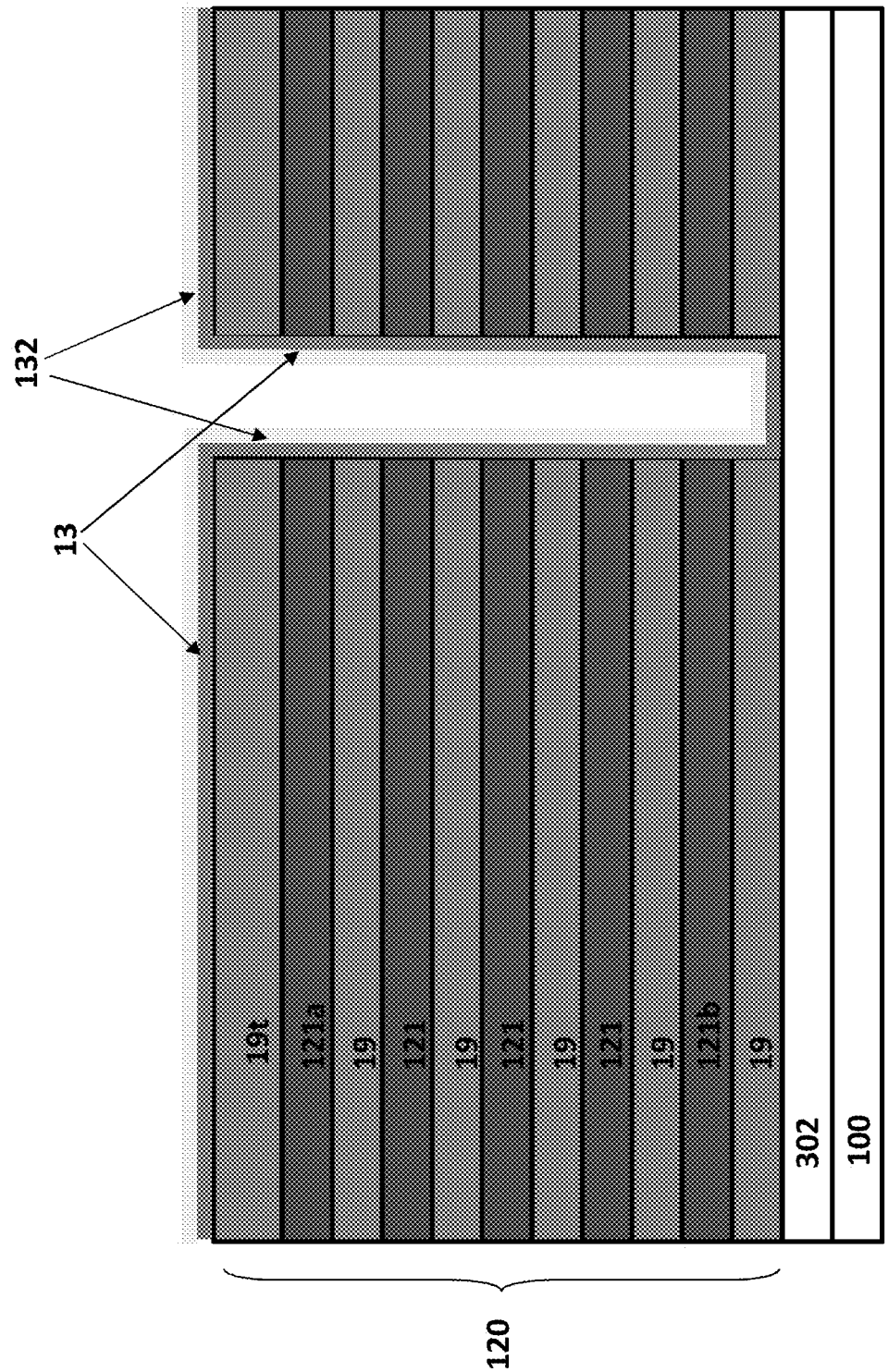

In some embodiments, the channel may be formed by a multi-step process utilizing a protective layer, as will be described below with reference to FIGS. 12 to 20. First, as shown in FIG. 12, a cover semiconductor layer 132, such as an amorphous silicon or polysilicon layer, is formed in the memory opening 81 over the memory film 13 and over the stack 120. Layer 132 protects the memory film 13 from damage during a subsequent etching step.

Figure 13:
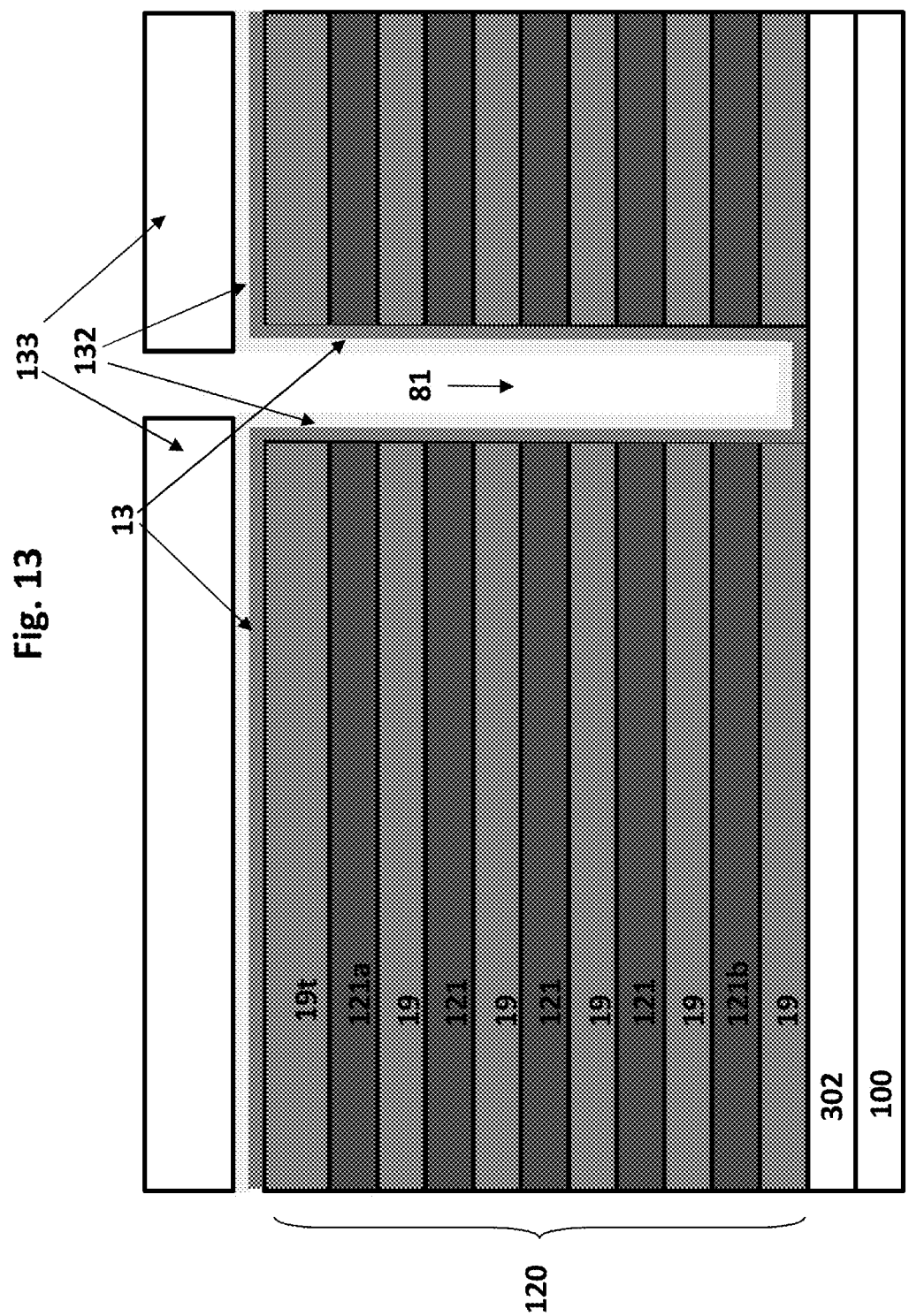

Then, a hard mask cover layer 133 is formed over layer 132. The hard mask cover layer 133 may comprise an amorphous carbon layer for example. Layer 133 is deposited non-conformally such that layer 133 is located over layer 132 on top of the stack 120, but does not extend into the memory opening 81, as shown in FIG. 13. Alternatively, layer 133 may be deposited conformally and then patterned by photolithography and etching to be removed from the memory opening 81.

Figure 14:
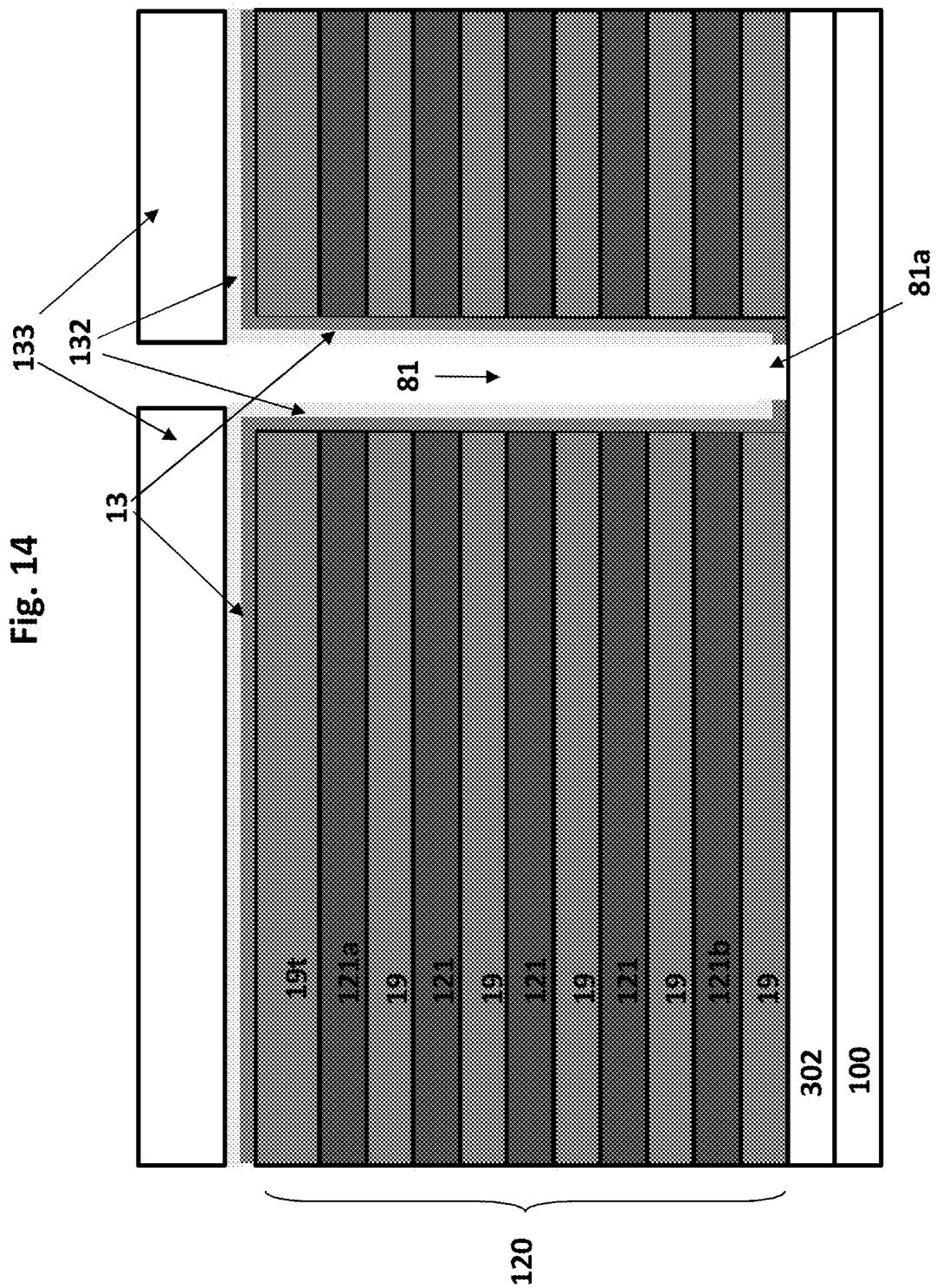

As shown in FIG. 14, the memory film 13 (e.g., the blocking dielectric, the charge storage region and the tunnel dielectric) and cover semiconductor layer 132 are removed from a bottom of the memory opening 81 using RIE or another suitable anisotropic etching method. The cover semiconductor layer 132 protects the memory film 13 on the side walls of the memory opening 81 from etching damage, and the hard mask cover layer 133 protects the rest of the stack from being etched. The etching step forms extension portions 81A of the openings 81 which expose the p-well 302, substrate 100, or source line 102 at the bottom of the memory opening 81. The hard mask cover layer 133 is then removed by any suitable method, such as ashing or selective wet etching.

Figure 15:
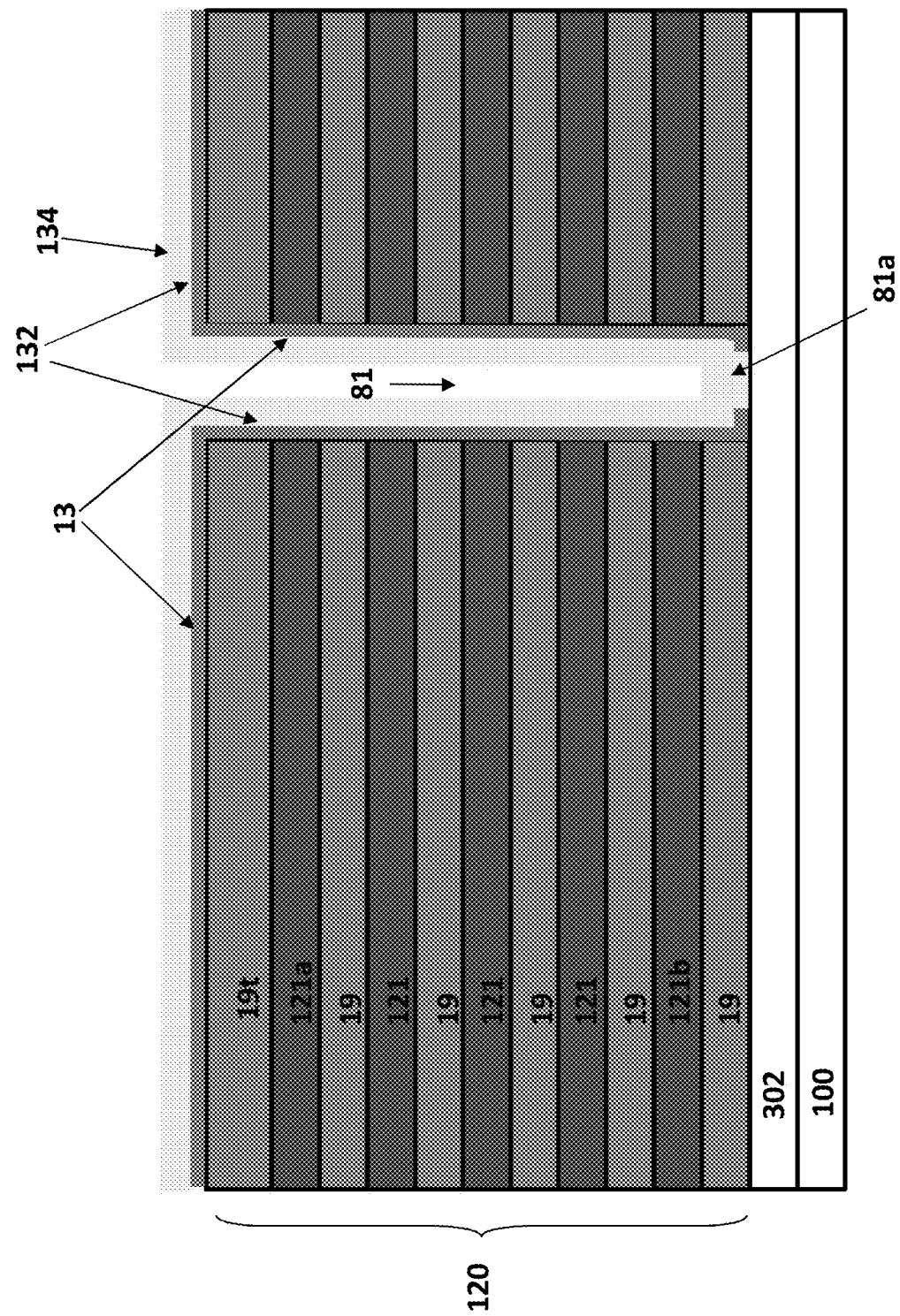

As shown in FIG. 15, a semiconductor channel body layer 134 is formed in the memory opening 81 such that it makes contact with the p-well 302, substrate 100, or source line 102 exposed in the memory opening 81 (e.g., exposed in portions 81a of memory opening 81). The semiconductor channel body layer 134 comprises a channel material, such as amorphous silicon or polysilicon. Layers 132 and 134 may comprise the same materials, and layer 134 contacts layer 132 on the side walls of the memory opening 81.

Figure 16:
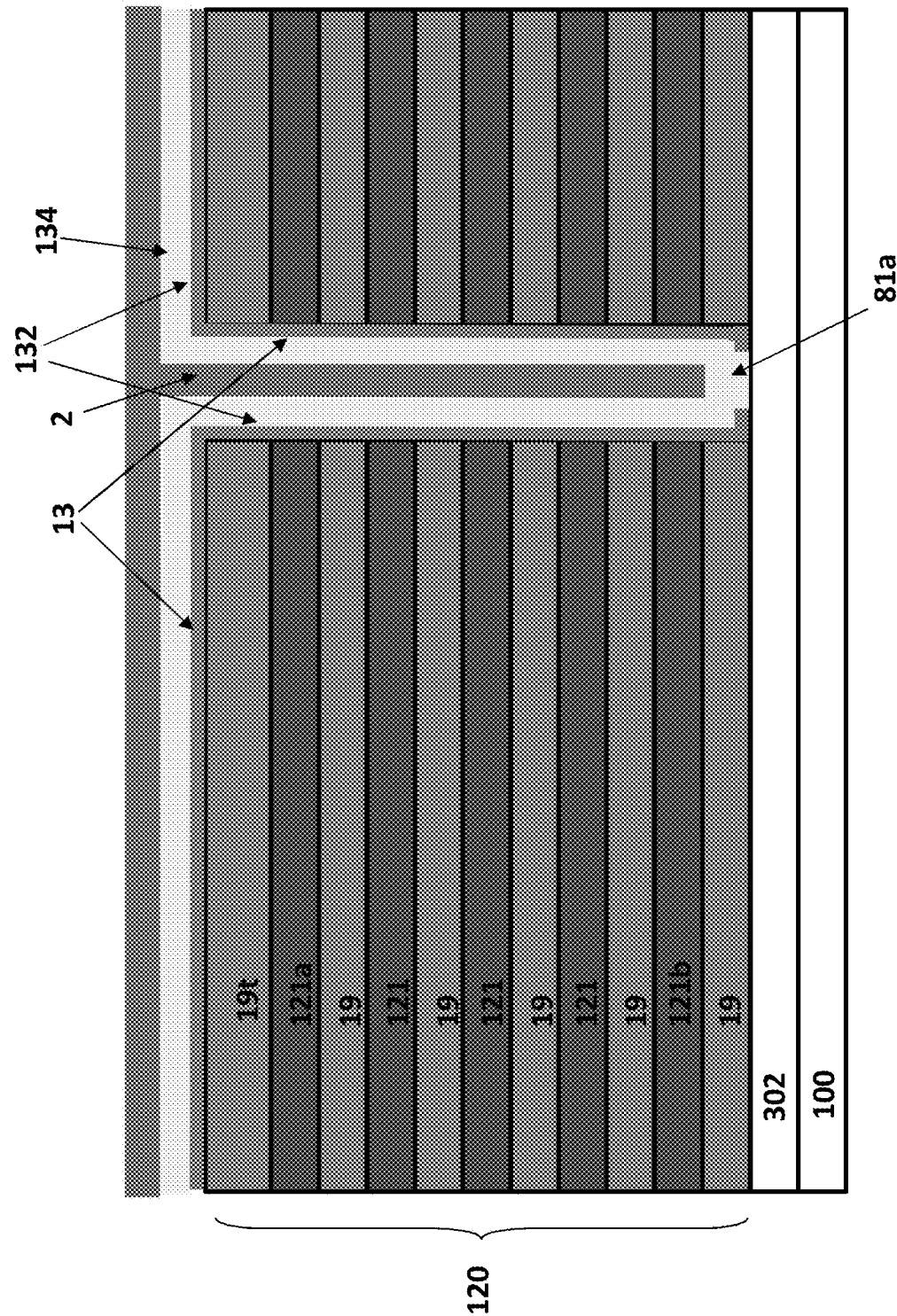
Figure 17:
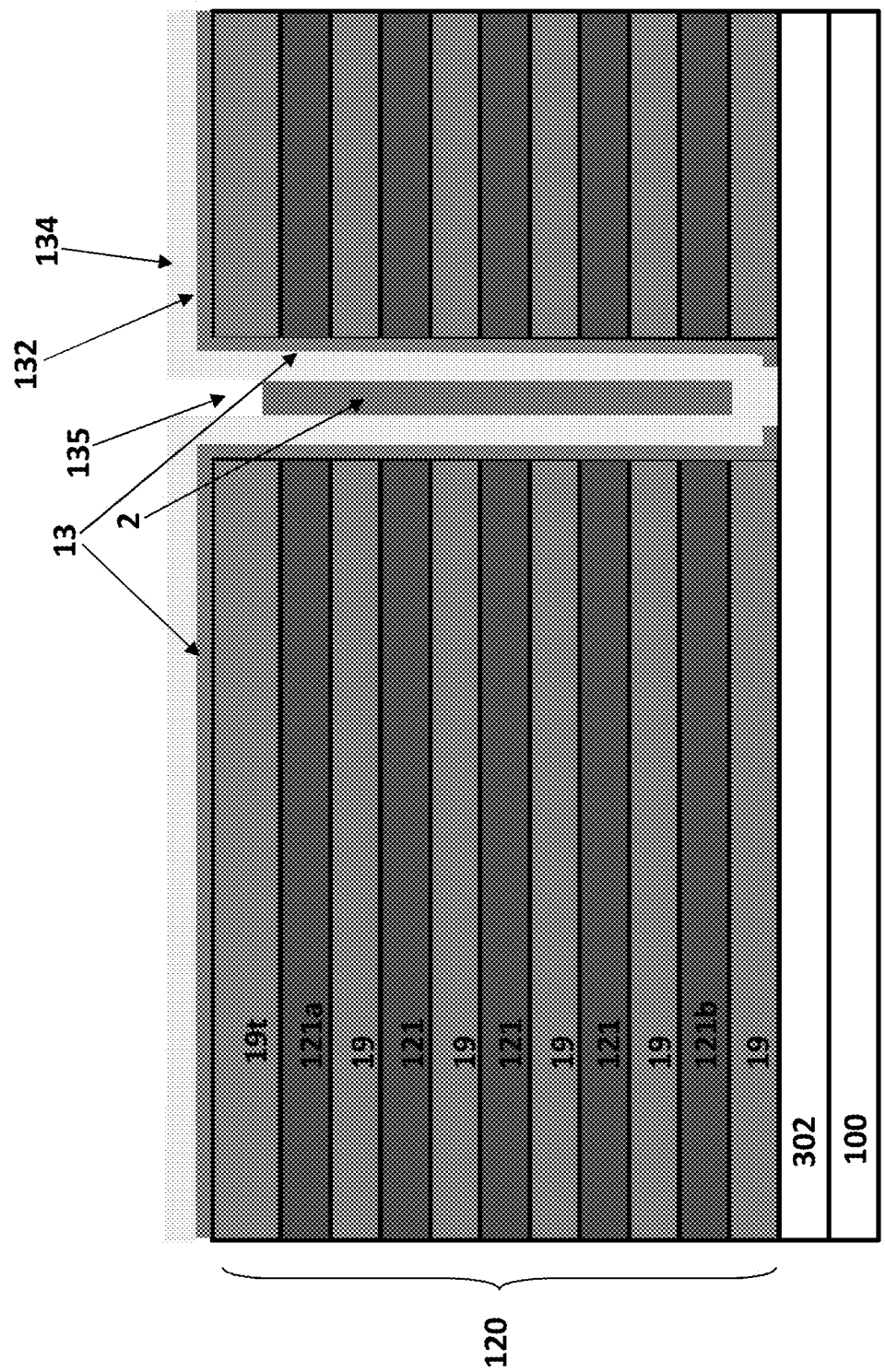

The optional core insulating layer 2, such as a silicon oxide layer is then deposited in the memory opening 81 and over the stack 120, as shown in FIG. 16. Layer 2 is also shown in FIGS. 3B, 4B, 5A, and 5B. The core insulating layer 2 is then recessed from the top of the memory opening 81 by selective etchback to form a recess 135 in the top of the memory opening 81, as shown in FIG. 17.

Figure 18:
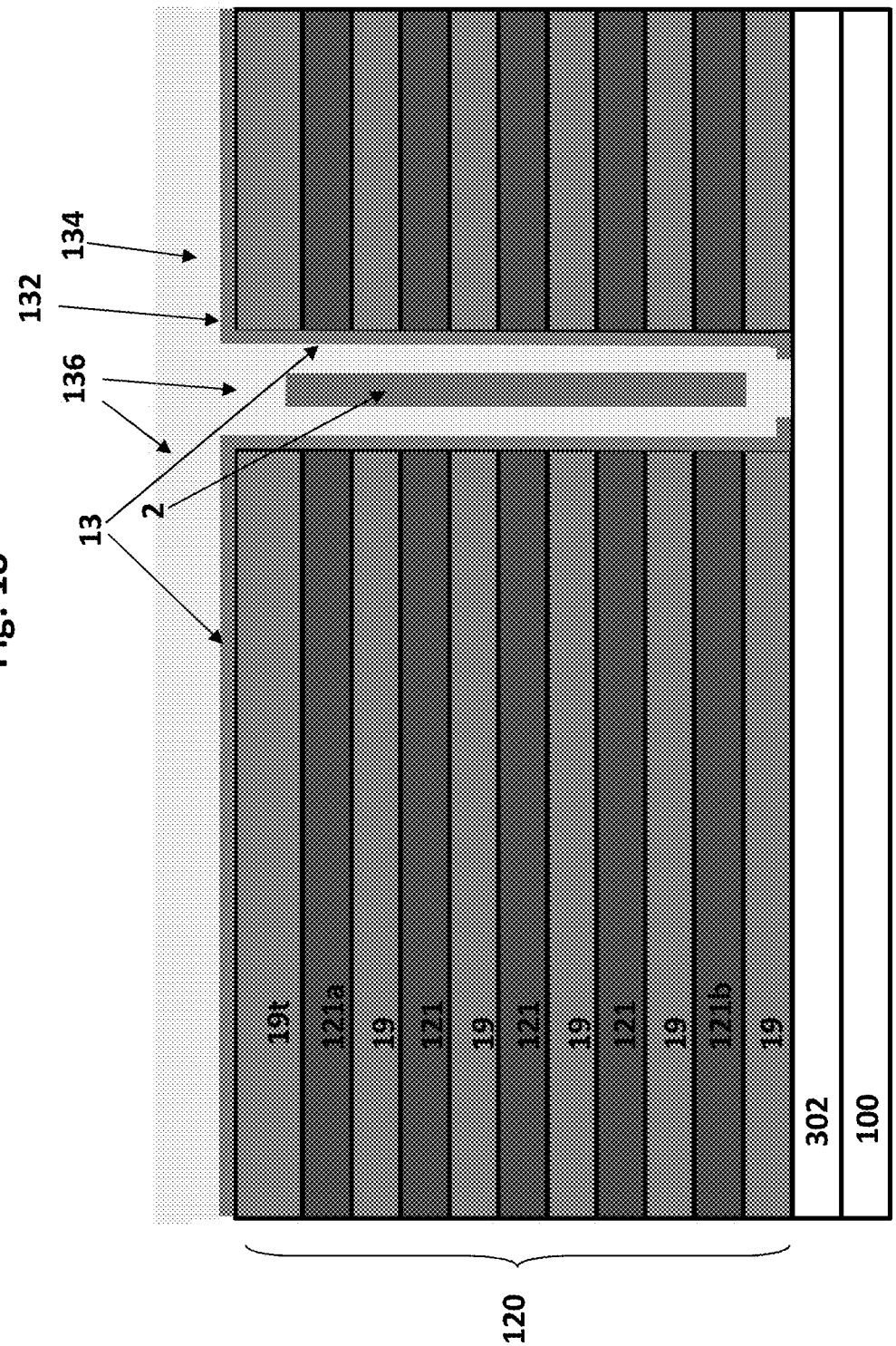

The recess 135 is then filled by a semiconductor cap layer 136 which is deposited conformally over layer 134 on the stack 120 and in the recess 135, as shown in FIG. 18. The cap layer 136 comprises a channel semiconductor material, such as amorphous silicon or polysilicon. Layer 136 may comprise the same material as layers 132 and 134. Layer 136 completely fills the recess 135 and contacts layer 134 on the side walls of the recess 135 in the memory opening 81.

Figure 19:
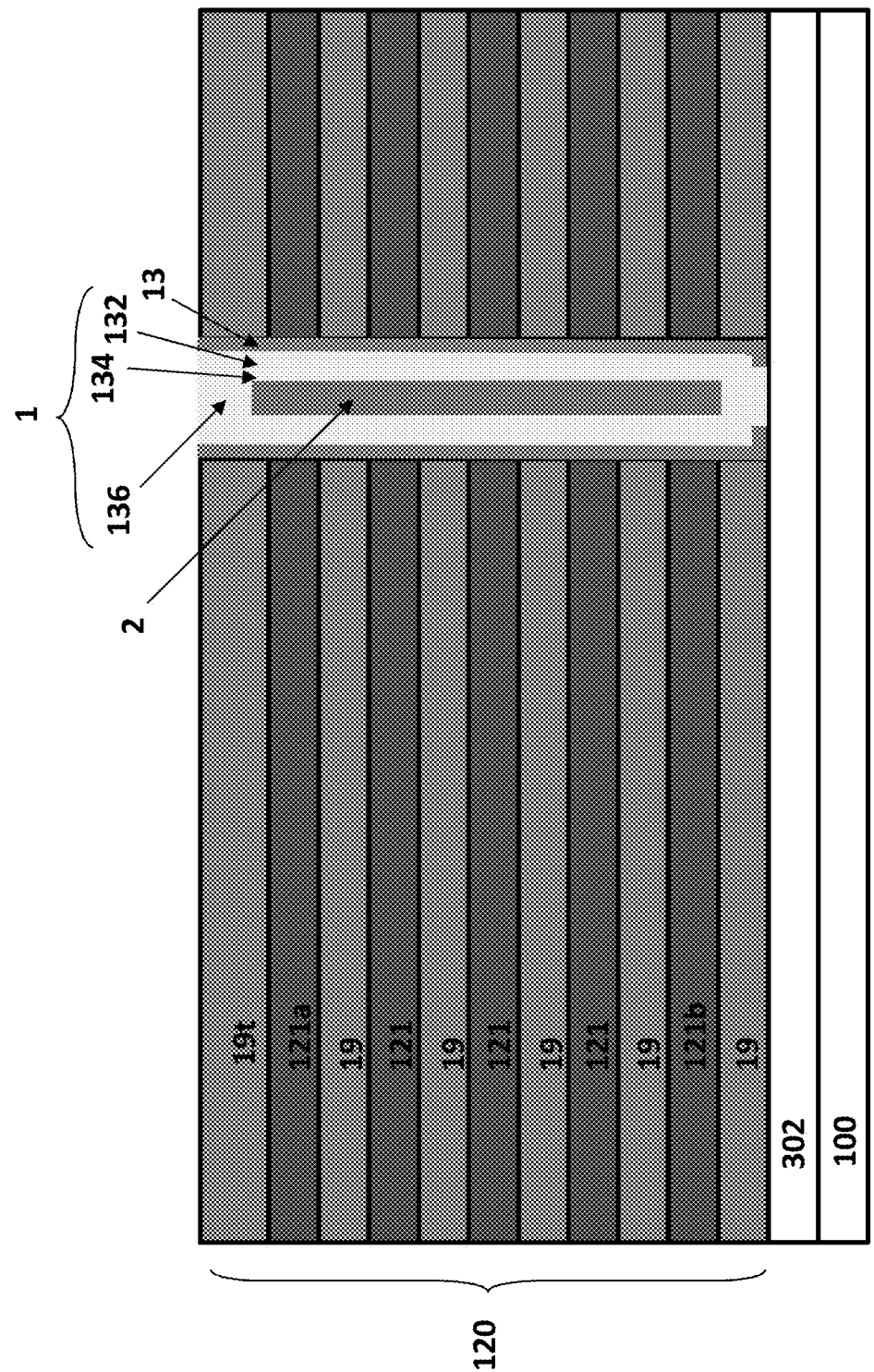

As shown in FIG. 19, the semiconductor channel layers 132, 134 and 136 are then planarized by etch back or CMP to remove these layers from the top of the stack 120 to expose the upper silicon oxide layer 19t of the stack. The channel layers 132, 134 and 136 remain in the memory opening 81 and together form the above described channel 1 in the memory device levels 70.

Thus, as shown in FIG. 19, the channel 1 of the embodiment of FIGS. 11-18 is composed of three sublayers 132, 134, 136. Sublayer 132 comprises an outer hollow cylinder or hollow inverse truncated cone which contacts the memory film 13 with its outer surface. Sublayer 132 does not contact the p-well 302.

Sublayer 134 comprises an inner hollow cylinder or hollow inverse truncated cone which contacts sublayer 132 with its outer surface. Sublayer 134 contacts the core insulating layer 2 with its inner surface in the lower portion of the opening 81 and contacts sublayer 136 with its inner surface in the upper portion of the opening 81. In some embodiments, sublayer 134 completely fills the extension portion 81a of the opening 81 and contacts the p-well 302.

Sublayer 136 comprises a filled cylinder or filled inverse truncated cone which is located only in the upper portion of the opening 81. Sublayer 136 contacts sublayer 134 with its outer surface. Sublayer 136 also contacts the top of the core insulating layer 2 with its bottom surface.

Figure 20:
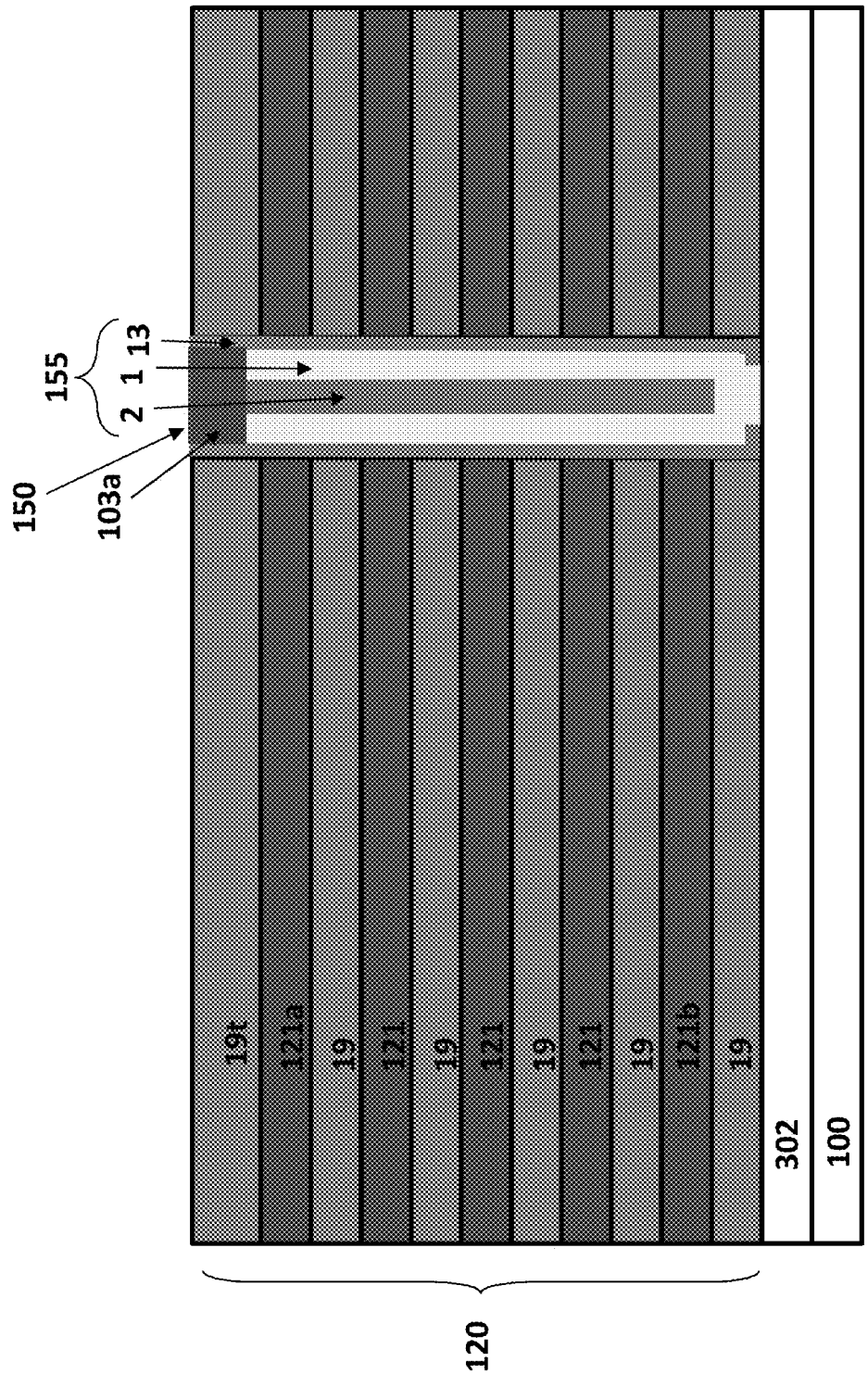

As shown in FIG. 20, a top portion of the polysilicon channel 1 is doped to form a doped drain 103a. The memory film 13, semiconductor channel 1, and core insulating layer 2 together form memory opening material 155.

Figure 21:
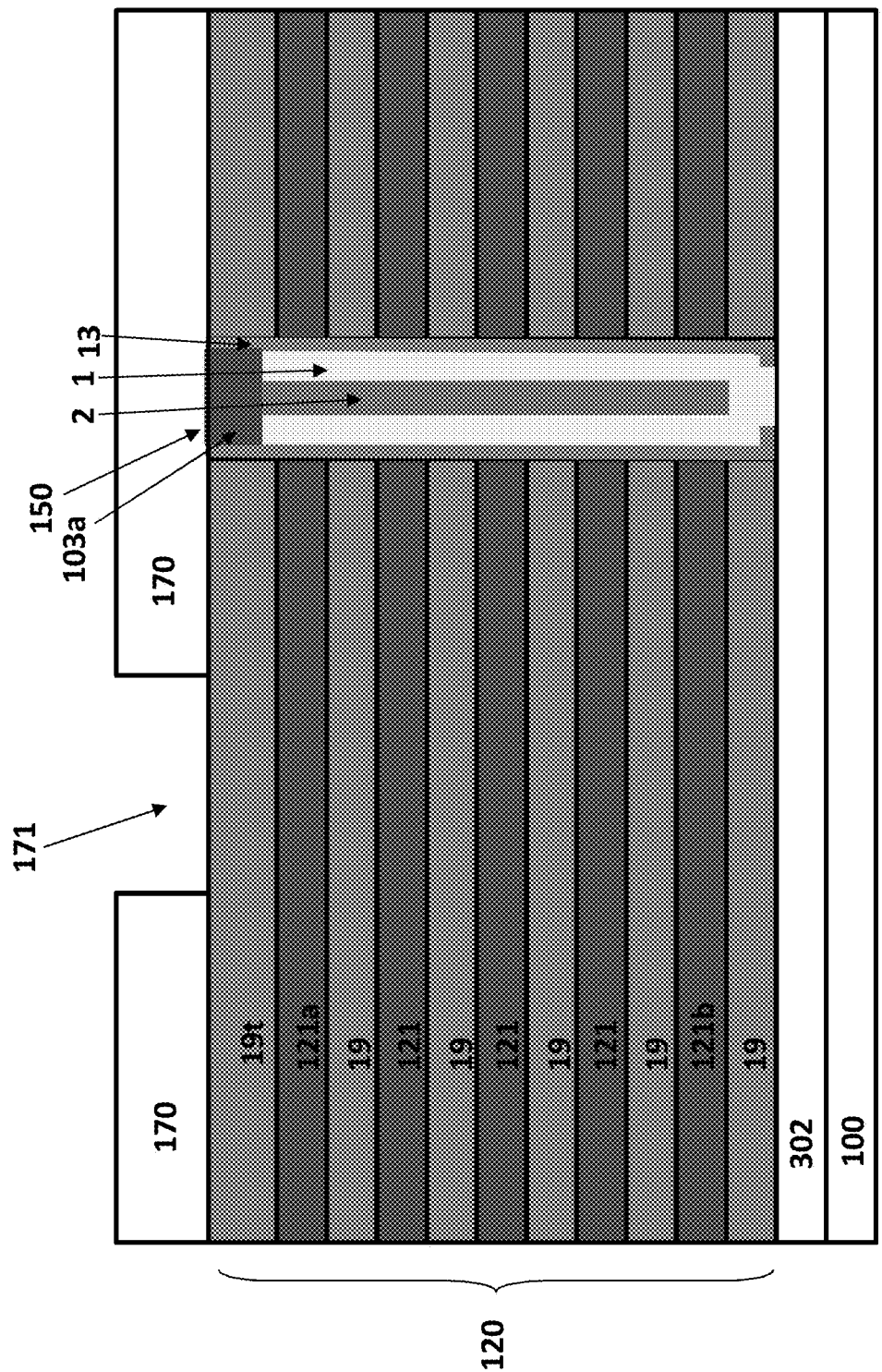
FIGS. 21, 23, and 24 are side cross sectional views illustrating steps in an embodiment method of making the device.
Figure 22:
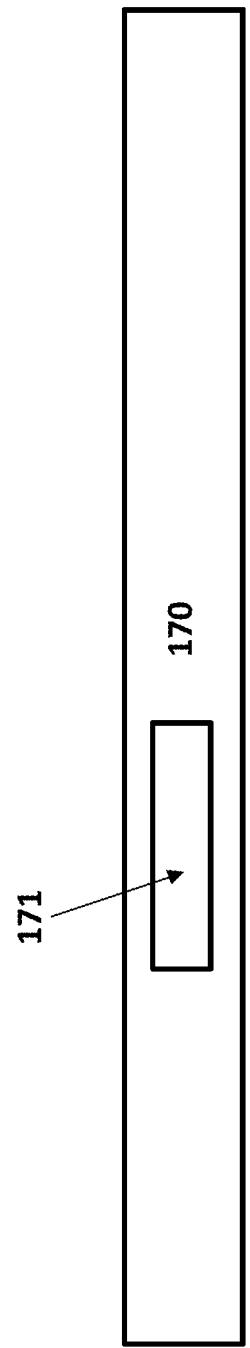
FIG. 22 is a top view of the step shown in FIG. 21.
Figure 23:
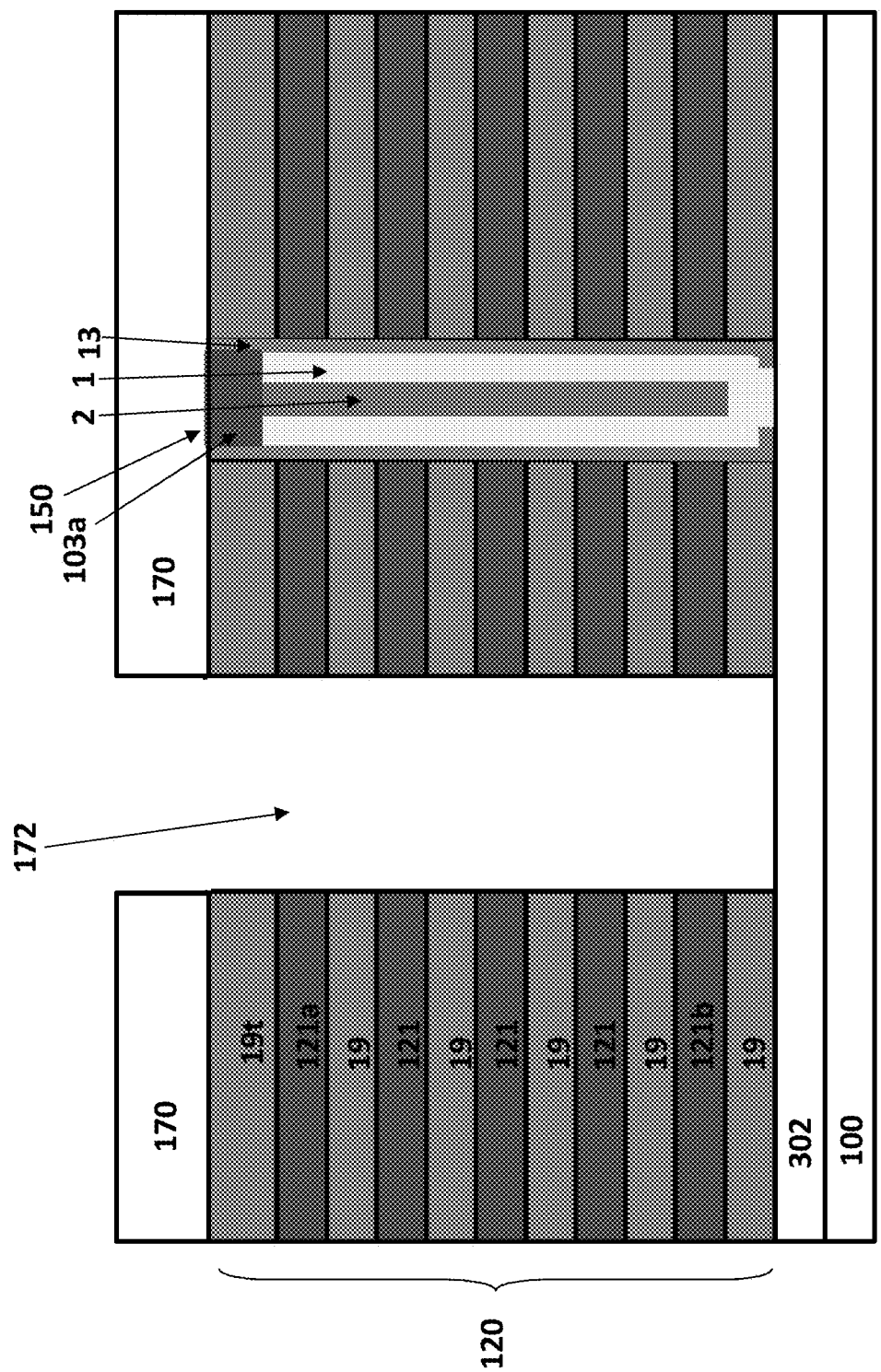
Figure 24:
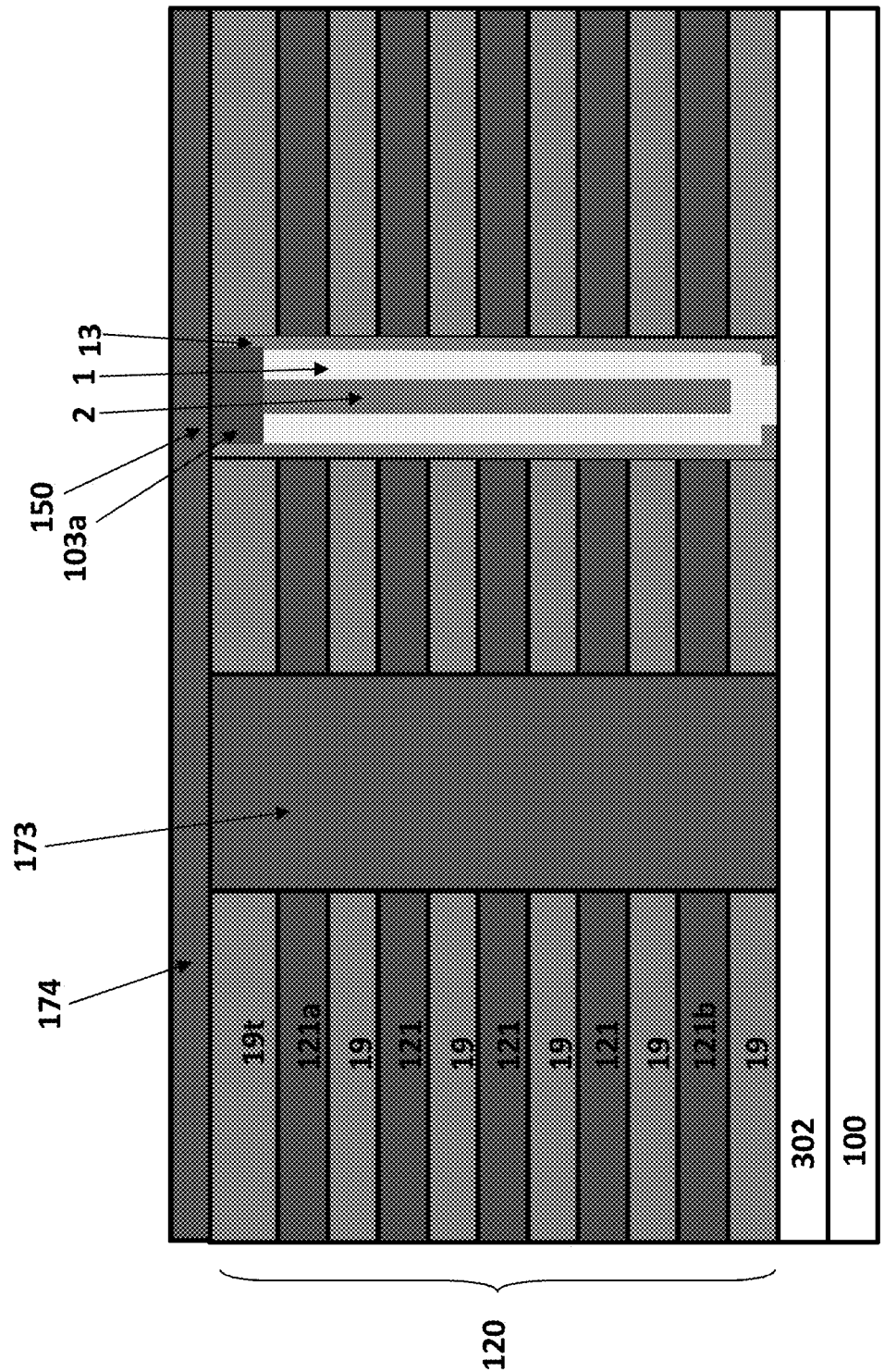

FIGS. 21-24 illustrate the formation of a support column which supports the stack layers after the sacrificial layer 121 are removed. FIGS. 21, 23, and 24 are side cross sectional views which have the same direction as the view in FIG. 20, but which are shifted into or out of the plane of the drawing in FIG. 20.

As shown in FIG. 21, a mask 170 is formed over the device and a column opening 171 is formed in the mask 170 to expose the upper silicon oxide layer 19t of the stack.

FIG. 22 shows the top view of the mask 170 having the opening 171.

As shown in FIG. 23, a column opening 172 is etched through all of the layers in the stack to the p-well 302 using RIE or another suitable method.

Finally, as shown in FIG. 24, the insulating support column 173 is formed in the column opening 172. The column 173 may be formed by depositing an insulating layer 174, such as a silicon oxide layer into the opening 172 and over the remaining device layers followed by planarization, such as a CMP planarization. While only one column 173 is shown in the figures, more than one column may be formed at the same time.

Figure 25:
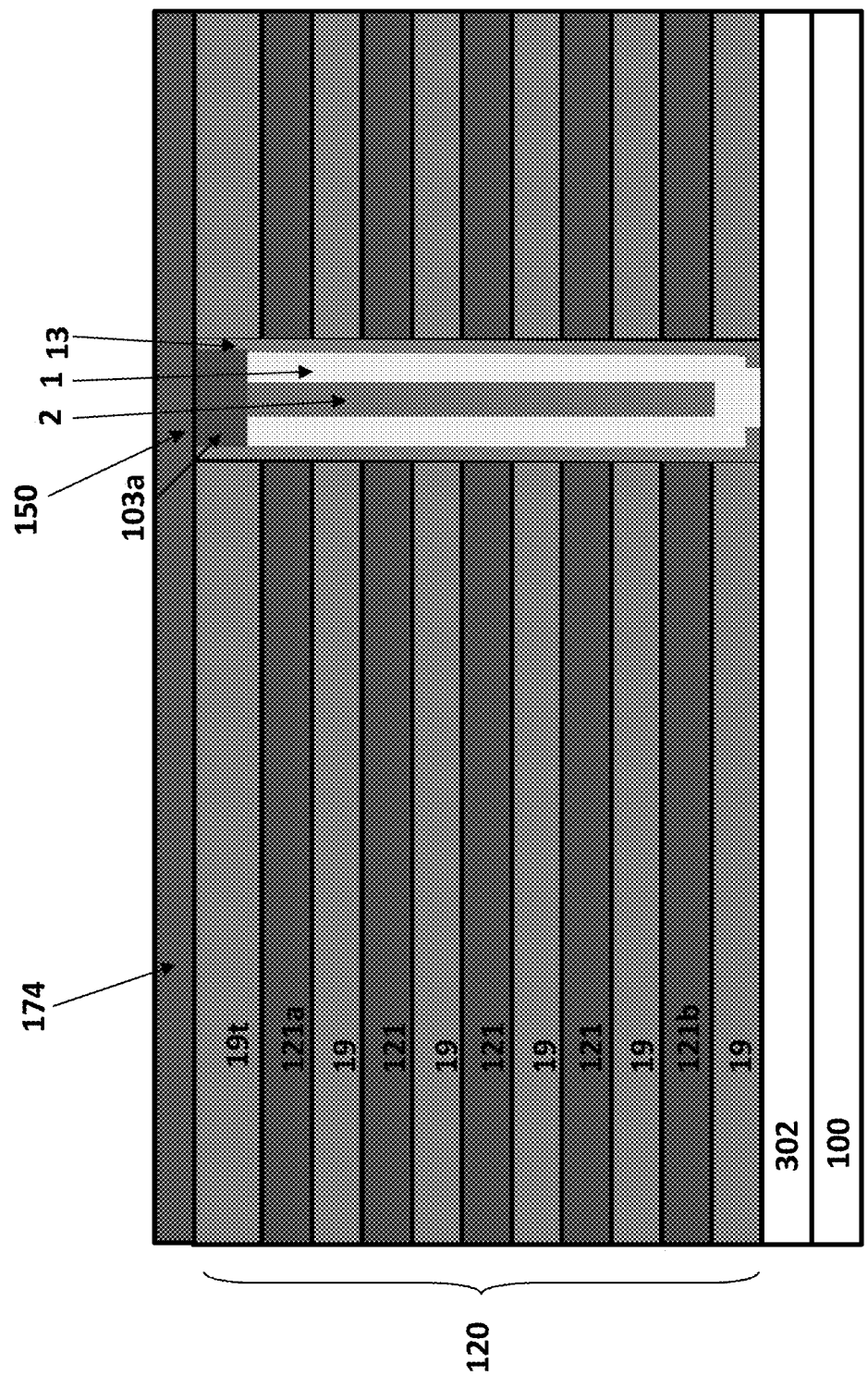

FIG. 25 shows the same cross sectional view as FIG. 20 after the formation of the column(s) 173 and layer 174. The view in FIG. 25 is in or out of the plane of the drawing in FIG. 24, such that the column 173 is not visible in FIG. 25.

FIGS. 26-36 illustrate a method of forming the trenches (e.g., back side openings) 84 and the source electrode 202.

Figure 26:
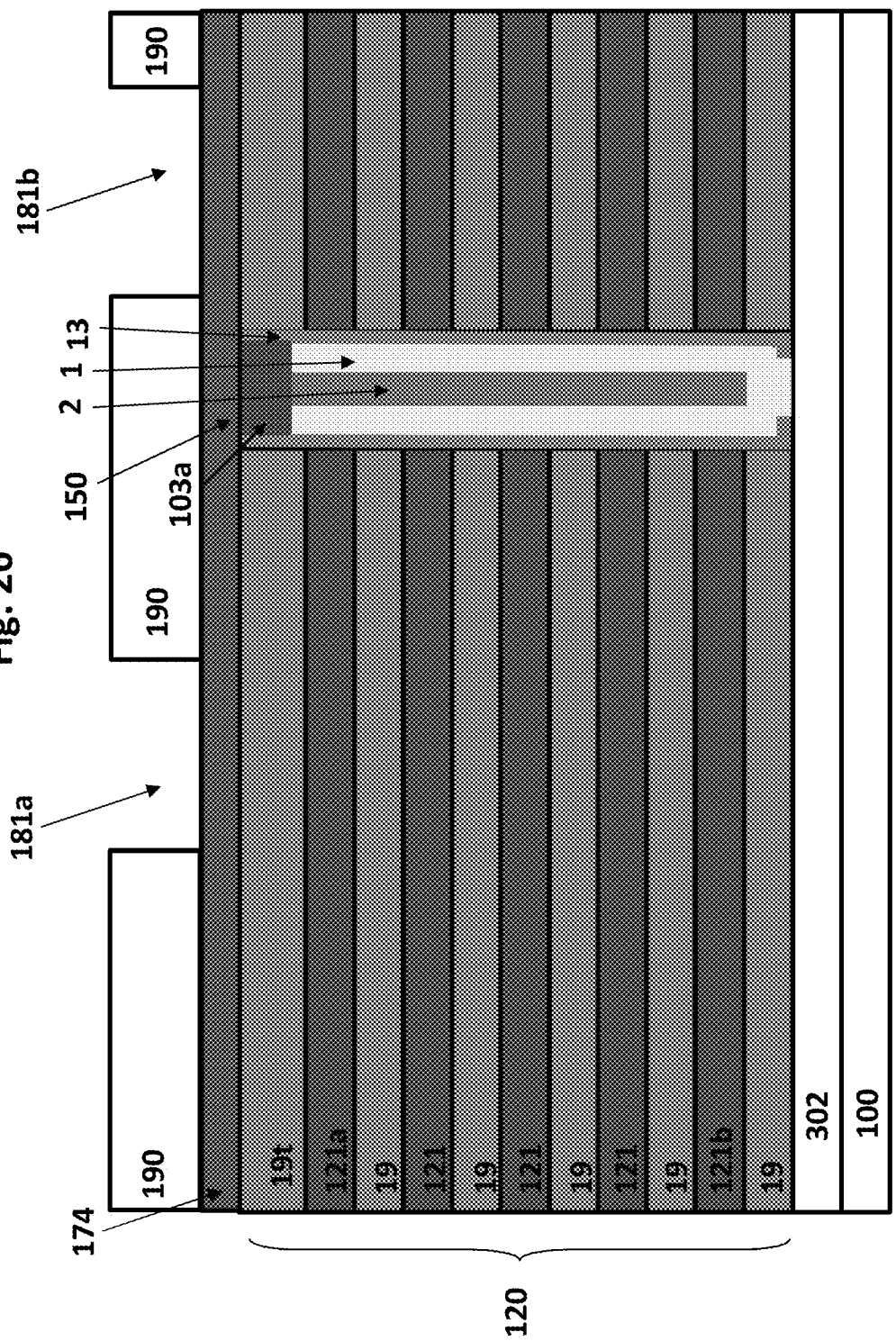

As shown in FIG. 26, a mask 190 is formed over layer 174. The mask 190 may be a photoresist and/or hard mask described above. At least one back side mask opening 181 is formed in the mask. In some embodiments, a plurality of openings 181 is formed in the mask 190. FIG. 26 shows two openings 181a and 181b. The mask 190 can optionally include at least one p-well contact mask opening 191. The embodiment shown in FIG. 26 omits p-well contact mask opening(s) 191. Alternatively, the optional openings 191 may be included, as shown in FIG. 27 by dashed lines.

Figure 27:
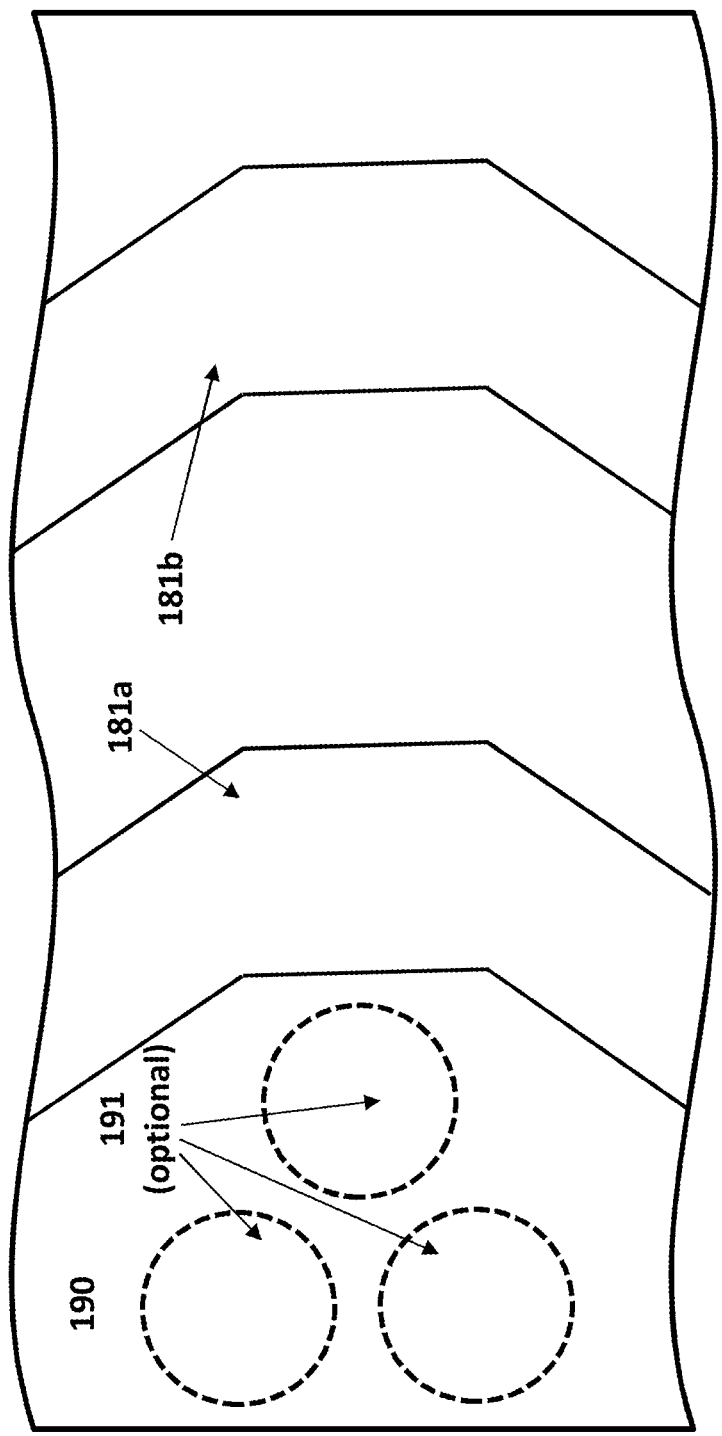
FIG. 27 is a top view of the step shown in FIG. 26.

FIG. 27 shows the top view of the mask 190 having the openings 181a and 181b. The openings 181a and 181b each have at least one nonlinear side wall. Thus, the slit trenches 84a and 84b resulting from the following etch step will likewise have at least one nonlinear side wall. In some embodiments, the nonlinear side wall includes a curved portion. As shown in FIG. 27, opening 181b has a profile complementary to that of opening 181a. Thus, the resulting slit trench 84b will have a profile complementary to that of slit trench 84a.

Figure 28:
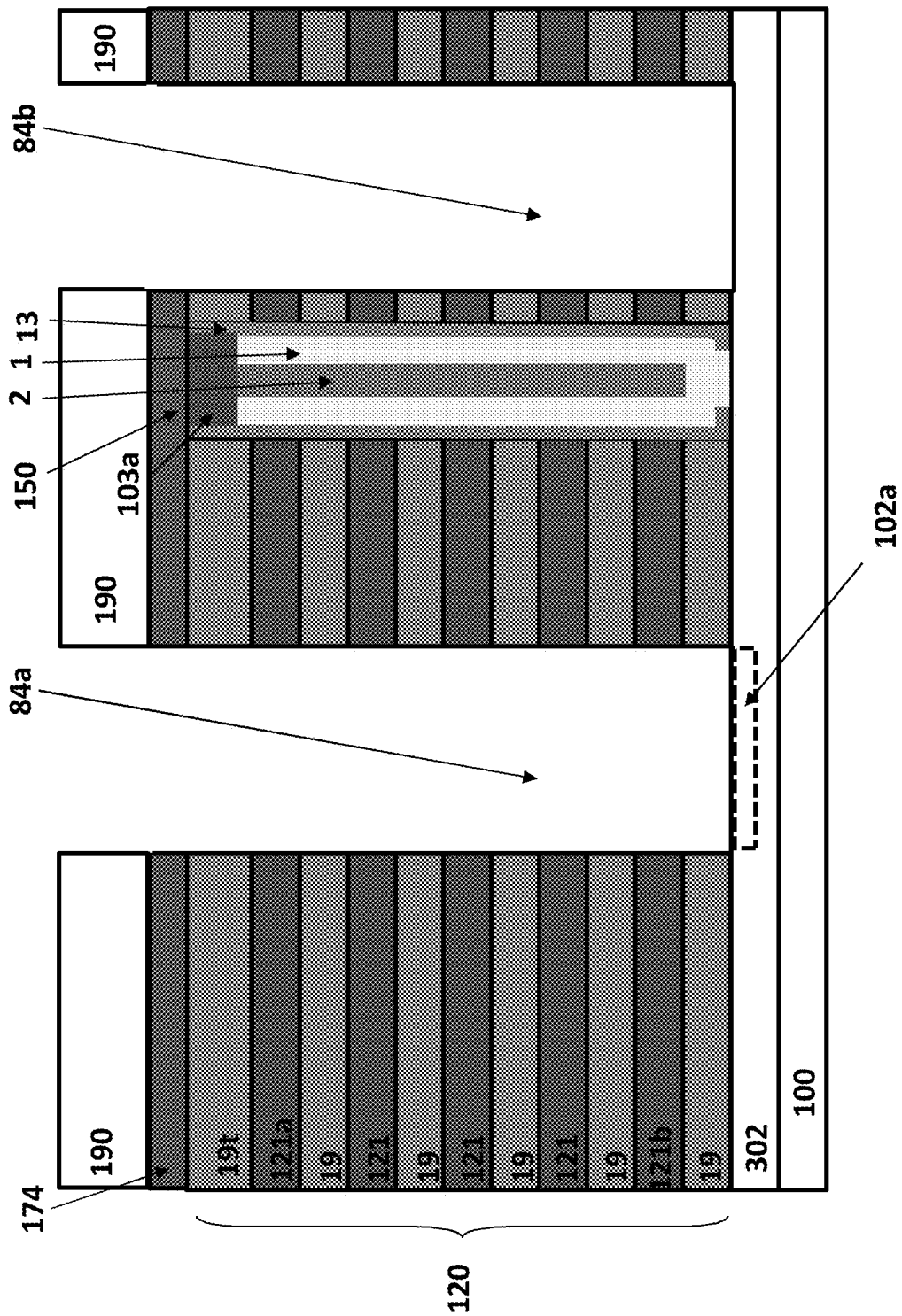

Then, as shown in FIG. 28, layer 174 and the stack 120 are etched through the openings 181a and 181b in the mask to form the back side openings (e.g., the trenches) 84a and 84b in the stack 120 extending to the p-well 302. Thus, the step of forming the back side openings 84a and 84b expose the p-well 302, which may act as an etch stop.

In various embodiments, the p-well contact opening 303 may be formed before, during, or after the formation of back side openings (e.g., slit trenches) 84a and 84b in different masking and/or etching steps. If openings 191 are included in the mask 190, p-well contact openings 303 extending to the p-well 302 are etched in the stack 120 at the same time as the back side openings 84a and 84b.

In alternative embodiments, the step of forming the semiconductor channel and the memory film in the memory opening 81 occurs before or after the step of forming the p-well contact 302b in the p-well contact opening 303. The memory opening 81 may be formed before the steps of forming the p-well contact opening 303 and the at least one first slit trench in separate etching steps. In some embodiments, the p-well contact 302b is formed while the memory opening 81 is masked. In other embodiments, the steps of forming the p-well contact opening 303 and the slit trench 84 occur after the semiconductor channel 1 and the memory film 13 are formed in the memory opening 81.

Dopants are implanted into well 302 in the substrate 100 to form doped source region 102a in p-well 302. If the p-well contact openings 303 are formed before or during the formation of the back side openings 84a and 84b, then the p-well contact openings 303 are masked or filled with a sacrificial material during the implantation step to avoid forming an additional source region in the p-well through the p-well contact opening 303.

Figure 29:
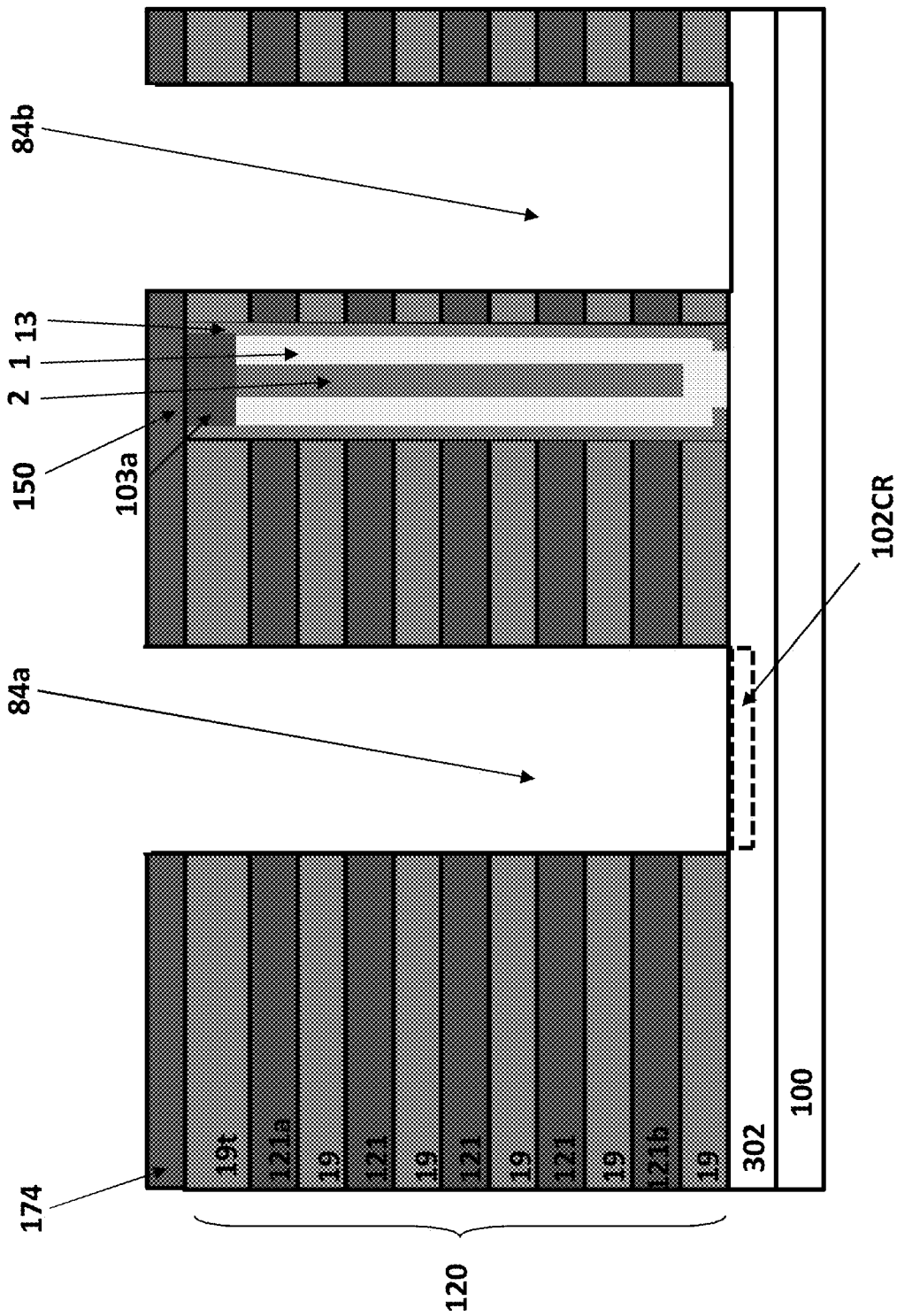

The mask 190 may then be removed, as shown in FIG. 29.

Figure 30:
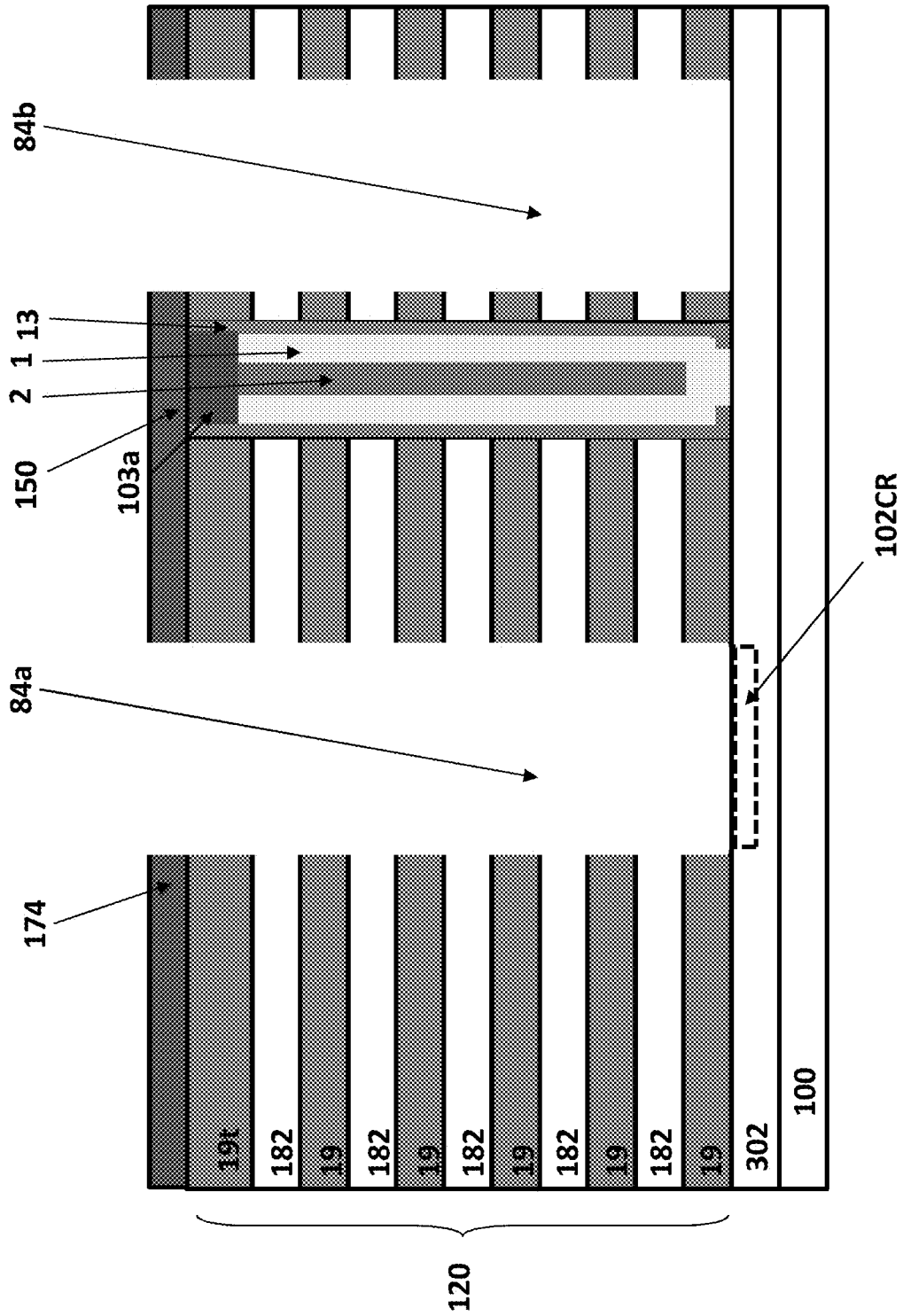

Then, at least a portion of the sacrificial second material layers 121 are removed through the back side openings 84a and 84b to form back side recesses 182 between the first material layers 19, as shown in FIG. 30. Layers 121 may be removed by selective etching, such as a silicon nitride selective etching which removes silicon nitride layers 121 but does not remove the silicon oxide layers 174, 19 and 7 or the silicon regions. The selective etch may stop on the oxide blocking dielectric, such as a silicon oxide blocking dielectric 7 which forms the outer part of the memory film 13. The support column 173 described above supports the spaced apart layers 19 of the stack 120 and prevents layers 19 from collapsing on each other.

Alternatively, blocking dielectric can optionally be formed in back side recesses 182 through the back side opening 84 instead of being formed in memory opening 81.

Figure 31:
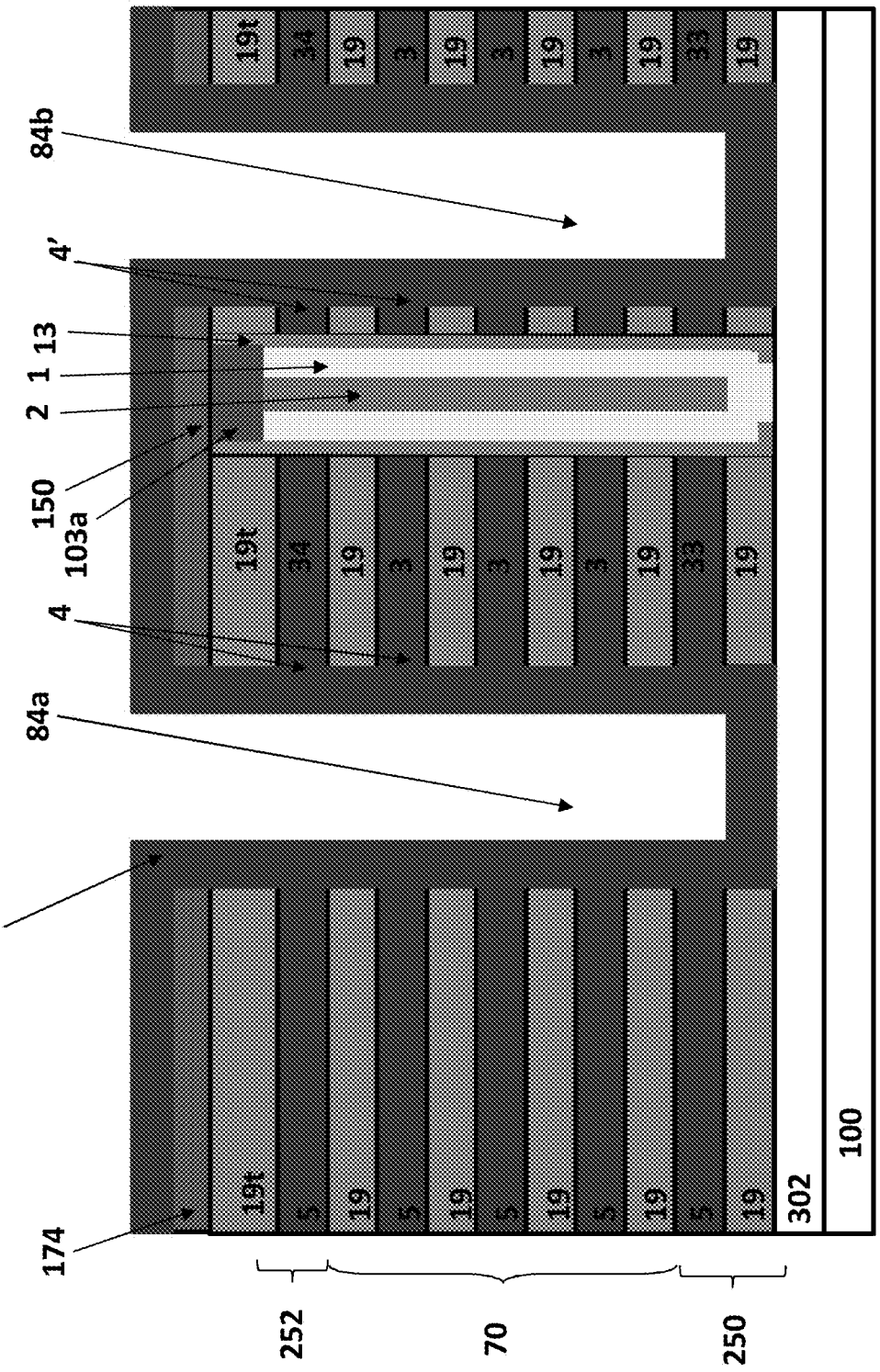

Metal or metal alloy control gate electrodes 3 are then formed in the back side recesses 182 through the back side openings 84, as shown in FIG. 31. A portion 183 of the metal or metal alloy control gate material partially or fully fills the back side openings (e.g., trenches) 84a and 84b and is located over layer 174. The control gate electrode 3 material may comprise any suitable materials described above. For example, the material may comprise a TiN liner and tungsten gate material. This fill can result in mechanical stress imposed on the substrate, which can lead to substrate and/or wafer warpage.

If the p-well contact openings 303 are formed before the control gate material fill step, the metal or metal alloy can also form the p-well contact 302b and dummy word lines 5.

The control gate electrode 3 between the trenches 84a and 84b has a complementary side wall 4 to the respective side wall of trench 84a, and a complementary side wall 4' to the respective side wall of trench 84b.

Figure 32:
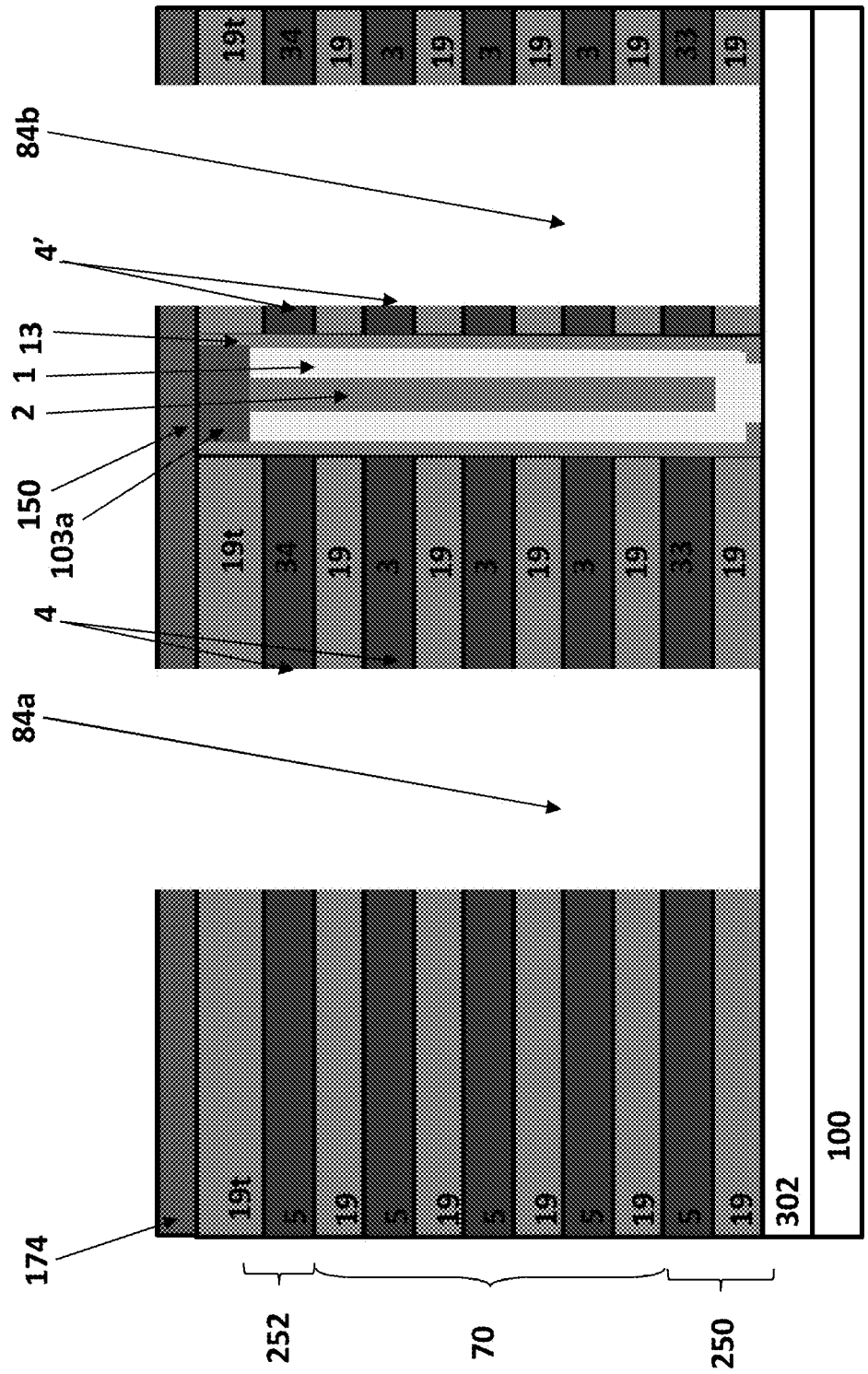

Then, as shown in FIG. 32, the portion 183 of the metal or metal alloy control gate material is removed by anisotropic etching from the back side openings (e.g., trenches) 84a and 84b and from over layer 174 without removing the control gate electrodes 3 and the dummy word lines 5 to complete the formation of the control gate electrodes 3. The select gate electrodes 33, 34 may be formed above and below the control gate electrodes 3 at the same time or during a different step.

Figure 33:
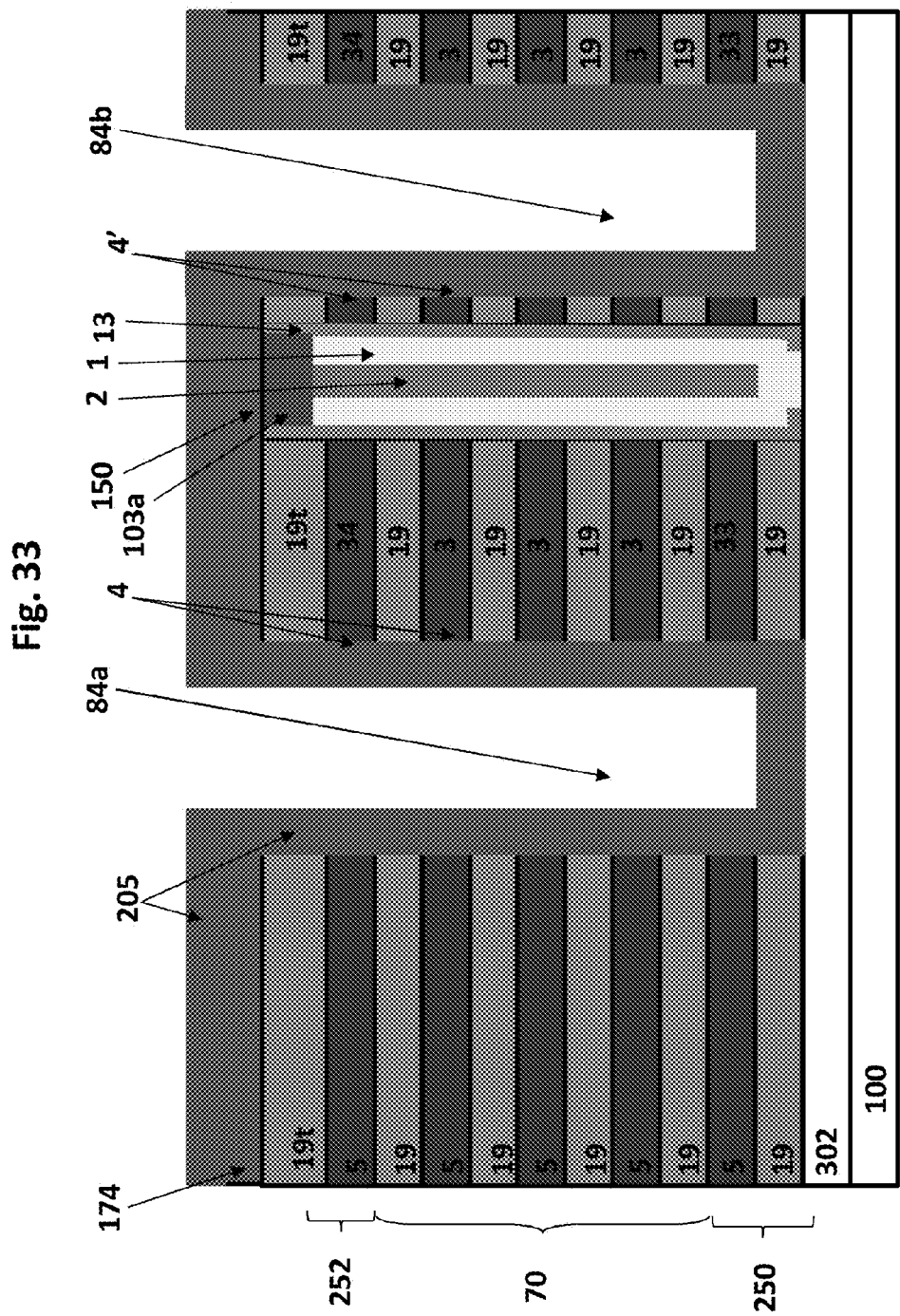
Figure 34:
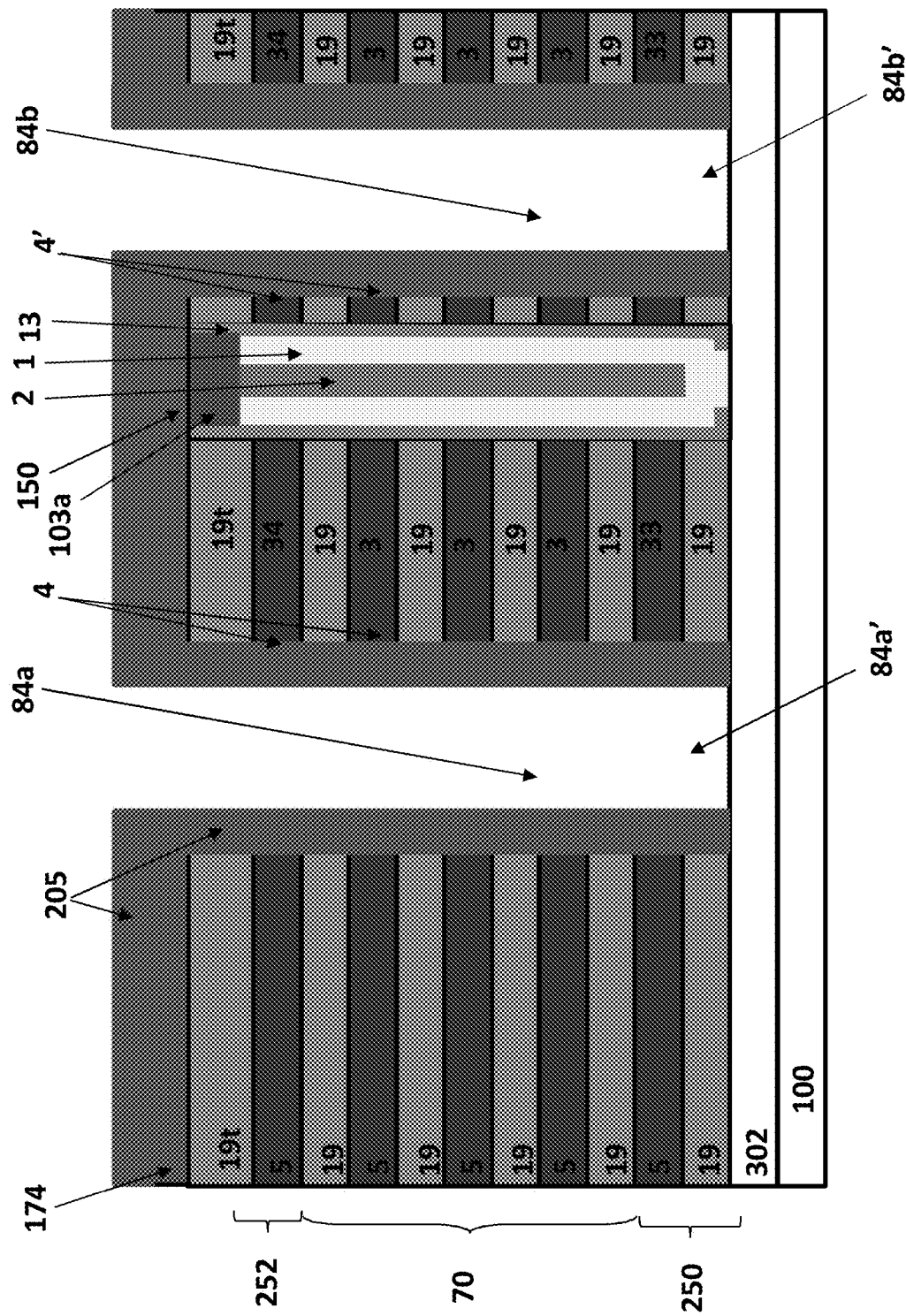

The insulating layer 205, such as a silicon oxide layer, is formed on side walls and bottom of the back side trenches 84a and 84b, as shown in FIG. 33. Layer 205 is also formed over layer 174. The insulating layer 205 is then removed from the bottoms 84a' 84b' of the respective back side trenches 84a and 84b by anisotropic etching (e.g., by RIE spacer etch) without removing the insulating layer from the side walls of the trenches 84a and 84b, as shown in FIG. 34. This etching step exposes the p-well 302 through the bottoms 84a' and 84b' of the respective trenches 84a and 84b.

Figure 35:
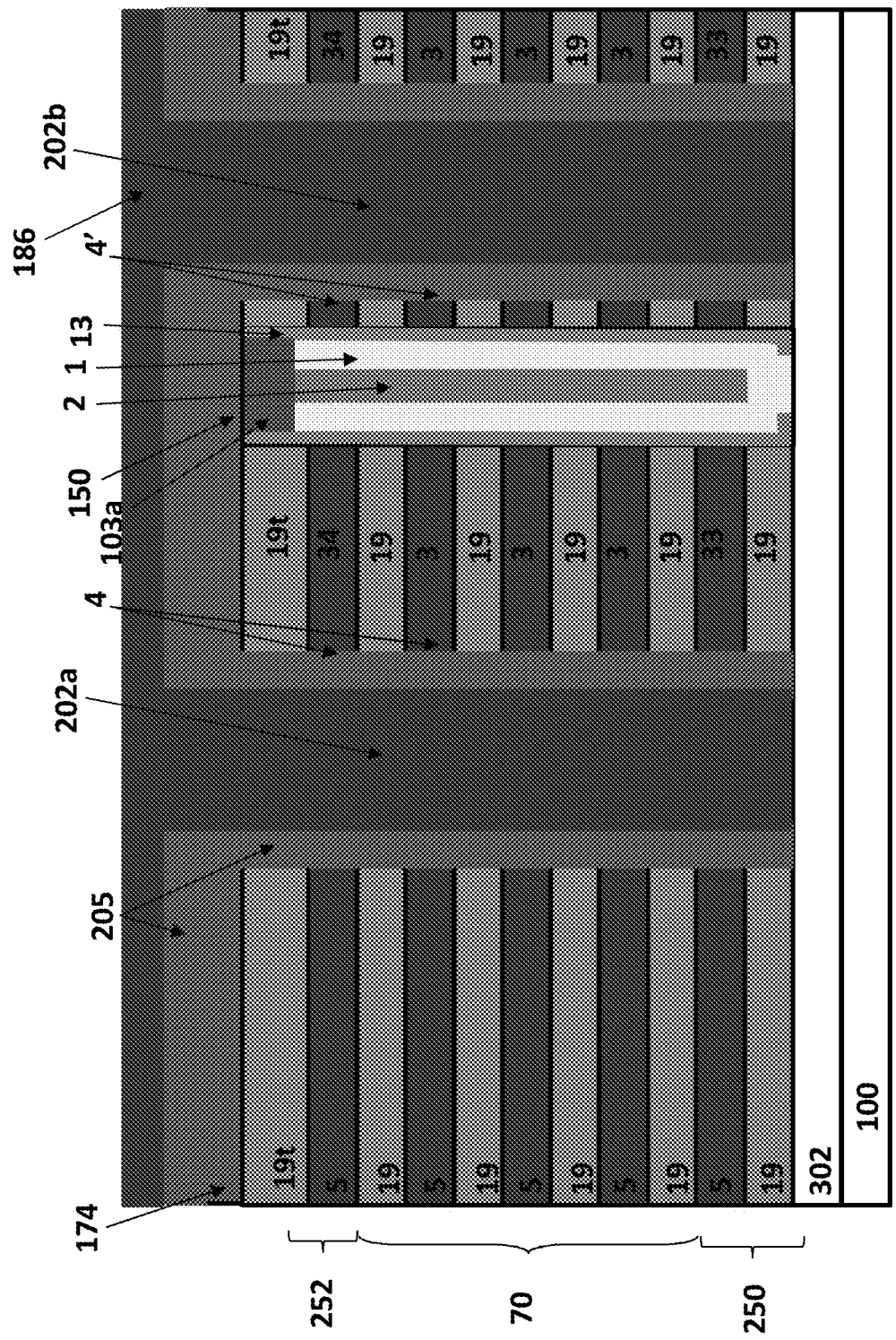
Figure 36:
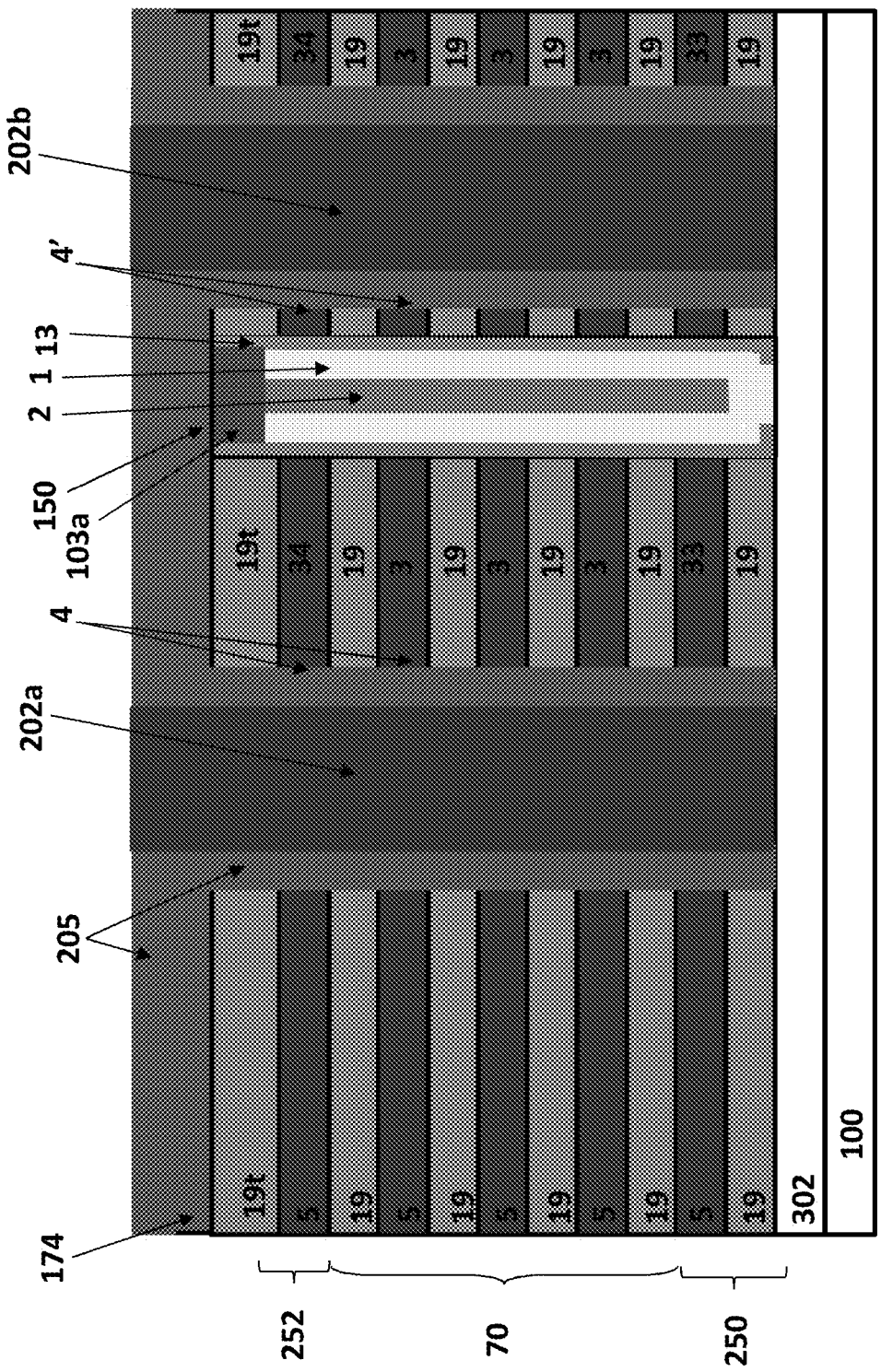

The source electrodes 202a and 202b are then formed in the respective back side trenches 84a and 84b in contact with the p-well 302, as shown in FIG. 35. The source electrodes 202a and 202b may be formed by depositing any suitable metal or metal alloy layers, such as TiN, ruthenium, and/or tungsten over layer 205 in the trenches 84a and 84b. A portion 186 of the source electrode material located over the device is removed by CMP or etching to leave the source electrode 202 in the dielectrically insulated trenches 84a and 84b, as shown in FIG. 36.

Figure 37:
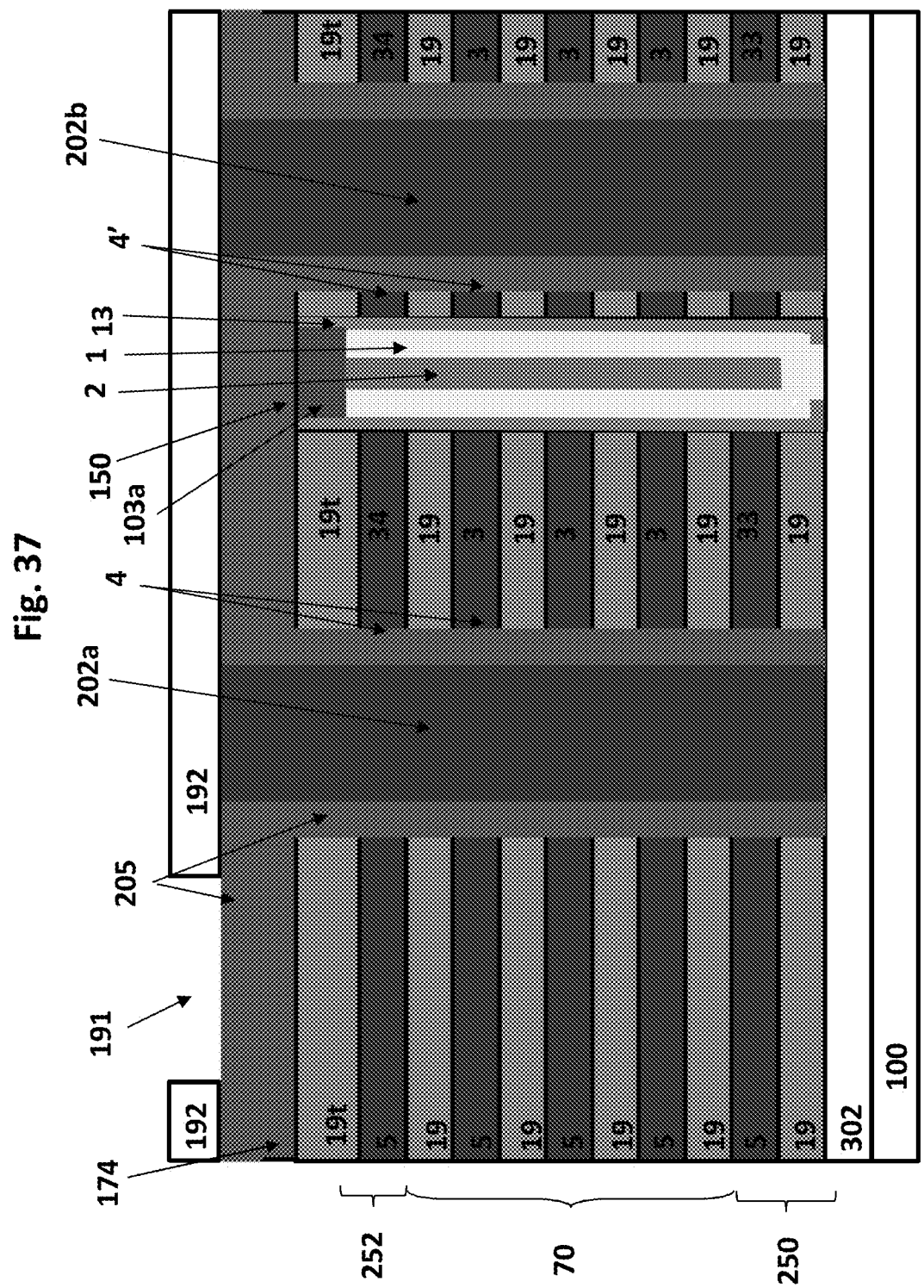
Figure 38:
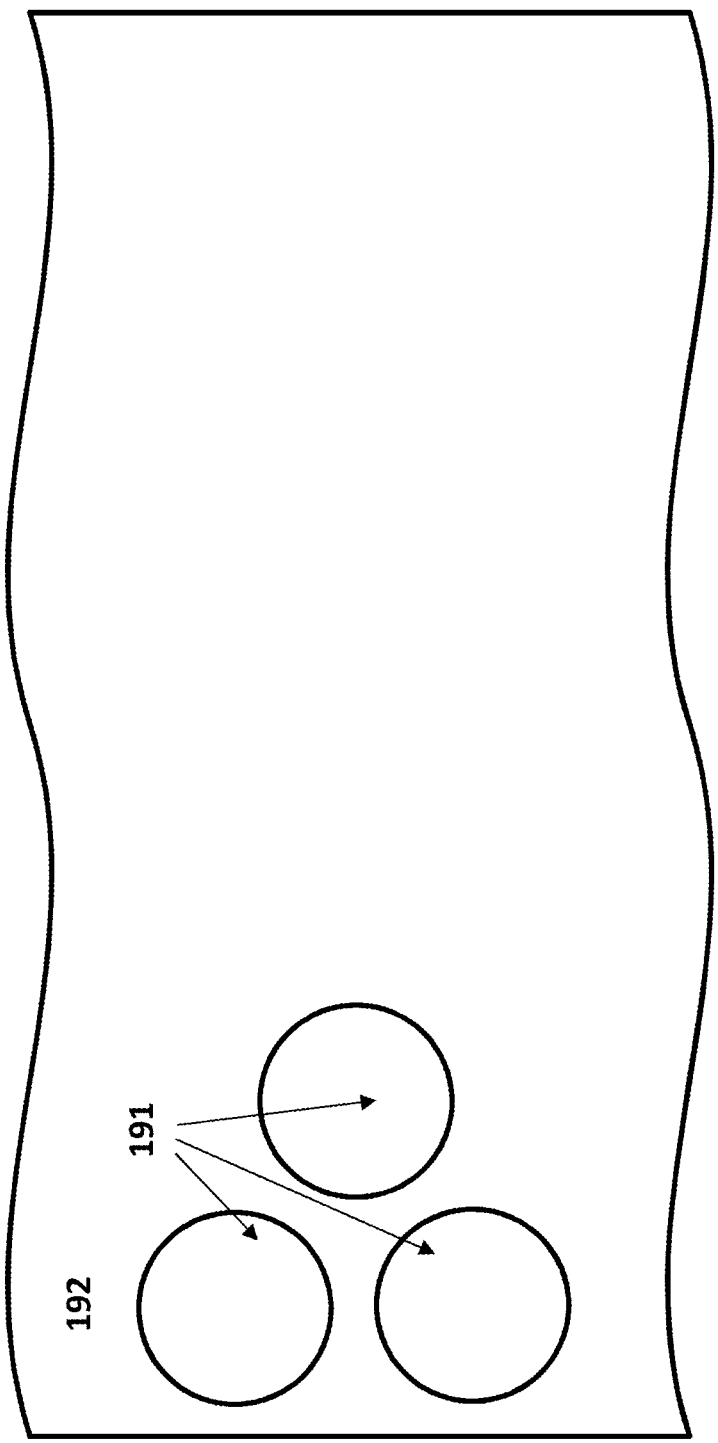
FIG. 38 is a top view of the step shown in FIG. 37.

As shown in FIG. 37, a mask 192 is formed over layer 205. The mask 192 may be a photoresist and/or hard mask described above. At least one p-well contact mask opening 191 is formed in the mask. The embodiment shown in FIGS. 37 and 38 includes three p-well contact mask openings 191, though only one is shown in the cross-sectional view of FIG. 37. FIG. 38 shows the top view of mask 192 having the p-well contact mask openings 191.

Figure 39:
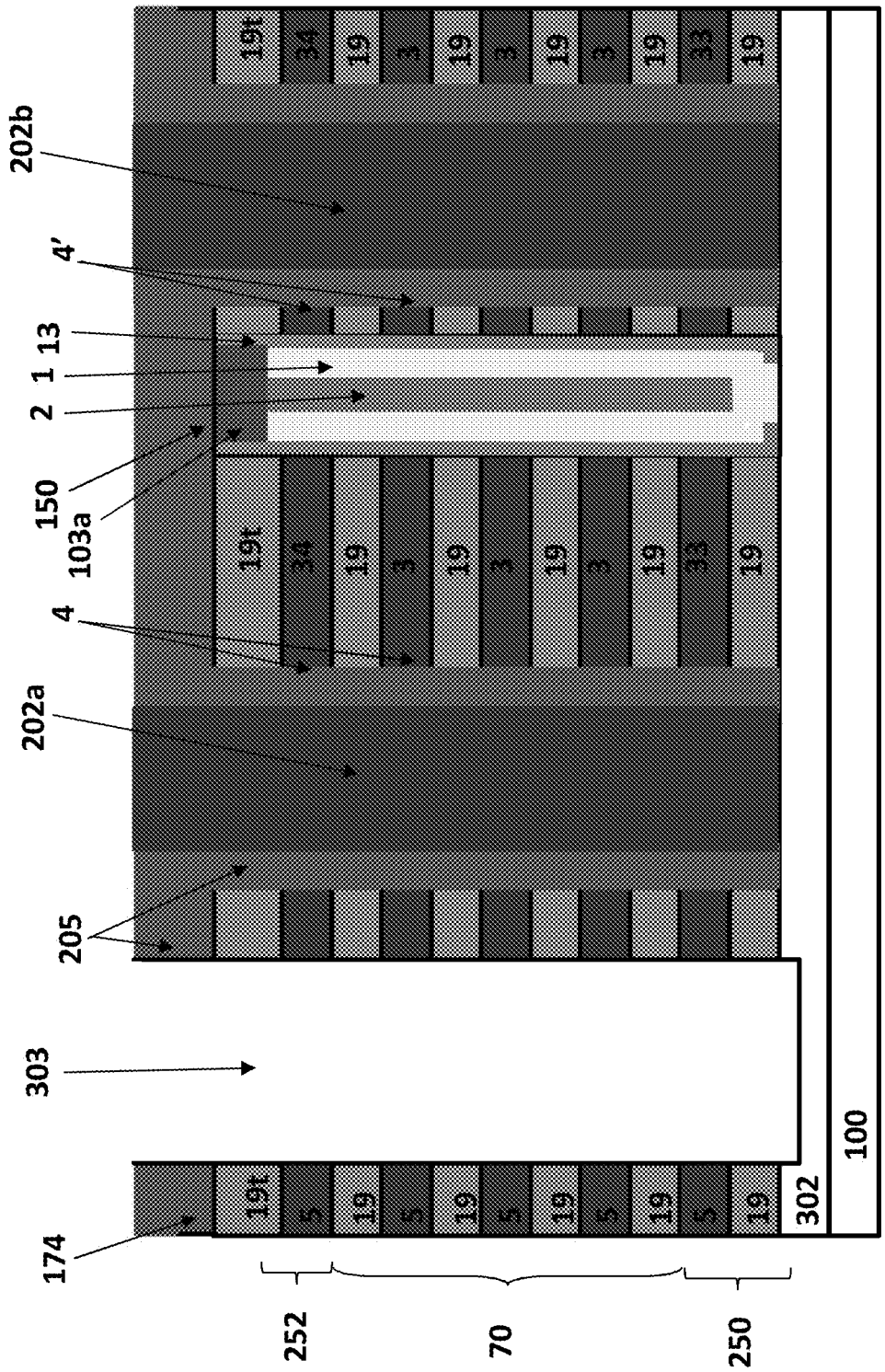

Then, layers 205 and 174, and stack 120 are etched through the p-well contact mask opening(s) 191 in the mask 192 to form the p-well contact opening(s) 303. The step of forming the p-well contact opening(s) 303 exposes the p-well 302, which may act as an etch stop. The mask 192 may then be removed, as shown in FIG. 39.

Figure 40:
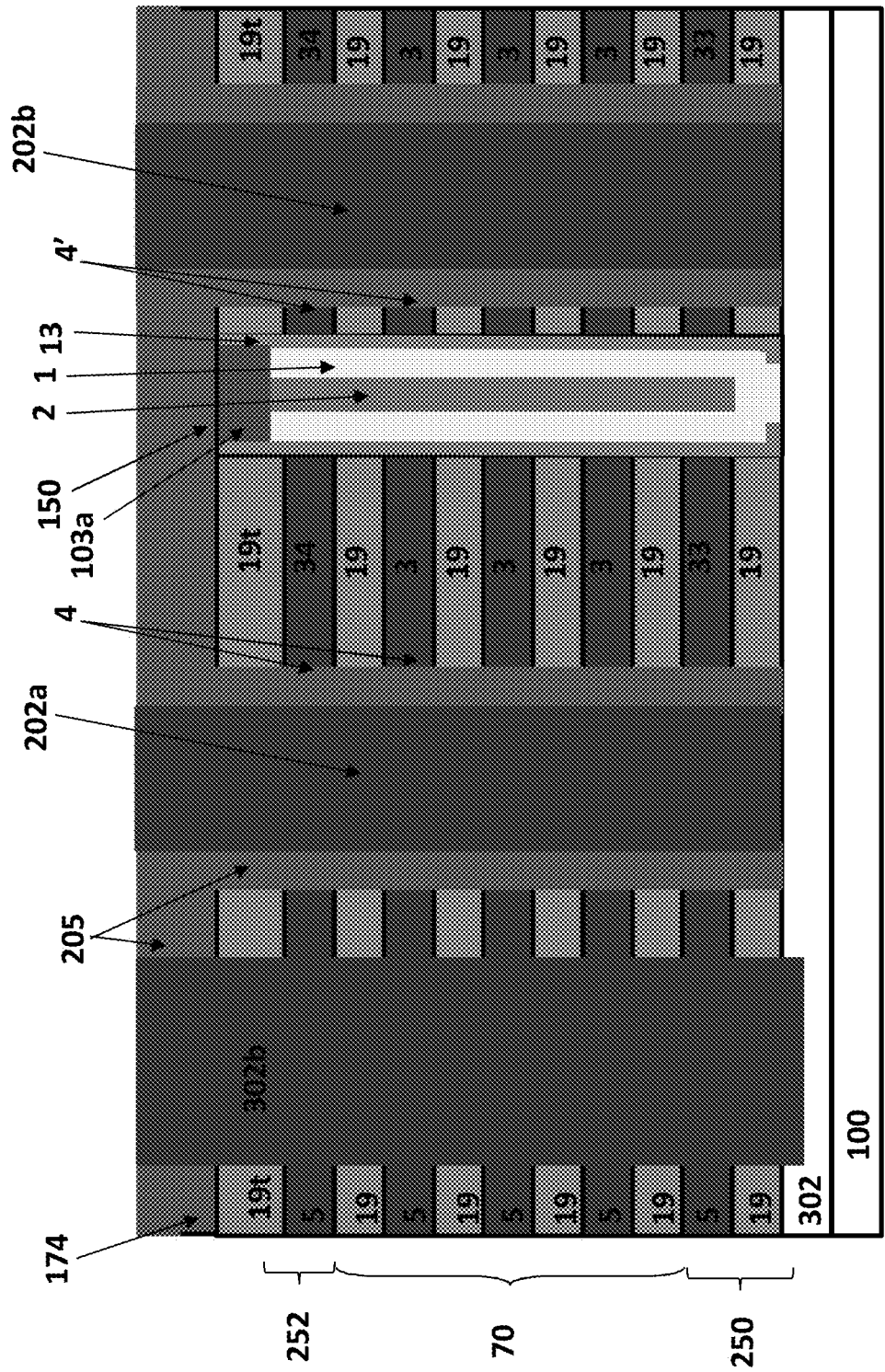

A conductive (e.g., metal or metal alloy) or highly doped semiconductor material can be deposited in the p-well contact opening(s) 303 to form the p-well contact(s) 302b, as shown in FIG. 40. The dummy word lines 5 can make electrical contact with (i.e., be shorted by) p-well contact(s) 302b.

Figure 41:
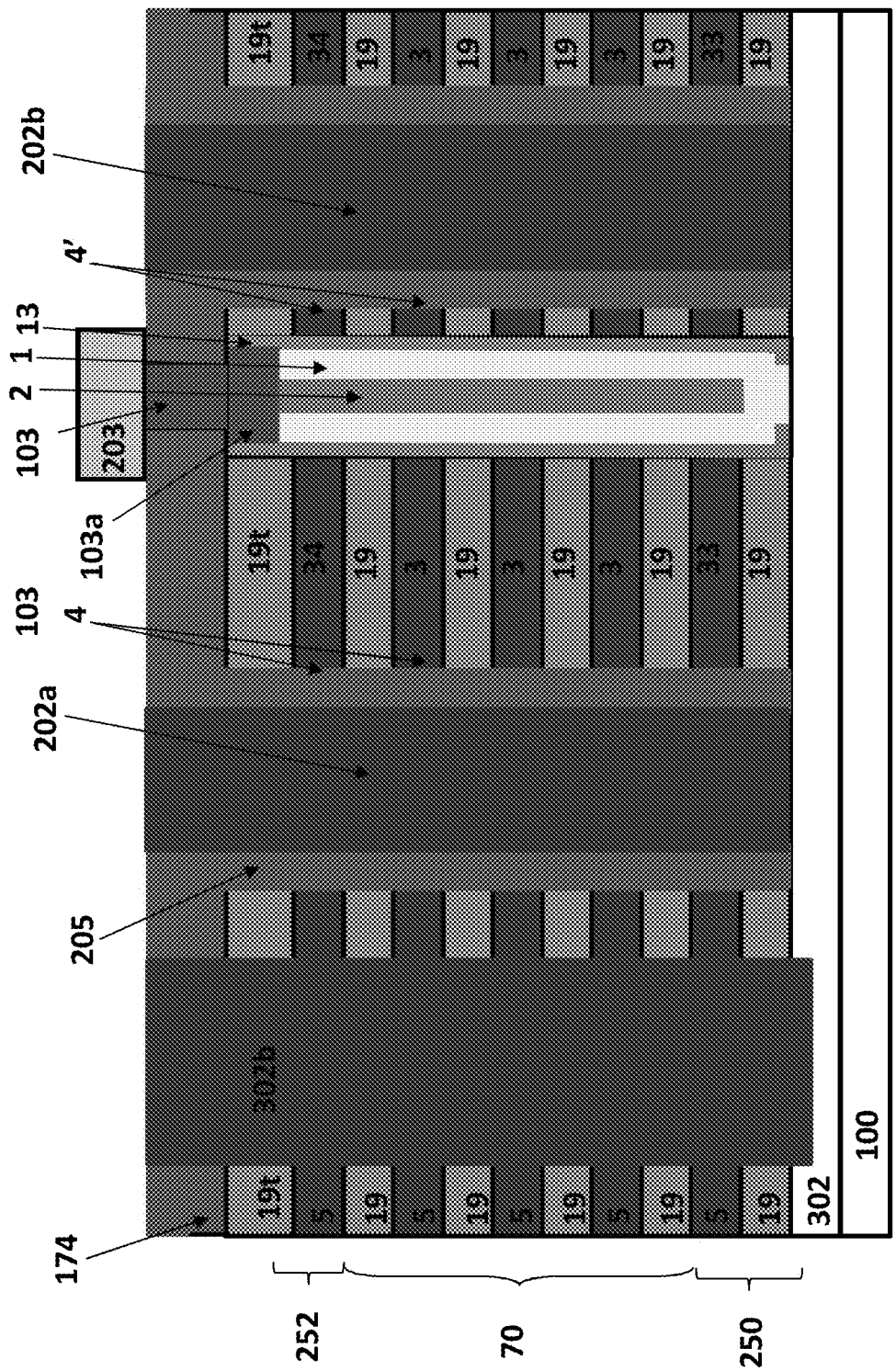

A drain line 103 in contact with doped drain 103a is formed in an opening in layer 174. A bit line (drain electrode) 203 in contact with drain line 103 is formed above the drain line 103, as shown in FIG. 41. The p-well contact(s) 302b are not electrically connected to the source line(s) 202, control gate electrodes 3, or drain electrode(s) 203. However, a separate contact is then formed to the contact(s) 302(b) through which the boost voltage is applied to the p-well during the read operation of the device.

While formation of a portion of one memory block is shown in FIGS. 6 to 41, it should be understood that the same method may be used to form one or more than one memory blocks. The method to form other memory block(s) includes forming at least one additional back side trench 84, forming at least one additional source electrode 202 in the additional back side trench, and forming at least one row of front side memory openings 81, such as an least an array of front side memory openings having 4 rows, between at least one of the back side trenches 84a and 84b and the additional back side trench 84. The method also includes forming an optional blocking dielectric 7 in each of the memory openings 81, forming a charge storage region 9 over the blocking dielectric in each of the memory openings, and forming a tunnel dielectric 11 over the charge storage region in each of the memory openings. The method also includes removing the blocking dielectric, the charge storage region and the tunnel dielectric from the bottom of each of the memory openings 81, forming a semiconductor channel in each of the memory openings in contact with the optional p-well 302, or the substrate 100 or source line 102.

Although the foregoing refers to particular embodiments, it will be understood that the disclosure is not so limited. It will occur to those of ordinary skill in the art that various modifications may be made to the disclosed embodiments and that such modifications are intended to be within the scope of the disclosure. All of the publications, patent applications and patents cited herein are incorporated herein by reference in their entirety.

What is claimed is:

1. A monolithic three dimensional NAND memory device, comprising:
   a plurality of control gate electrodes extending in a first direction substantially parallel to a major surface of a substrate in at least one active region, wherein the plurality of control gate electrodes comprise at least a first control gate electrode located in a first device level and a second control gate electrode located in a second device level located over the major surface of the substrate and below the first device level;
   an interlevel insulating layer located between the first control gate electrode and the second control gate electrode;
   a plurality of semiconductor channels, wherein at least one end portion of each of the plurality of semiconductor channels extends substantially perpendicular to the major surface of the substrate, such that at least one first portion of each of the plurality of semiconductor channels is located in the first device level, and at least one second portion of each of the plurality of semiconductor channels is located in the second device level;
   at least one memory film located between each of the plurality of control gate electrodes and each respective semiconductor channel of the plurality of semiconductor channels;
   at least one first slit trench extending substantially perpendicular to the major surface of the substrate;
   a drain electrode that contacts the first wing portion of the semiconductor channel from above; and
   a source electrode that contacts the connecting portion of the semiconductor channel from above;
   wherein:
      each of the plurality of control gate electrodes has a nonlinear side wall adjacent to the at least one first slit trench in the at least one active region;
      the semiconductor channel has J-shaped pipe shape;
      a wing portion of the J-shaped pipe shape semiconductor channel extends substantially perpendicular to the major surface of the substrate and a connecting portion of the J-shaped pipe shape semiconductor channel which connects to the wing portion extends substantially parallel to the major surface of the substrate;
      the source electrode is located in the first slit trench and has a profile complementary to the nonlinear side wall of the plurality of control gate electrodes;
      a length of the source electrode extends substantially parallel to the plurality of control gate electrodes and a height of the source electrode extends substantially perpendicular to the major surface of the substrate;
      a dielectric material is located in the first slit trench to insulate the source electrode from the plurality of control gate electrodes;
      the drain electrode is electrically connected to a bit line which is located above the semiconductor channel; and
      the bit line extends substantially perpendicular to the source electrode and substantially parallel to the major surface of the substrate.

2. The device of claim 1, wherein the nonlinear side wall comprises a curved portion to offset warpage of the substrate by shifting at least part of a stress imposed on the substrate by the plurality of control gate electrodes from the first direction to a second direction which is perpendicular to the first direction.

3. The device of claim 1, wherein the nonlinear side wall comprises:
   a first side wall portion having a first plane;
   a second side wall portion having a second plane different from the first plane; and
   a third side wall portion connecting the first side wall portion and the second side wall portion.

4. The device of claim 3, wherein an angle between the first side wall portion and the third side wall portion is between 0° and 90°.

5. The device of claim 2, wherein the plurality of control gate electrodes have a uniform or non-uniform width along the second direction in the at least one active region.

6. The device of claim 1, wherein the at least one first slit trench has a side wall complementary to the nonlinear side wall of the control gate electrodes in the at least one active region.

7. The device of claim 6, further comprising a second slit trench having a profile complementary to the first slit trench, wherein the plurality of control gate electrodes are located between the first slit trench and the second slit trench.

8. The device of claim 7, further comprising a straight line axis extending in the first direction substantially parallel to the major surface of the substrate, wherein the axis is completely contained within a width of one control gate electrode of the plurality of control gate electrodes in the at least one active region.

9. The device of claim 7, further comprising a straight line axis extending in the first direction substantially parallel to the major surface of the substrate along a middle of a width of one control gate electrode of the plurality of control gate electrodes, wherein the axis is partially contained within the width of one control gate electrode of the plurality of control gate electrodes, and the axis is partially contained outside the width of the one control gate electrode of the plurality of control gate electrodes in the at least one active region.

10. The device of claim 7, further comprising:
    a p-well in or over the substrate; and
    at least one p-well contact having a major axis extending substantially perpendicular to the major surface of the substrate to the p-well;
    wherein at least one first portion of the p-well contact is located in a plane containing the first device level, and at least one second portion of the p-well contact is located in a plane containing the second device level.

11. The device of claim 10, wherein:
    the first control gate electrode comprises a first finger portion of a first comb shaped word line located in the first device level;
    the first comb shaped word line further comprises a second finger portion and a connecting portion;
    the second finger portion of the first comb shaped word line extends in the first direction in the first device level and is separated from the first finger portion by the first slit trench;
    the connecting portion of the first comb shaped word line is located outside the at least one active region and connects the first and the second finger portions of the first comb shaped word line to driver circuit contacts;
    the second control gate electrode comprises a first finger portion of a second comb shaped word line located in the second device level;
    the second comb shaped word line further comprises a second finger portion and a connecting portion;

the second finger portion of the second comb shaped word line extends in the first direction in the second device level and is separated from the first finger portion by the first slit trench; and the connecting portion of the second comb shaped word line is located outside the at least one active region and connects the first and the second finger portions of the second comb shaped word line to driver circuit contacts.

12. The device of claim 11, further comprising at least one first dummy word line finger located in the first device level between the second slit trench and a third slit trench, and at least one second dummy word line finger located in the second device level between the second slit trench and the third slit trench.

13. The device of claim 12, wherein at least one p-well contact region comprises a plurality of pillar shaped p-well contacts which extend through the first and the second dummy word line fingers in a region between a curved portion of the second slit trench and a straight portion of the third slit trench.

14. The device of claim 13, wherein a first protruding portion of the nonlinear side wall of the first finger portion of the first comb shaped word line protrudes in a second direction which is perpendicular to the first direction and substantially parallel to the major surface of the substrate into a complementary recessed portion in a first side wall of the first slit trench such that it overlaps a second protruding portion of the nonlinear side wall of the second finger portion of the first comb shaped word line which protrudes in a third direction which is opposite to the second direction into a complementary recessed portion in a second side wall of the first slit trench.

15. The device of claim 11, wherein:
the first comb shaped word line further comprises a third finger portion;
the third finger portion of the first comb shaped word line extends in the first direction in the first device level and is separated from the second finger portion by the second slit trench;
the connecting portion of the first comb shaped word line connects the first, the second and the third finger portions of the second comb shaped word line to driver circuit contacts;
the second comb shaped word line further comprises a third finger portion;
the third finger portion of the second comb shaped word line extends in the first direction in the second device level and is separated from the second finger portion by the second slit trench; and
the connecting portion of the second comb shaped word line connects the first, the second and the third finger portions of the second comb shaped word line to driver circuit contacts.

16. The device of claim 15, further comprising:
a third slit trench located on an opposite side of the third finger portions of the first and the second comb shaped word lines from the second slit trench; and
at least one first dummy word line finger located in the first device level between the third slit trench and a fourth slit trench, and at least one second dummy word line finger located in the second device level between the third slit trench and the fourth slit trench.

17. The device of claim 16, wherein:
at least one p-well contact comprises a plurality of pillar shaped p-well contacts which extend through the first and the second dummy word line fingers in a region between a curved portion of the third slit trench and a straight portion of the fourth slit trench; and a first protruding portion of the nonlinear side wall of the first finger portion of the first comb shaped word line protrudes in a second direction which is perpendicular to the first direction and substantially parallel to the major surface of the substrate into a complementary recessed portion in a first side wall of the first slit trench such that it overlaps a second protruding portion of the nonlinear side wall of the third finger portion of the first comb shaped word line which protrudes in a third direction which is opposite to the second direction into a complementary recessed portion in a second side wall of the second slit trench.

18. The device of claim 1, wherein the at least one memory film comprises:
a blocking dielectric located in contact with the plurality of control gate electrodes and the interlevel insulating layer;
at least one charge storage region located at least partially in contact with the blocking dielectric; and
a tunnel dielectric located between the at least one charge storage region and the semiconductor channel.

19. The device of claim 1, wherein:
the substrate comprises a silicon substrate;
the device comprises an array of monolithic three dimensional NAND strings in the at least one active region having a plurality of device levels disposed above the silicon substrate; and
a driver circuit associated with the array is located above or in the silicon substrate.

20. The device of claim 11, further comprising a plurality of dummy word line fingers located between the at least one first slit trench and a second slit trench;
wherein the plurality of control gate electrodes comprises n control gate electrodes;
wherein the plurality of dummy word line fingers comprises m dummy word line fingers; and
wherein both n and m are integers and n is equal to, less than, or greater than m.

21. A monolithic three dimensional NAND memory device, comprising:
a plurality of control gate electrodes extending in a first direction substantially parallel to a major surface of a substrate in at least one active region, wherein the plurality of control gate electrodes comprise at least a first control gate electrode located in a first device level and a second control gate electrode located in a second device level located over the major surface of the substrate and below the first device level;
an interlevel insulating layer located between the first control gate electrode and the second control gate electrode;
a plurality of semiconductor channels, wherein at least one end portion of each of the plurality of semiconductor channels extends substantially perpendicular to the major surface of the substrate, such that at least one first portion of each of the plurality of semiconductor channels is located in the first device level, and at least one second portion of each of the plurality of semiconductor channels is located in the second device level;
at least one memory film located between each of the plurality of control gate electrodes and each respective semiconductor channel of the plurality of semiconductor channels;
at least one first slit trench extending substantially perpendicular to the major surface of the substrate;

a second slit trench having a profile complementary to the first slit trench, wherein the plurality of control gate electrodes are located between the first slit trench and the second slit trench;

a p-well in or over the substrate; and at least one p-well contact having a major axis extending substantially perpendicular to the major surface of the substrate to the p-well, wherein:

each of the plurality of control gate electrodes has a nonlinear side wall adjacent to the at least one first slit trench in the at least one active region;

the at least one first slit trench has a side wall complementary to the nonlinear side wall of the control gate electrodes in the at least one active region;

at least one first portion of the p-well contact is located in a plane containing the first device level, and at least one second portion of the p-well contact is located in a plane containing the second device level;

the first control gate electrode comprises a first finger portion of a first comb shaped word line located in the first device level;

the first comb shaped word line further comprises a second finger portion and a connecting portion;

the second finger portion of the first comb shaped word line extends in the first direction in the first device level and is separated from the first finger portion by the first slit trench;

the connecting portion of the first comb shaped word line is located outside the at least one active region and connects the first and the second finger portions of the first comb shaped word line to driver circuit contacts;

the second control gate electrode comprises a first finger portion of a second comb shaped word line located in the second device level;

the second comb shaped word line further comprises a second finger portion and a connecting portion;

the second finger portion of the second comb shaped word line extends in the first direction in the second device level and is separated from the first finger portion by the first slit trench; and the connecting portion of the second comb shaped word line is located outside the at least one active region and connects the first and the second finger portions of the second comb shaped word line to driver circuit contacts.

22. The device of claim 21, wherein:

the nonlinear side wall comprises a curved portion to offset warpage of the substrate by shifting at least part of a stress imposed on the substrate by the plurality of control gate electrodes from the first direction to a second direction which is perpendicular to the first direction; and the plurality of control gate electrodes have a uniform or non-uniform width along the second direction in the at least one active region.

23. The device of claim 21, wherein the nonlinear side wall comprises:

a first side wall portion having a first plane;

a second side wall portion having a second plane different from the first plane; and a third side wall portion connecting the first side wall portion and the second side wall portion, and wherein an angle between the first side wall portion and the third side wall portion is between 0° and 90°.

24. The device of claim 21, further comprising a straight line axis extending in the first direction substantially parallel to the major surface of the substrate, wherein the axis is completely contained within a width of one control gate electrode of the plurality of control gate electrodes in the at least one active region.

25. The device of claim 21, further comprising a straight line axis extending in the first direction substantially parallel to the major surface of the substrate along a middle of a width of one control gate electrode of the plurality of control gate electrodes, wherein the axis is partially contained within the width of one control gate electrode of the plurality of control gate electrodes, and the axis is partially contained outside the width of the one control gate electrode of the plurality of control gate electrodes in the at least one active region.

26. The device of claim 21, further comprising at least one first dummy word line finger located in the first device level between the second slit trench and a third slit trench, and at least one second dummy word line finger located in the second device level between the second slit trench and the third slit trench.

27. The device of claim 21, wherein:

at least one p-well contact region comprises a plurality of pillar shaped p-well contacts which extend through the first and the second dummy word line fingers in a region between a curved portion of the second slit trench and a straight portion of the third slit trench; and a first protruding portion of the nonlinear side wall of the first finger portion of the first comb shaped word line protrudes in a second direction which is perpendicular to the first direction and substantially parallel to the major surface of the substrate into a complementary recessed portion in a first side wall of the first slit trench such that it overlaps a second protruding portion of the nonlinear side wall of the second finger portion of the first comb shaped word line which protrudes in a third direction which is opposite to the second direction into a complementary recessed portion in a second side wall of the first slit trench.

28. The device of claim 21, wherein:

the first comb shaped word line further comprises a third finger portion;

the third finger portion of the first comb shaped word line extends in the first direction in the first device level and is separated from the second finger portion by the second slit trench;

the connecting portion of the first comb shaped word line connects the first, the second and the third finger portions of the second comb shaped word line to driver circuit contacts;

the second comb shaped word line further comprises a third finger portion;

the third finger portion of the second comb shaped word line extends in the first direction in the second device level and is separated from the second finger portion by the second slit trench; and the connecting portion of the second comb shaped word line connects the first, the second and the third finger portions of the second comb shaped word line to driver circuit contacts.

29. The device of claim 28, further comprising:

a third slit trench located on an opposite side of the third finger portions of the first and the second comb shaped word lines from the second slit trench; and at least one first dummy word line finger located in the first device level between the third slit trench and a fourth slit trench, and at least one second dummy word line finger located in the second device level between the third slit trench and the fourth slit trench, wherein:

at least one p-well contact comprises a plurality of pillar shaped p-well contacts which extend through the first and the second dummy word line fingers in a region between a curved portion of the third slit trench and a straight portion of the fourth slit trench; and a first protruding portion of the nonlinear side wall of the first finger portion of the first comb shaped word line protrudes in a second direction which is perpendicular to the first direction and substantially parallel to the major surface of the substrate into a complementary recessed portion in a first side wall of the first slit trench such that it overlaps a second protruding portion of the nonlinear side wall of the third finger portion of the first comb shaped word line which protrudes in a third direction which is opposite to the second direction into a complementary recessed portion in a second side wall of the second slit trench.

30. The device of claim 21, wherein the at least one memory film comprises:

a blocking dielectric located in contact with the plurality of control gate electrodes and the interlevel insulating layer;

at least one charge storage region located at least partially in contact with the blocking dielectric; and a tunnel dielectric located between the at least one charge storage region and the semiconductor channel.

31. The device of claim 21, wherein the semiconductor channel has a pillar shape and extends substantially perpendicular to the major surface of the substrate; and further comprising one of a source or drain electrode which contacts the pillar-shaped semiconductor channel from above, and another one of a source or drain electrode which contacts the pillar-shaped semiconductor channel from below.

32. The device of claim 21, wherein:

the semiconductor channel has U-shaped pipe shape, two wing portions of the U-shaped pipe shape semiconductor channel extend substantially perpendicular to the major surface of the substrate and a connecting portion of the U-shaped pipe shape semiconductor channel which connects the two wing portions extends substantially parallel to the major surface of the substrate; and the one of a source or drain electrode contacts the first wing portion of the semiconductor channel from above; and further comprising another one of a source or drain electrode which contacts the second wing portion of the semiconductor channel from above.

33. The device of claim 21, wherein:

the semiconductor channel has J-shaped pipe shape;

a wing portion of the J-shaped pipe shape semiconductor channel extends substantially perpendicular to the major surface of the substrate and a connecting portion of the J-shaped pipe shape semiconductor channel which connects to the wing portion extends substantially parallel to the major surface of the substrate;

a drain electrode contacts the first wing portion of the semiconductor channel from above;

a source electrode contacts the connecting portion of the semiconductor channel from above;

the source electrode is located in the first slit trench and has a profile complementary to the nonlinear side wall of the plurality of control gate electrodes;

the source electrode length extends substantially parallel to the plurality of control gate electrodes and the source electrode height extends substantially perpendicular to the major surface of the substrate;

a dielectric material is located in the first slit trench to insulate the source electrode from the plurality of control gate electrodes;

the drain electrode is electrically connected to a bit line which is located above the semiconductor channel; and the bit line extends substantially perpendicular to the source electrode and substantially parallel to the major surface of the substrate.

34. The device of claim 21, further comprising:

a plurality of dummy word line fingers located between the at least one first slit trench and a second slit trench;

the plurality of control gate electrodes comprises n control gate electrodes;

the plurality of dummy word line fingers comprises m dummy word line fingers; and both n and m are integers and n is equal to, less than, or greater than m.

* * * * *